United States Patent
Baba et al.

(10) Patent No.: US 9,368,539 B2
(45) Date of Patent: Jun. 14, 2016

(54) SEMICONDUCTOR DEVICE WITH ATOM DIFFUSION BARRIER LAYER AND METHOD OF MANUFACTURING SEMICONDUCTOR DEVICE WITH ATOM DIFFUSION BARRIER LAYER

(71) Applicant: Sony Corporation, Tokyo (JP)

(72) Inventors: Koichi Baba, Kanagawa (JP); Masaaki Bairo, Kanagawa (JP); Hirokazu Ejiri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/630,109

(22) Filed: Feb. 24, 2015

(65) Prior Publication Data

US 2015/0249107 A1 Sep. 3, 2015

(30) Foreign Application Priority Data

Mar. 3, 2014 (JP) .................................. 2014-040388

(51) Int. Cl.
*H01L 27/146* (2006.01)
*H01L 21/768* (2006.01)

(52) U.S. Cl.
CPC .... *H01L 27/14643* (2013.01); *H01L 21/76897* (2013.01); *H01L 27/1462* (2013.01); *H01L 27/1463* (2013.01); *H01L 27/1469* (2013.01); *H01L 27/14614* (2013.01); *H01L 27/14634* (2013.01); *H01L 27/14636* (2013.01); *H01L 27/14689* (2013.01)

(58) Field of Classification Search
CPC ................................................ H01L 27/14643
See application file for complete search history.

(56) References Cited

U.S. PATENT DOCUMENTS

| | | | | | |
|---|---|---|---|---|---|
| 4,240,713 | A * | 12/1980 | Leibowitz | ............. | G02F 1/1533 359/274 |
| 5,093,564 | A * | 3/1992 | Miyagaki | .......... | H01L 27/14643 250/208.1 |
| 5,523,609 | A * | 6/1996 | Fukusho | ........... | H01L 27/14806 257/435 |
| 5,716,875 | A * | 2/1998 | Jones, Jr. | ............ | H01L 21/8221 257/E21.009 |
| 5,747,830 | A * | 5/1998 | Okita | ................. | G02F 1/136209 249/110 |
| 5,825,068 | A * | 10/1998 | Yang | ..................... | H01L 23/564 257/380 |
| 6,057,251 | A * | 5/2000 | Goo | .................. | H01L 21/02129 257/E21.241 |
| 6,255,170 | B1 * | 7/2001 | Yu | ......................... | H01L 27/115 257/E21.68 |
| 6,373,117 | B1 * | 4/2002 | Theil | ................. | H01L 27/14647 257/444 |
| 6,613,586 | B2 * | 9/2003 | Bailey | ............... | H01L 27/11502 257/E21.009 |
| 6,680,790 | B2 * | 1/2004 | Johnson | ................. | G02F 1/1533 359/245 |

(Continued)

FOREIGN PATENT DOCUMENTS

JP 2009-188068 A 8/2009

*Primary Examiner* — Matthew Landau
*Assistant Examiner* — Grant Withers
(74) *Attorney, Agent, or Firm* — Sheridan Ross P.C.

(57) ABSTRACT

Disclosed is a semiconductor device including a first semiconductor substrate and a first atom diffusion prevention portion, the first atom diffusion prevention portion being arranged at a part on the first semiconductor substrate and configured to prevent diffusion of an atom having a dangling bond terminating effect.

16 Claims, 41 Drawing Sheets

(56) References Cited

U.S. PATENT DOCUMENTS

| | | | |
|---|---|---|---|
| 6,781,184 B2* | 8/2004 | Solayappan | H01L 23/642 257/310 |
| 6,998,665 B2* | 2/2006 | Motoyoshi | B82Y 25/00 257/295 |
| 7,098,085 B2* | 8/2006 | Yamanaka | H01L 27/1285 257/E21.101 |
| 8,658,435 B2* | 2/2014 | Czabaj | H01L 29/6684 438/3 |
| 8,803,149 B2* | 8/2014 | Sakata | H01L 21/02565 257/43 |
| 2007/0075221 A1* | 4/2007 | Park | H01L 27/14603 250/214.1 |
| 2007/0148811 A1* | 6/2007 | Han | H01L 27/14689 438/98 |
| 2008/0135732 A1* | 6/2008 | Toumiya | H01L 27/14625 250/208.1 |
| 2009/0065827 A1* | 3/2009 | Hwang | H01L 27/1463 257/292 |
| 2009/0090989 A1* | 4/2009 | Han | H01L 27/14621 257/432 |
| 2010/0078748 A1* | 4/2010 | Mimuro | H01L 27/14623 257/435 |
| 2011/0027950 A1* | 2/2011 | Jones | H01L 27/14689 438/155 |
| 2011/0042814 A1* | 2/2011 | Okuyama | H01L 24/06 257/758 |
| 2012/0052636 A1* | 3/2012 | Shin | H01L 29/66742 438/151 |
| 2012/0105696 A1* | 5/2012 | Maeda | H01L 21/76898 348/302 |
| 2012/0199930 A1* | 8/2012 | Hayashi | H01L 27/1461 257/435 |
| 2012/0267690 A1* | 10/2012 | Endo | H01L 27/14632 257/225 |
| 2013/0020468 A1* | 1/2013 | Mitsuhashi | H01L 27/14634 250/208.1 |
| 2014/0264695 A1* | 9/2014 | Lee | H01L 27/1462 257/432 |
| 2015/0076649 A1* | 3/2015 | Kim | H01L 27/14609 257/446 |
| 2015/0145092 A1* | 5/2015 | Itagaki | H01L 27/14689 257/446 |
| 2015/0155173 A1* | 6/2015 | Hirota | H01L 21/283 438/682 |
| 2015/0200225 A1* | 7/2015 | Koike | H01L 27/14623 257/292 |
| 2015/0221694 A1* | 8/2015 | Baba | H01L 27/14634 257/443 |
| 2015/0221695 A1* | 8/2015 | Park | H01L 27/14636 257/774 |
| 2015/0249107 A1* | 9/2015 | Baba | H01L 27/14643 257/292 |

* cited by examiner

SEMICONDUCTOR DEVICE WITH ATOM DIFFUSION BARRIER LAYER AND METHOD OF MANUFACTURING SEMICONDUCTOR DEVICE WITH ATOM DIFFUSION BARRIER LAYER

CROSS REFERENCE TO RELATED APPLICATIONS

This application claims the benefit of Japanese Priority Patent Application JP2014-040388 filed Mar. 3, 2014, the entire contents of which are incorporated herein by reference.

BACKGROUND

The present disclosure relates to semiconductor devices, methods of manufacturing the semiconductor devices, and electronic apparatuses and, in particular, to a semiconductor device, a method of manufacturing the semiconductor device, and an electronic apparatus capable of reducing an increase in the size of a semiconductor substrate in a case in which the concentration of an atom having a dangling bond terminating effect on the front surface of the semiconductor substrate is controlled for each region.

In a solid-state image pickup element such as a CCD (Charge Coupled Device) or CMOS (Complementary Metal-Oxide Semiconductor) image sensor, it is important to reduce a dark current that causes degradation in image quality on the front surface of a semiconductor substrate.

A factor of the dark current lies in the fact that the interface level of the semiconductor substrate increases as a result of undergoing plasma damage such as a charge-up and UV irradiation by plasma processing such as CVD (Chemical Vapor Deposition) and dry etching in the manufacturing process of the solid-state image pickup element.

Accordingly, there has been devised a method in which the interface level is decreased with an atom such as hydrogen and fluorine having a dangling bond terminating effect on a device interface to reduce the dark current.

For example, there has been devised a method in which hydrogen is separated from a passivation film (SiN film) and coupled with a dangling bond on the front surface of a photodiode, i.e., the light receiving element of the semiconductor substrate to reduce the dark current on the front surface.

However, according to this method, hydrogen is supplied to the entire surface of the semiconductor substrate having a pixel portion and a peripheral circuit portion. Therefore, when a hydrogen supply amount is secured in the pixel portion, a hydrogen supply amount to the fine transistors of the peripheral circuit portion becomes excessive. This results in a surplus of hydrogen on the side of the front surface (device interface) of the semiconductor substrate and degradation in HCl (Hot Carrier Injection) and NBTI (Negative Bias Temperature Instability) resistance.

In order to address this, there has been proposed a method in which the remaining hydrogen amount of the passivation film serving as a hydrogen supply source is made different between the pixel portion and the peripheral circuit portion to allow the separate control of a hydrogen supply amount to the front surface of the semiconductor substrate (see, for example, Japanese Patent Application Laid-open No. 2009-188068).

SUMMARY

However, according to the method of Japanese Patent Application Laid-open No. 2009-188068, it is difficult to control the remaining hydrogen amount of the passivation film in a region not widely distant from the boundary between the pixel portion and the peripheral circuit portion. Accordingly, the arrangement of an active element or the like whose hydrogen supply amount is desirably controlled is not allowed, which results in an increase in the size of the semiconductor substrate.

The present disclosure has been made in view of the above circumstances, and it is therefore desirable to reduce an increase in the size of a semiconductor substrate in a case in which the concentration of an atom having a dangling bond terminating effect on the front surface of the semiconductor substrate is controlled for each region.

According to an embodiment of the present disclosure, there is provided a semiconductor device. The semiconductor device includes a first semiconductor substrate and a first atom diffusion prevention portion, the first atom diffusion prevention portion being arranged at a part on the first semiconductor substrate and configured to prevent diffusion of an atom having a dangling bond terminating effect.

In the above embodiment of the present disclosure, the first semiconductor substrate and the first atom diffusion prevention portion arranged at the part on the first semiconductor substrate and configured to prevent diffusion of the atom having the dangling bond terminating effect are provided.

According to another embodiment of the present disclosure, there is provided a method of manufacturing a semiconductor device. The method includes forming a semiconductor substrate and an atom diffusion prevention portion arranged at a part on the semiconductor substrate and configured to prevent diffusion of an atom having a dangling bond terminating effect.

In the above embodiment of the present disclosure, the semiconductor substrate and the atom diffusion prevention portion arranged at the part on the semiconductor substrate and configured to prevent diffusion of the atom having the dangling bond terminating effect are formed.

According to still another embodiment of the present disclosure, there is provided an electronic apparatus. The electronic apparatus includes a semiconductor substrate and an atom diffusion prevention portion arranged at a part on the semiconductor substrate and configured to prevent diffusion of an atom having a dangling bond terminating effect.

In the above embodiment of the present disclosure, the semiconductor substrate and the atom diffusion prevention portion arranged at the part on the semiconductor substrate and configured to prevent diffusion of the atom having the dangling bond terminating effect are provided.

According to the present disclosure, it is possible to control the concentration of an atom having a dangling bond terminating effect on the front surface of a semiconductor substrate for each region. In addition, according to the present disclosure, it is possible to reduce an increase in the size of a semiconductor substrate in a case in which the concentration of an atom having a dangling bond terminating effect on the front surface of the semiconductor substrate is controlled for each region.

Note that the effects described above are only for illustration and any effect described in the present disclosure may be produced.

These and other objects, features and advantages of the present disclosure will become more apparent in light of the following detailed description of best mode embodiments thereof, as illustrated in the accompanying drawings.

DETAILED DESCRIPTION OF EMBODIMENTS

Next, preconditions for the present disclosure and modes (hereinafter referred to as embodiments) for carrying out the present disclosure will be described. Note that the descriptions will be given in the following order.
1. First Embodiment: CMOS Image Sensor (FIGS. 1 to 13)
2. Second Embodiment: CMOS Image Sensor (FIGS. 14 to 28)
3. Third Embodiment: CMOS Image Sensor (FIGS. 29 to 32)
4. Fourth Embodiment: CMOS Image Sensor (FIGS. 33 to 35)
5. Fifth Embodiment: Wireless Device (FIG. 36)
6. Sixth Embodiment: CMOS Image Sensor (FIGS. 37 to 43)
7. Seventh Embodiment: Image Pickup Apparatus (FIG. 44)

1. First Embodiment

Configuration Example of First Embodiment of CMOS Image Sensor

Figure 1:
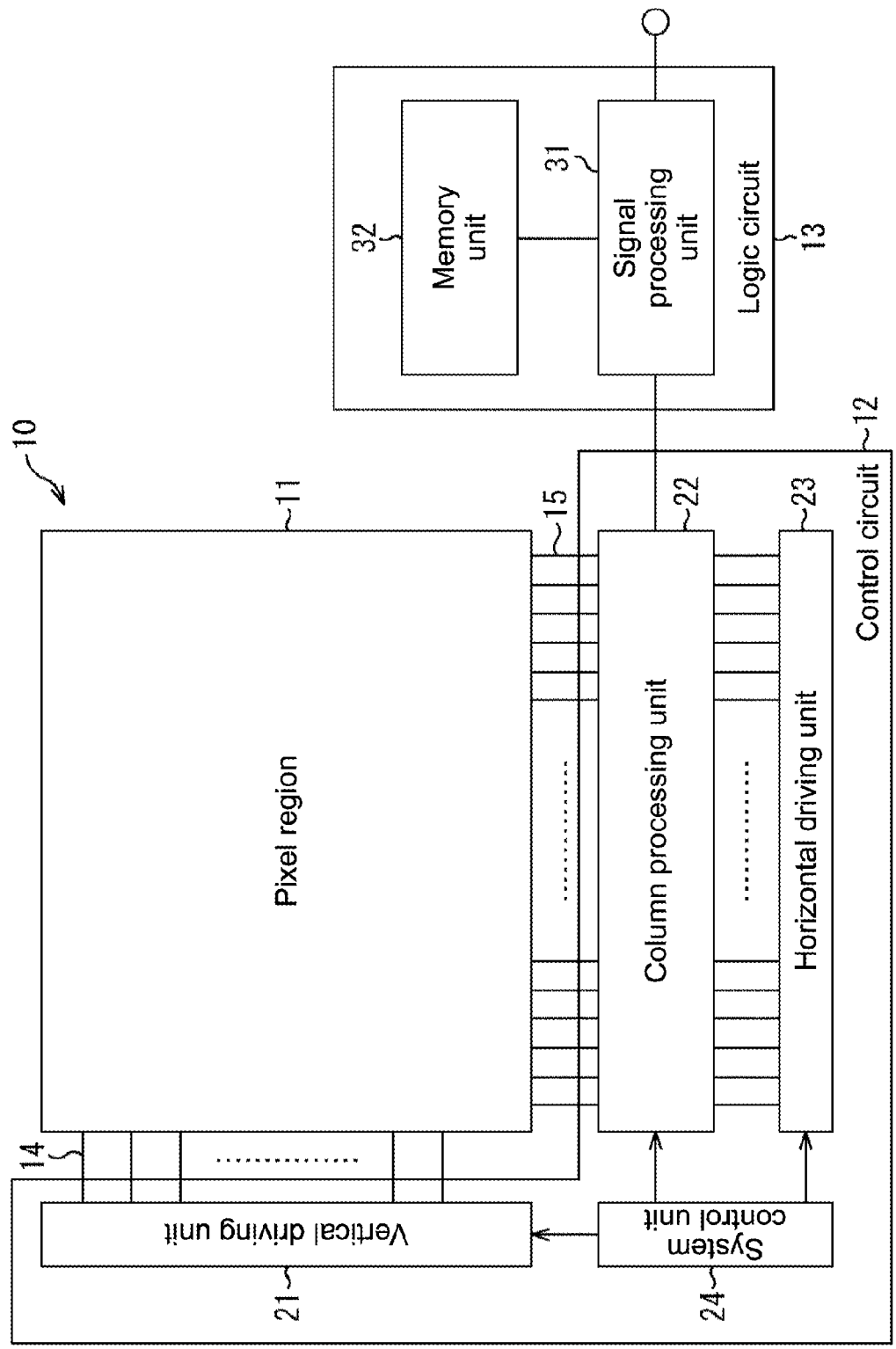
FIG. 1 is a diagram showing a configuration example of an embodiment of a CMOS image sensor as a semiconductor device to which the present disclosure is applied.

FIG. 1 is a diagram showing a configuration example of a first embodiment of a CMOS image sensor serving as a semiconductor device to which the present disclosure is applied.

A CMOS image sensor 10 is obtained in such a way that a pixel region 11, a control circuit 12, a logic circuit 13, pixel driving lines 14, and vertical signal lines 15 are formed on a semiconductor substrate (chip) such as a silicon substrate (not shown). The CMOS image sensor 10 picks up a subject image and outputs the pixel signals of respective pixels.

Specifically, the pixel region 11 has the pixels two-dimensionally arranged in a matrix pattern and picks up an image, each of the pixels having a photoelectric conversion element that generates charges by an amount corresponding to the light amount of incident light and accumulates the same therein. In addition, with respect to the pixels in the matrix pattern, the pixel region 11 has the pixel driving lines 14 in the horizontal direction (row direction) of FIG. 1 for respective rows and the vertical signal lines 15 in the vertical direction (column direction) thereof for respective columns.

In addition, the control circuit 12 has a vertical driving unit 21, a column processing unit 22, a horizontal driving unit 23, and a system control unit 24 and controls the reading of the pixel signals.

Specifically, the vertical driving unit 21 has a shift register, an address decoder, or the like and drives the respective pixels of the pixel region 11 in units of the rows or the like. The vertical driving unit 21 has output ends (not shown) connected to one ends of the pixel driving lines 14, the output ends corresponding to the respective rows. Although the specific configuration of the vertical driving unit 21 is not shown, the vertical driving unit 21 has two scanning systems, i.e., a reading scanning system and a resetting scanning system.

The reading scanning system sequentially selects the respective rows so as to sequentially read pixel signals from the respective pixels in units of the rows and outputs selection pulses or the like from the output ends connected to the pixel driving lines 14 of the selected rows.

In order to reset the undesired charges of the photoelectric conversion elements, the resetting scanning system outputs control pulses from the output ends connected to the pixel driving lines 14 of the respective rows preceding the scanning of the reading scanning system by the time of a shutter speed. By the scanning of the resetting scanning system, a so-called electronic shutter operation is sequentially performed for the respective rows. Here, the electronic shutter operation represents an operation in which the charges of the photoelectric conversion elements are discarded to newly start exposure (start the accumulation of charges).

The pixel signals output from the respective pixels of the rows selected by the reading scanning system of the vertical driving unit 21 are supplied to the column processing unit 22 via the respective vertical signal lines 15.

The column processing unit 22 has signal processing circuits for the respective columns of the pixel region 11. The respective signal processing circuits of the column processing unit 22 apply noise elimination processing such as CDS (Correlated Double Sampling) processing and signal processing such as A/D (Analog/Digital) conversion processing to the pixel signals output from the respective pixels of the selected rows via the vertical signal lines 15. By the CDS processing, fixed pattern noise unique to the pixels such as reset noise and threshold fluctuations in amplifying transistors is eliminated. The column processing unit 22 temporarily holds the pixel signals that have been subjected to the signal processing.

The horizontal driving unit 23 has a shift register, an address decoder, or the like and sequentially selects the signal processing circuits of the column processing unit 22. By the selective scanning of the horizontal driving unit 23, the pixel signals processed by the respective signal processing circuits of the column processing unit 22 are sequentially output to the logic circuit 13.

The system control unit 24 has a timing generator or the like that generates various timing signals, and controls the vertical driving unit 21, the column processing unit 22, and the horizontal driving unit 23 based on the various timing signals generated by the timing generator.

The logic circuit 13 has a signal processing unit 31 and a memory unit 32 and applies prescribed signal processing to the pixel signals supplied from the control circuit 12.

Specifically, the signal processing unit 31 has at least an addition processing function. The signal processing unit 31 applies various signal processing such as the addition processing to the pixel signals output from the column processing unit 22. At this time, the signal processing unit 31 stores the intermediate results of the signal processing or the like in the memory unit 32 as occasion demands and refers to the same at appropriate timing. The signal processing unit 31 outputs the pixel signals that have been subjected to the signal processing.

The memory unit 32 has a DRAM (Dynamic Random Access Memory), an SRAM (Static Random Access Memory), or the like.

The respective pixels of the pixel region 11, the control circuit 12, and the logic circuit 13 of the CMOS image sensor 10 configured as described above are made of various active elements. For example, the respective pixels of the pixel region are made of photo diodes, transistors, or the like.

Arrangement Examples of CMOS Image Sensor

Figure 2A:
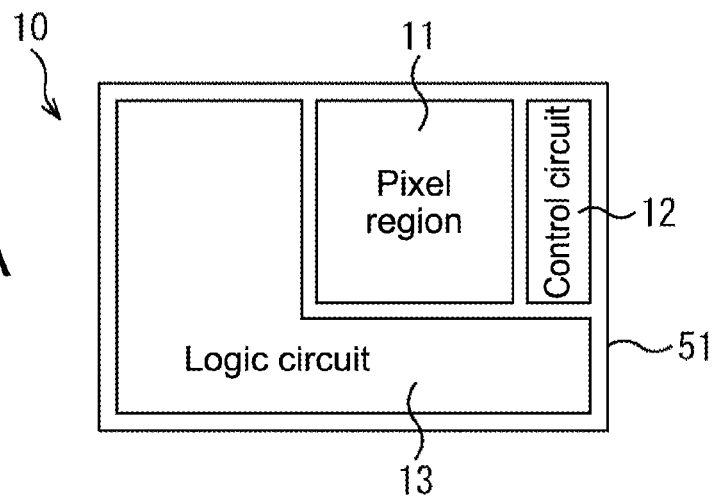
FIGS. 2A to 2C are diagrams showing arrangement examples of the CMOS image sensor shown in FIG. 1.
Figure 2B:
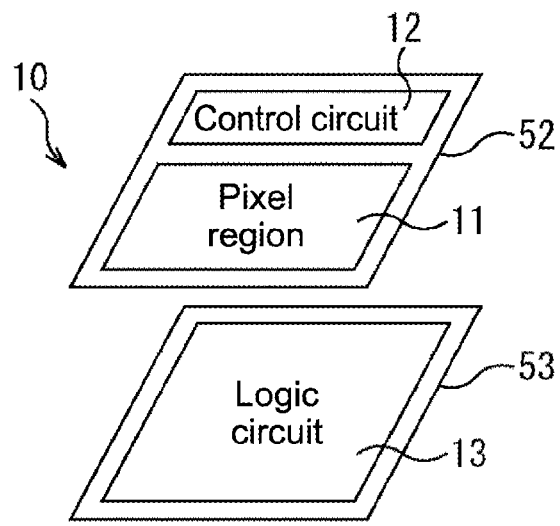
Figure 2C:
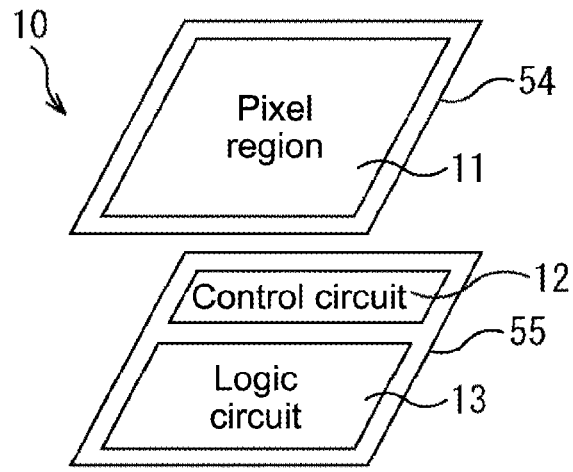

FIGS. 2A to 2C are diagrams showing arrangement examples of the CMOS image sensor 10 shown in FIG. 1.

The arrangement of the pixel region 11, the control circuit 12, and the logic circuit 13 of the CMOS image sensor 10 may be, for example, any of first to third arrangements shown in FIGS. 2A to 2C.

That is, the arrangement of the pixel region 11, the control circuit 12, and the logic circuit 13 of the CMOS image sensor 10 may be the first arrangement in which all of the pixel region 11, the control circuit 12, and the logic circuit 13 are arranged on a semiconductor substrate 51 as shown in FIG. 2A.

In addition, the arrangement of the pixel region 11, the control circuit 12, and the logic circuit 13 of the CMOS image sensor 10 may be the second arrangement in which the pixel region 11 and the control circuit 12 are arranged on one of two laminated semiconductor substrates 52 and 53 and the logic circuit 13 is arranged on the other thereof as shown in FIG. 2B. In the example shown in FIG. 2B, the pixel region 11 and the control circuit 12 are arranged on the semiconductor substrate 52, and the logic circuit 13 is arranged on the semiconductor substrate 53.

Moreover, the arrangement of the pixel region 11, the control circuit 12, and the logic circuit 13 of the CMOS image sensor 10 may be the third arrangement in which the pixel region 11 is arranged on one of two laminated semiconductor substrates 54 and 55 and the control circuit 12 and the logic circuit 13 are arranged on the other thereof as shown in FIG. 2C. In the example shown in FIG. 2C, the pixel region 11 is arranged on the semiconductor substrate 54, and the control circuit 12 and the logic circuit 13 are arranged on the semiconductor substrate 55.

First Configuration Example Around Active Elements of CMOS Image Sensor

Figure 3:
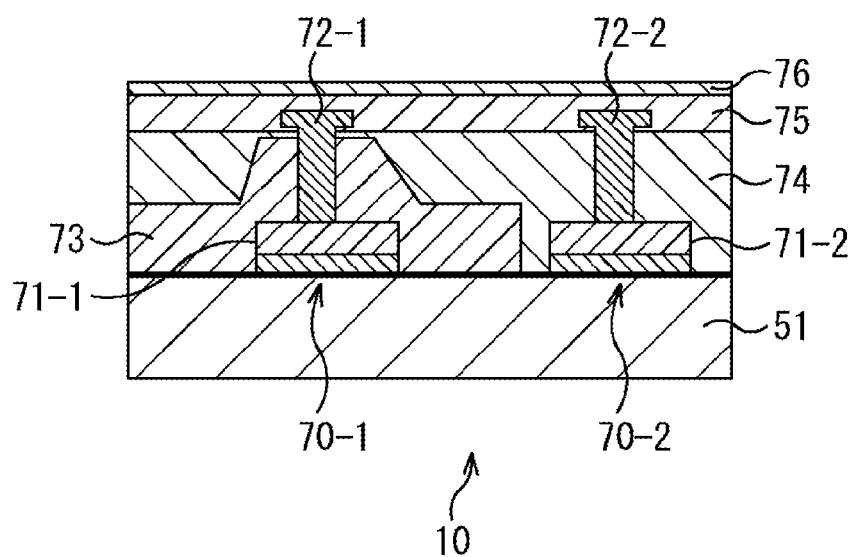
FIG. 3 is a cross-sectional diagram describing a first configuration example of the CMOS image sensor in a case in which the arrangement of the CMOS image sensor is a first arrangement shown in FIG. 2A.

FIG. 3 is a cross-sectional diagram describing a first configuration example around the active elements of the CMOS image sensor 10 in a case in which the arrangement of the CMOS image sensor 10 is the first arrangement shown in FIG. 2A.

FIG. 3 shows, among the active elements of the CMOS image sensor 10, a transistor to which concentrated hydrogen is supplied to terminate a dangling bond and a transistor that reduces the supply of hydrogen. Note that FIG. 3 does not show the internal configuration of the semiconductor substrate 51. The same applies to FIG. 6 that will be described later.

As shown in FIG. 3, a gate electrode 71-1 of a transistor 70-1 and a gate electrode 71-2 of a transistor 70-2 are arranged over the semiconductor substrate 51. The transistor 70-1 is an active element that reduces the supply of hydrogen and secures NBTI (Negative Bias Temperature Instability) resistance or the like, e.g., an active element having high element reliability when hydrogen concentration on the front surface of the semiconductor substrate 51 is low. Examples of the transistor 70-1 include the p-type MOS (Metal Oxide Semiconductor) transistor of the control circuit 12.

On the other hand, the transistor 70-2 is an active element to which concentrated hydrogen is supplied to terminate a dangling bond, e.g., an active element excellent in the characteristics of noise such as 1/f noise when hydrogen concentration on the front surface of the semiconductor substrate 51 is high. Examples of the transistor 70-2 include the amplifying transistor of the pixel, the comparator of the control circuit 12, and a transistor for an input/output circuit.

The gate electrode 71-1 has a contact plug 72-1 and is connected to a power supply, other active elements, or the like (not shown) via the contact plug 72-1. Similarly, the gate electrode 71-2 has a contact plug 72-2 and is connected to the power supply, other active elements, or the like (not shown) via the contact plug 72-2.

The front surface of the semiconductor substrate 51 on the side of the transistor 70-1 that reduces the supply of hydrogen is covered with a hydrogen diffusion prevention film 73 that prevents the diffusion of hydrogen. Thus, the supply of hydrogen to the transistor 70-1 may be reduced. In addition, since the supply of hydrogen to the transistor 70-1 is reduced, more hydrogen is supplied to the transistor 70-2 to which concentrated hydrogen is desirably supplied. That is, compared with a case in which the hydrogen diffusion prevention film 73 is not arranged, hydrogen concentration on the front surface of the semiconductor substrate 51 on the side of the transistor 70-2 may be increased.

An interlayer insulation film 74 is formed around the transistor 70-1 covered with the hydrogen diffusion prevention film 73 and the transistor 70-2. In addition, a wiring-line layer 75 provided with a wiring line that connects the contact plugs 72-1 and 72-2 to the power supply, other active elements, or the like (not shown) is formed as an upper layer on the interlayer insulation film 74. Note that in the specification, an upper layer represents a layer in a direction away from a semiconductor substrate and a lower layer represents a layer in a direction close to the semiconductor substrate.

A hydrogen supply film 76 is formed as an upper layer on the wiring-line layer 75 over the entire surface of the semiconductor substrate 51. The hydrogen supply film 76 is made of a passivation film (SiN film) or the like and releases and supplies hydrogen to the front surface of the semiconductor substrate 51.

First Example of Method of Manufacturing CMOS Image Sensor

FIGS. 4A to 4F are diagrams showing a first example of a method of manufacturing the surrounding parts of the transistors 70-1 and 70-2 of the CMOS image sensor 10 shown in FIG. 3.

Figure 4A:
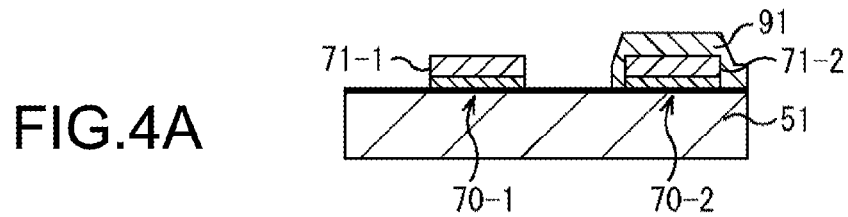
FIGS. 4A to 4F are diagrams showing a first example of a method of manufacturing the CMOS image sensor shown in FIG. 3.

As shown in FIG. 4A, a resist 91 is coated on the transistor 70-2 by patterning after the transistors 70-1 and 70-2 are formed on the semiconductor substrate 51.

Figure 4B:
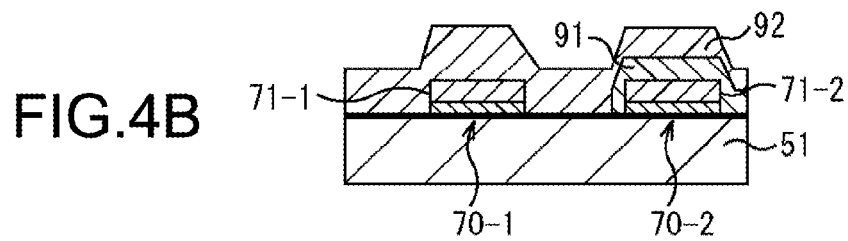

Next, as shown in FIG. 4B, the hydrogen diffusion prevention film 92 having high film density is deposited. As the hydrogen diffusion prevention film 92, LP-SiN, ALD-SiN and UV-SiN (UV-transparent Silicon Nitride) having relatively high film density, or the like may be used. LP-SiN represents SiN formed by LP-CVD (Low Pressure Chemical Vapor Deposition) accompanied with high-temperature processing, and ALD-SiN represents SiN formed by ALD-CVD (Atomic Layer Deposition Chemical Vapor Deposition). Alternatively, the hydrogen diffusion prevention film 92 may be SiN deposited by plasma CVD. The hydrogen diffusion prevention film 92 has a film density of, for example, 2.7 g/cm to 3.5 g/cm.

Figure 4C:
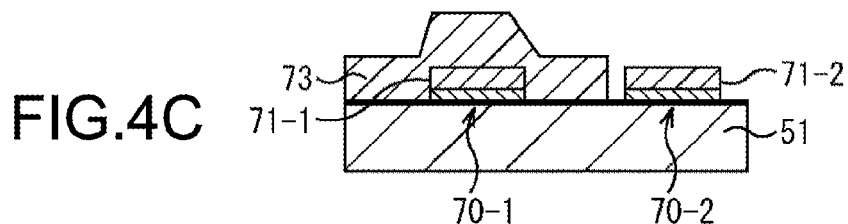
Figure 4D:
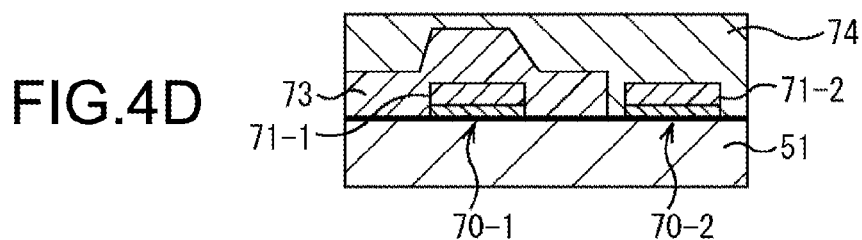

Then, as shown in FIG. 4C, the resist 91 is removed after the deposition of the hydrogen diffusion prevention film 92 to form a hydrogen diffusion prevention film 73 only at the transistor 70-1. Next, as shown in FIG. 4D, an interlayer insulation film 74 is formed.

Figure 4E:
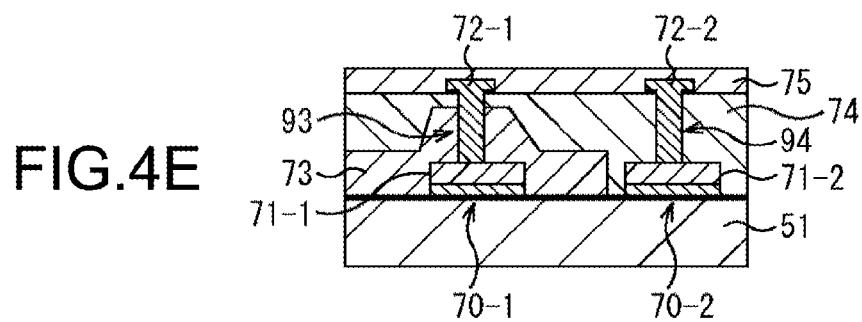

Then, as shown in FIG. 4E, a connection hole 93 is bored in the hydrogen diffusion prevention film 73 and the interlayer insulation film 74, and the contact plug (connection conductor) 72-1 made of Cu or the like is formed. In addition, a connection hole 94 is bored in the interlayer insulation film 74, and the contact plug 72-2 made of Cu or the like is formed. Moreover, the wiring-line layer 75 that connects the contact plugs 72-1 and 72-2 to the power supply and the other active elements (not shown) is formed.

As the barrier metal of the contact plug 72-1, Ti-based metal that stores hydrogen may be used. In this case, the diffusion of hydrogen may be further prevented.

Figure 4F:
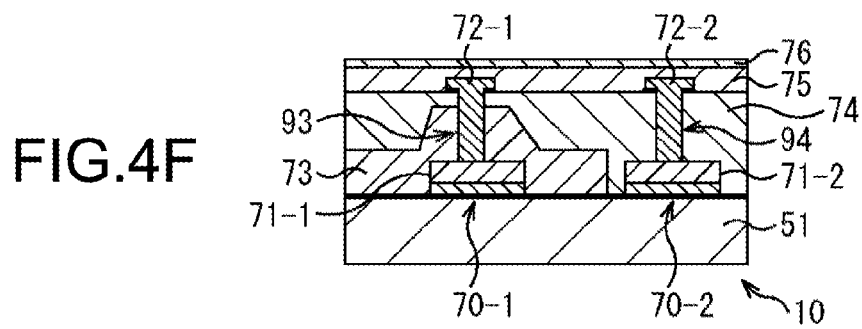

Finally, as shown in FIG. 4F, the hydrogen supply film 76 is formed after the formation of the contact plugs 72-1 and 72-2 and the wiring-line layer 75. Thus, the processing steps are ended.

Second Example of Method of Manufacturing CMOS Image Sensor

FIGS. 5A to 5F are diagrams showing a second example of the method of manufacturing the surrounding parts of the transistors 70-1 and 70-2 of the CMOS image sensor 10 shown in FIG. 3.

Figure 5A:
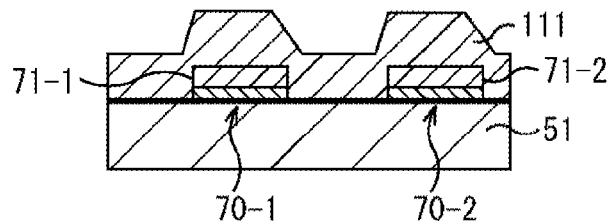
FIGS. 5A to 5F are diagrams showing a second example of the method of manufacturing the CMOS image sensor shown in FIG. 3.
Figure 5B:
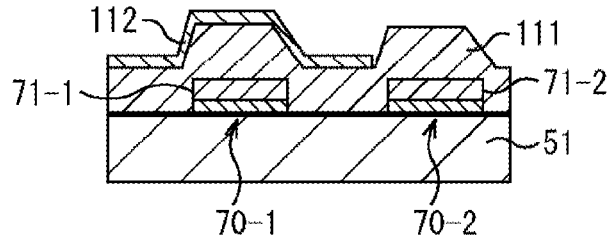

As shown in FIG. 5A, a hydrogen diffusion prevention film 111 is deposited as in FIG. 4B after the transistors 70-1 and 70-2 are formed on the semiconductor substrate 51. Next, as shown in FIG. 5B, a resist 112 is coated over the transistor 70-1, on which the hydrogen diffusion prevention film 111 is deposited, by patterning.

Figure 5C:
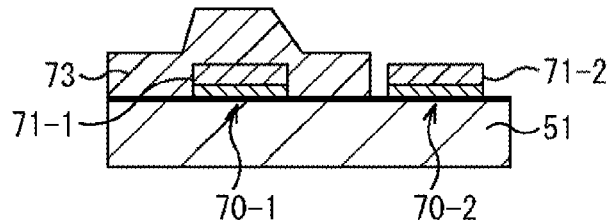
Figure 5D:
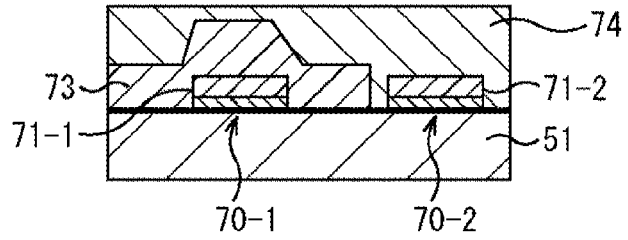
Figure 5E:
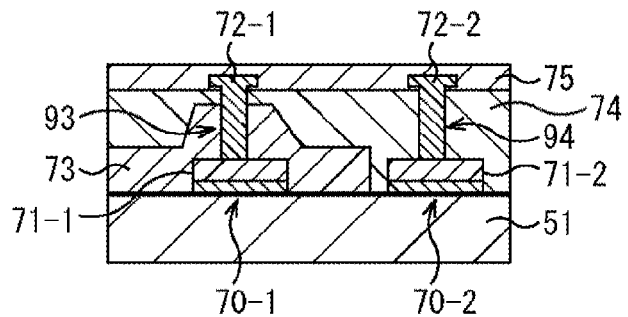
Figure 5F:
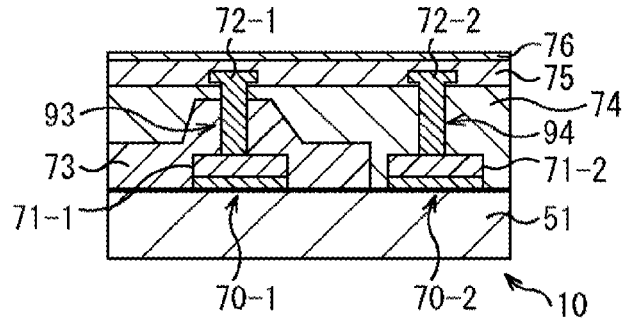

Then, as shown in FIG. 5C, the hydrogen diffusion prevention film 111, on which the resist 112 is not coated, is removed to form the hydrogen diffusion prevention film 73 only at the transistor 70-1. Next, as shown in FIGS. 5D to 5F, the same processing steps as those shown in FIGS. 4D to 4F are performed. Thus, the processing steps are ended.

Second Configuration Example Around Active Elements of CMOS Image Sensor

Figure 6:
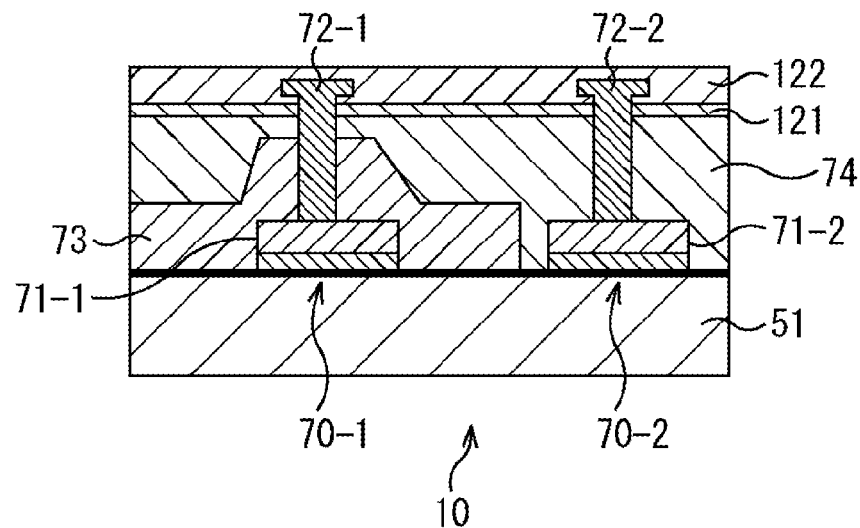
FIG. 6 is a cross-sectional diagram describing a second configuration example of the CMOS image sensor in a case in which the arrangement of the CMOS image sensor is the first arrangement shown in FIG. 2A.

FIG. 6 is a cross-sectional diagram describing a second configuration example around the active elements of the CMOS image sensor 10 in a case in which the arrangement of the CMOS image sensor 10 is the first arrangement shown in FIG. 2A.

In FIG. 6, the same configurations as those shown in FIG. 3 are denoted by the same symbols. In addition, duplicated descriptions will be omitted as occasion demands.

The configurations around the active elements of the CMOS image sensor 10 shown in FIG. 6 are different from those shown in FIG. 3 in that a hydrogen supply film 121 is provided instead of the hydrogen supply film 76 and that a wiring-line layer 122 is provided instead of the wiring-line layer 75. In FIG. 6, the hydrogen supply film 121 is arranged beneath the wiring-line layer 122 as a lower layer.

Although not shown, the same processing steps as those shown in FIGS. 4A to 4D or FIGS. 5A to 5D are performed to manufacture the surrounding parts of the transistors 70-1 and 70-2 of the CMOS image sensor 10 shown in FIG. 6. Next, the hydrogen supply film 121 is formed as in FIG. 4F or FIG. 5F. Then, the contact plugs 72-1 and 72-2 are formed as in FIG. 4E or FIG. 5E. Thus, the processing steps are ended.

Third Configuration Example Around Active Elements of CMOS Image Sensor

Figure 7:
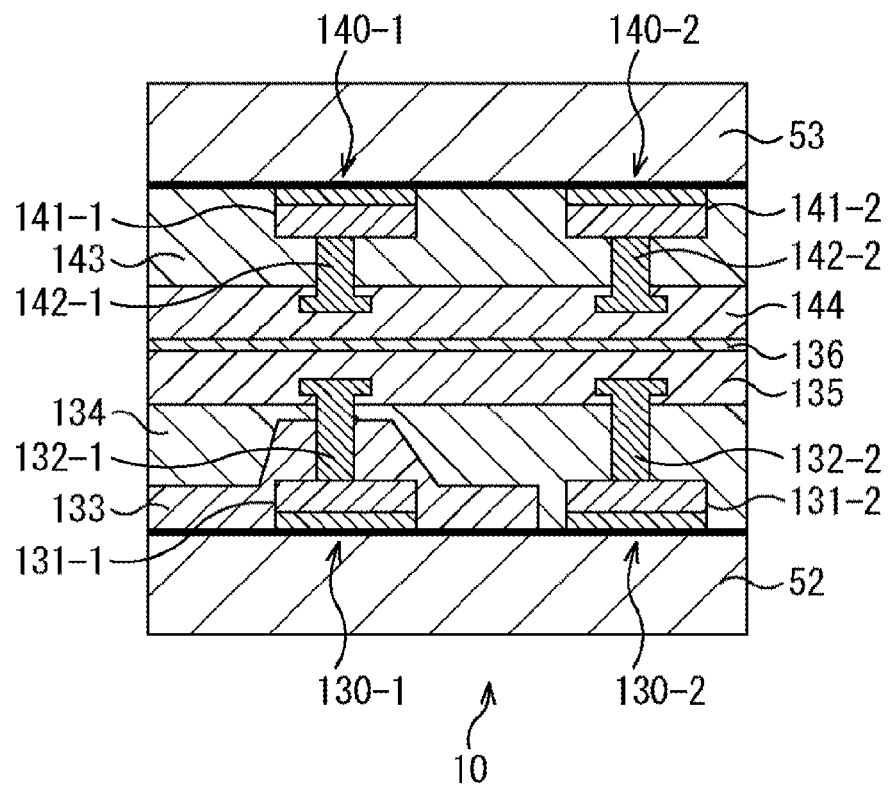
FIG. 7 is a cross-sectional diagram describing a first configuration example of the CMOS image sensor in a case in which the arrangement of the CMOS image sensor is a second arrangement shown in FIG. 2B.

FIG. 7 is a cross-sectional diagram describing a first configuration example around the active elements of the CMOS image sensor 10 in a case in which the arrangement of the CMOS image sensor 10 is the second arrangement shown in FIG. 2B.

FIG. 7 shows, among the active elements of the pixel region 11 and the control circuit 12, a transistor to which concentrated hydrogen is supplied to terminate a dangling bond, a transistor that reduces the supply of hydrogen, and two transistors to which concentrated hydrogen is supplied to terminate a dangling bond. Note that FIG. 7 does not show the internal configurations of the semiconductor substrates 52 and 53. The same applies to FIGS. 8 to 12.

As shown in FIG. 7, a gate electrode 131-1 of a transistor 130-1 and a gate electrode 131-2 of a transistor 130-2 are arranged over the semiconductor substrate 52. The transistor 130-1 shown in FIG. 7 is an active element that reduces the supply of hydrogen like the transistor 70-1 shown in FIG. 3. On the other hand, the transistor 130-2 is an active element to which concentrated hydrogen is supplied to terminate a dangling bond like the transistor 70-2.

Since the gate electrodes 131-1 and 131-2, contact plugs 132-1 and 132-2, a hydrogen diffusion prevention film 133, an interlayer insulation film 134, a wiring-line layer 135, and a hydrogen supply film 136 formed over the semiconductor substrate 52 are the same as the gate electrodes 71-1 and 71-2, the contact plugs 72-1 and 72-2, the hydrogen diffusion prevention film 73, the interlayer insulation film 74, the wiring-line layer 75, and the hydrogen supply film 76 shown in FIG. 3, respectively, their descriptions will be omitted.

In addition, as shown in FIG. 7, a gate electrode 141-1 of a transistor 140-1 and a gate electrode 141-2 of a transistor 140-2 are arranged over the semiconductor substrate 53. The transistors 140-1 and 140-2 shown in FIG. 7 are active elements to which concentrated hydrogen is supplied to terminate a dangling bond like the transistor 70-2.

Since the gate electrodes 141-1 and 141-2, contact plugs 142-1 and 142-2, an interlayer insulation film 143, and a wiring-line layer 144 formed over the semiconductor substrate 53 are the same as the gate electrode 71-2, the contact plug 72-2, the interlayer insulation film 74, and the wiring-line layer 75 shown in FIG. 3, respectively, their descriptions will be omitted.

The semiconductor substrates 52 and 53 shown in FIG. 7 are laminated together so as to make the wiring-line layers 135 and 144 face each other via the hydrogen supply film 136 and are electrically connected to each other. The hydrogen supply film 136 is shared between the semiconductor substrates 52 and 53.

Although not shown, the same processing steps as those shown in FIGS. 4A to 4E or FIGS. 5A to 5E are performed on the semiconductor substrates 52 and 53 to manufacture the surrounding parts of the transistors 130-1, 130-2, 140-1, and 140-2 of the CMOS image sensor 10 shown in FIG. 7. Next, the same processing step shown in FIG. 4F or 5F is performed on the semiconductor substrate 52 to form the hydrogen supply film 136. Then, the semiconductor substrates 52 and 53 are joined together so as to make the wiring-line layers 135 and 144 face each other via the hydrogen supply film 136. Thus, the processing steps are ended.

Here, although the hydrogen supply film 136 is formed over the semiconductor substrate 52, it may be formed over the semiconductor substrate 53.

Fourth Configuration Example Around Active Elements of CMOS Image Sensor

Figure 8:
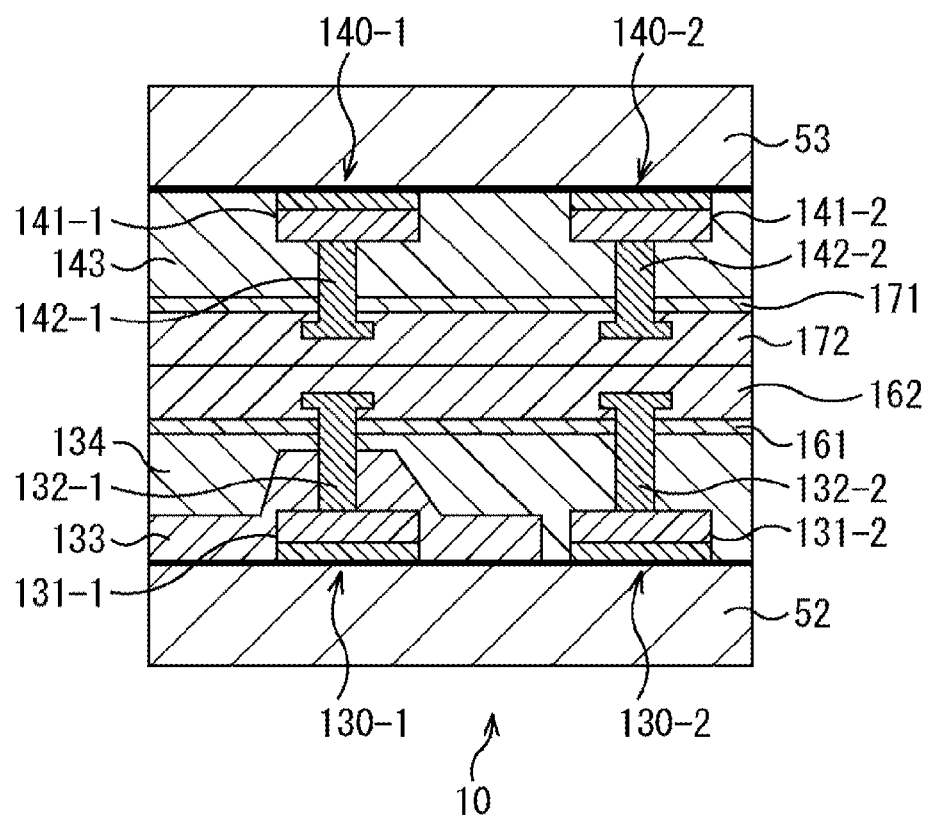
FIG. 8 is a cross-sectional diagram describing a second configuration example of the CMOS image sensor in a case in which the arrangement of the CMOS image sensor is the second arrangement shown in FIG. 2B.

FIG. 8 is a cross-sectional diagram describing a second configuration example around the active elements of the CMOS image sensor 10 in a case in which the arrangement of the CMOS image sensor 10 is the second arrangement shown in FIG. 2B.

In FIG. 8, the same configurations as those shown in FIG. 7 are denoted by the same symbols. In addition, duplicated descriptions will be omitted as occasion demands.

The configurations around the active elements of the CMOS image sensor 10 shown in FIG. 8 are different from those shown in FIG. 7 in that a wiring-line layer 162, hydrogen supply films 161 and 171, and a wiring-line layer 172 are provided instead of the wiring-line layer 135, the hydrogen supply film 136, and the wiring-line layer 144. In FIG. 8, the hydrogen supply films 161 and 171 are arranged beneath the wiring-line layers 162 and 172 as lower layers, respectively.

Specifically, a hydrogen supply film is not shared between the semiconductor substrates 52 and 53, but the hydrogen supply film 161 for the semiconductor substrate 52 is provided beneath the wiring-line layer 162 as a lower layer over the entire surface of the semiconductor substrate 52. In addition, the hydrogen supply film 171 for the semiconductor substrate 53 is provided beneath the wiring-line layer 172 as a lower layer over the entire surface of the semiconductor substrate 53. The semiconductor substrates 52 and 53 shown in FIG. 8 are laminated together so as to make the wiring-line layers 162 and 172 face each other via the hydrogen supply films 161 and 171 and the wiring-line layers 162 and 172 and are electrically connected to each other.

Although not shown, the same processing steps as those shown in FIGS. 4A to 4D or FIGS. 5A to 5D are first performed on the semiconductor substrates 52 and 53 to manufacture the surrounding parts of the transistors 130-1, 130-2, 140-1, and 140-2 of the CMOS image sensor 10 shown in FIG. 8. Next, the same processing step as that shown in FIG. 4F or 5F is performed on the semiconductor substrates 52 and 53 to form the hydrogen supply films 161 and 171. Then, the same processing step as that shown in FIG. 4E or 5E is performed on the semiconductor substrate 52 and 53 to form the wiring-line layers 162 and 172. Finally, the semiconductor substrates 52 and 53 are joined together so as to make the wiring-line layers 162 and 172 face each other. Thus, the processing steps are ended.

Fifth Configuration Example Around Active Elements of CMOS Image Sensor

Figure 9:
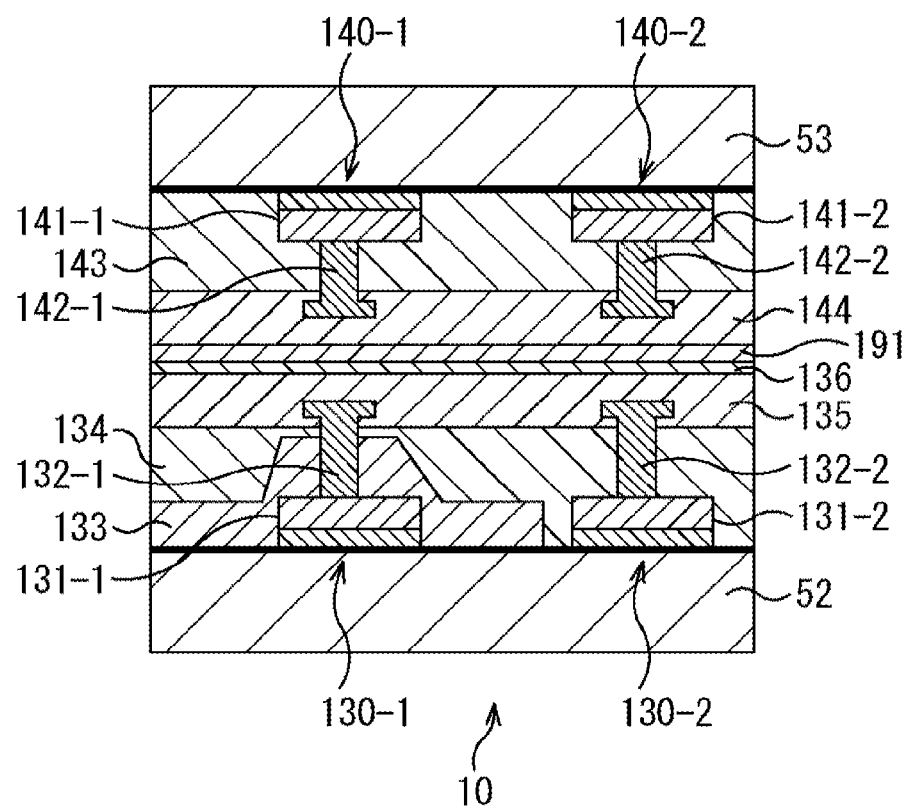
FIG. 9 is a cross-sectional diagram describing a third configuration example of the CMOS image sensor in a case in which the arrangement of the CMOS image sensor is the second arrangement shown in FIG. 2B.

FIG. 9 is a cross-sectional diagram describing a third configuration example around the active elements of the CMOS image sensor 10 in a case in which the arrangement of the CMOS image sensor 10 is the second arrangement shown in FIG. 2B.

In FIG. 9, the same configurations as those shown in FIG. 7 are denoted by the same symbols. In addition, duplicated descriptions will be omitted as occasion demands.

The configurations around the active elements of the CMOS image sensor 10 shown in FIG. 9 are different from those shown in FIG. 7 in that a hydrogen diffusion prevention film 191 is additionally provided. In FIG. 9, all the active elements of the logic circuit 13 including the transistors 140-1 and 140-2 are active elements that reduce the supply of hydrogen like the transistor 70-1 shown in FIG. 3, and the entire surface of the semiconductor substrate 53 is covered with the hydrogen diffusion prevention film 191.

Specifically, the hydrogen diffusion prevention film 191 is arranged over the entire surface of the semiconductor substrate 53 between the wiring-line layer 144 and the hydrogen supply film 136. Thus, hydrogen released from the hydrogen supply film 136 may be prevented from being supplied to the front surface of the semiconductor substrate 53. The semiconductor substrates 52 and 53 shown in FIG. 9 are laminated together so as to make the wiring-line layers 135 and 144 face each other via the hydrogen supply film 136 and the hydrogen diffusion prevention film 191 and are electrically connected to each other.

Although not shown, the same processing steps as those shown in FIGS. 4A to 4E or FIGS. 5A to 5E are first performed on the semiconductor substrates 52 and 53 to manufacture the surrounding parts of the transistors 130-1, 130-2, 140-1, and 140-2 of the CMOS image sensor 10 shown in FIG. 9. Next, the same processing step as that shown in FIG. 4F or FIG. 5F is performed on, for example, the semiconductor substrate 52 to form the hydrogen supply film 136. Then, the hydrogen diffusion prevention film 191 is deposited. Finally, the semiconductor substrates 52 and 53 are joined together so as to make the wiring-line layers 135 and 144 face each other via the hydrogen supply film 136 and the hydrogen diffusion prevention film 191. Thus, the processing steps are ended.

Note that the hydrogen diffusion prevention film 191 may be arranged beneath the wiring-line layer 144 as a lower layer. In addition, the hydrogen supply film 136 may be arranged beneath the wiring-line layer 135 as a lower layer.

Sixth Configuration Example Around Active Elements of CMOS Image Sensor

Figure 10:
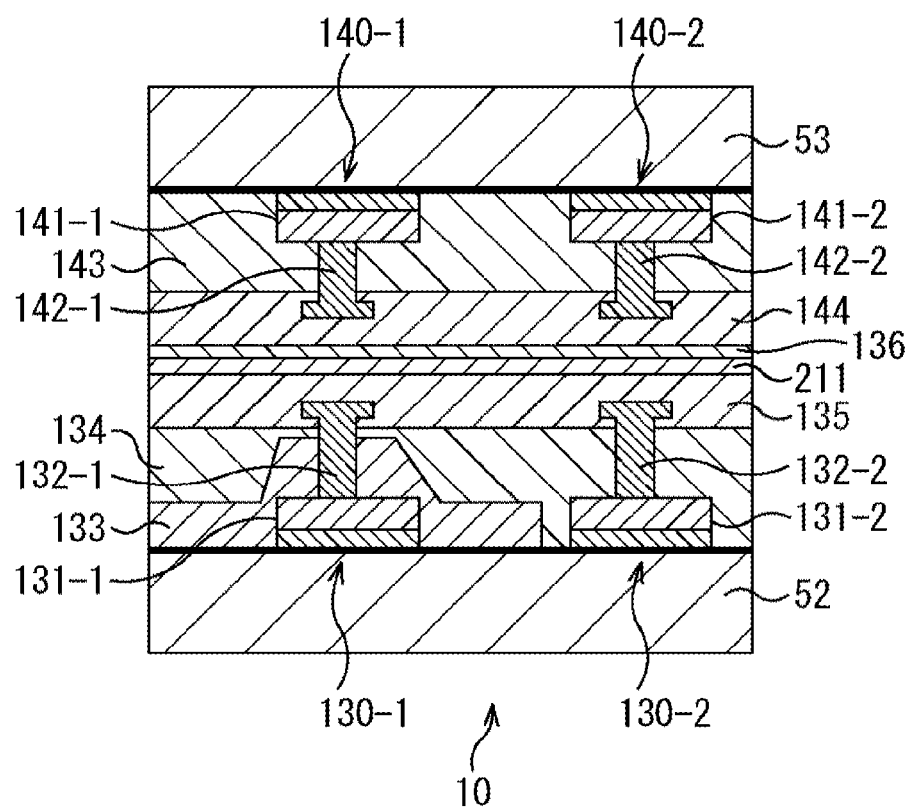
FIG. 10 is a cross-sectional diagram describing a fourth configuration example of the CMOS image sensor in a case in which the arrangement of the CMOS image sensor is the second arrangement shown in FIG. 2B.

FIG. 10 is a cross-sectional diagram describing a fourth configuration example around the active elements of the CMOS image sensor 10 in a case in which the arrangement of the CMOS image sensor 10 is the second arrangement shown in FIG. 2B.

In FIG. 10, the same configurations as those shown in FIG. 7 are denoted by the same symbols. In addition, duplicated descriptions will be omitted as occasion demands.

The configurations around the active elements of the CMOS image sensor 10 shown in FIG. 10 are different from those shown in FIG. 7 in that a hydrogen diffusion prevention film 211 is additionally provided. In FIG. 10, all the active elements of the pixel region 11 including the transistors 130-1 and 130-2 and the control circuit 12 are active elements that reduce the supply of hydrogen like the transistor 70-1 shown in FIG. 3, and the entire surface of the semiconductor substrate 52 is covered with the hydrogen diffusion prevention film 211.

Specifically, the hydrogen diffusion prevention film 211 is arranged over the entire surface of the semiconductor substrate 52 between the wiring-line layer 135 and the hydrogen supply film 136. Thus, hydrogen released from the hydrogen supply film 136 may be prevented from being supplied to the front surface of the semiconductor substrate 52. The semiconductor substrates 52 and 53 shown in FIG. 10 are laminated together so as to make the wiring-line layers 135 and 144 face each other via the hydrogen supply film 136 and the hydrogen diffusion prevention film 211 and are electrically connected to each other.

Although not shown, the same processing steps as those shown in FIGS. 4A to 4E or FIGS. 5A to 5E are first performed on the semiconductor substrates 52 and 53 to manufacture the surrounding parts of the transistors 130-1, 130-2, 140-1, and 140-2 of the CMOS image sensor 10 shown in FIG. 10. Next, for example, the hydrogen diffusion prevention film 211 is formed over the semiconductor substrate 52. Then, the same processing step as that shown in FIG. 4F or FIG. 5F is performed to form the hydrogen supply film 136. Finally, the semiconductor substrates 52 and 53 are joined together so as to make the wiring-line layers 135 and 144 face each other via the hydrogen supply films 136 and the hydrogen diffusion prevention film 211. Thus, the processing steps are ended.

Note that the hydrogen diffusion prevention film 211 may be arranged beneath the wiring-line layer 135 as a lower layer. In addition, the hydrogen supply film 136 may be arranged beneath the wiring-line layer 144 as a lower layer. Moreover, the transistor 130-1 is covered with the hydrogen diffusion prevention film 133 in the example shown in FIG. 10, but the hydrogen diffusion prevention film 133 may not be provided.

Seventh Configuration Example Around Active Elements of CMOS Image Sensor

Figure 11:
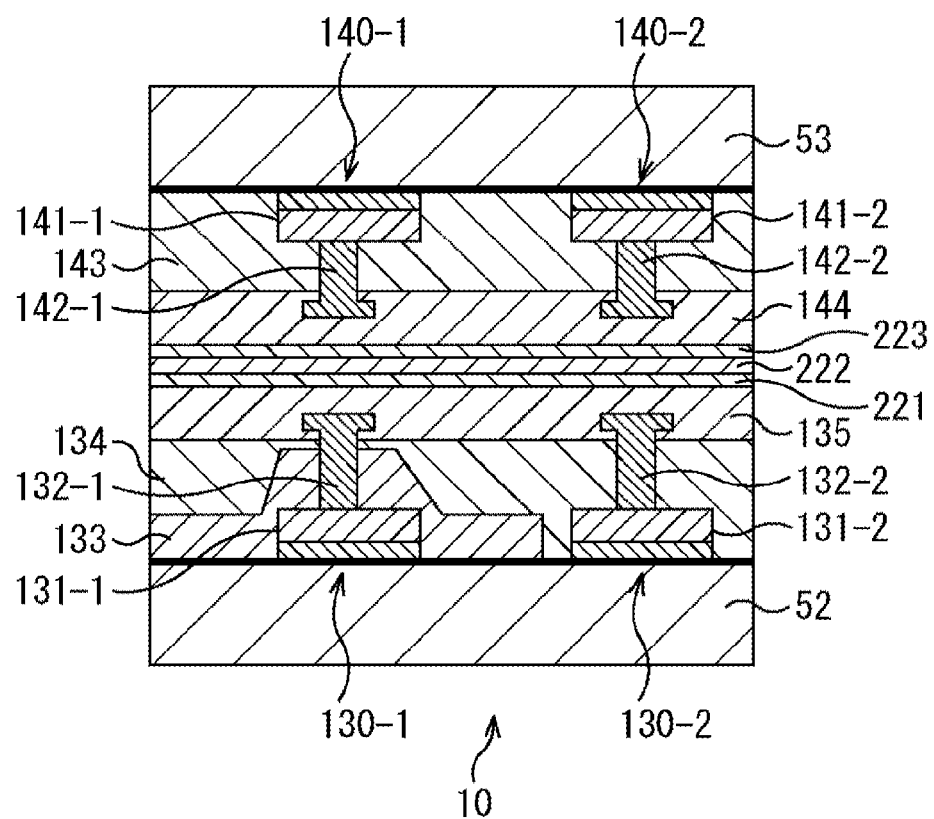
FIG. 11 is a cross-sectional diagram describing a fifth configuration of the CMOS image sensor in which the arrangement of the CMOS image sensor is the second arrangement shown in FIG. 2B.

FIG. 11 is a cross-sectional diagram describing a fifth configuration example around the active elements of the CMOS image sensor 10 in a case in which the arrangement of the CMOS image sensor 10 is the second arrangement shown in FIG. 2B.

In FIG. 11, the same configurations as those shown in FIG. 7 are denoted by the same symbols. In addition, duplicated descriptions will be omitted as occasion demands.

The configurations around the active elements of the CMOS image sensor 10 shown in FIG. 11 are different from those shown in FIG. 7 in that hydrogen supply films 221 and 223 are provided instead of the hydrogen supply film 136 and that a hydrogen diffusion prevention film 222 is additionally provided. In FIG. 11, the hydrogen supply films 221 and 223 are independently provided between the semiconductor substrates 52 and 53.

Specifically, the hydrogen supply film 221 for the semiconductor substrate 52 is arranged on the wiring-line layer 135 as an upper layer. In addition, the hydrogen supply film 223 for the semiconductor substrate 53 is arranged on the wiring-line layer 144 as an upper layer. Moreover, the hydrogen diffusion prevention film 222 is arranged between the hydrogen supply films 221 and 223.

Since the hydrogen supply films 221 and 223 are independently provided between the semiconductor substrates 52 and 53 in FIG. 11, a hydrogen supply amount to the semiconductor substrates 52 and 53 may be made different. Thus, hydrogen concentration at the interface between the transistor 130-2 and the transistors 140-1 and 140-2 may be made different.

Although not shown, the same processing steps as those shown in FIGS. 4A to 4F or FIGS. 5A to 5F are first performed on the semiconductor substrates 52 and 53 to manufacture the surrounding parts of the transistors 130-1, 130-2, 140-1, and 140-2 of the CMOS image sensor 10 shown in FIG. 11. Next, for example, the hydrogen diffusion prevention film 222 is formed over the semiconductor substrate 52. Finally, the semiconductor substrates 52 and 53 are joined together so as to make the wiring-line layers 135 and 144 face each other via the hydrogen supply films 221 and 223 and the hydrogen diffusion prevention film 222. Thus, the processing steps are ended.

Note that the hydrogen supply film 222 may be arranged beneath the wiring-line layer 135 as a lower layer. In addition, the hydrogen supply film 223 may be arranged beneath the wiring-line layer 144 as a lower layer.

Eighth Configuration Example Around Active Elements of CMOS Image Sensor

Figure 12:
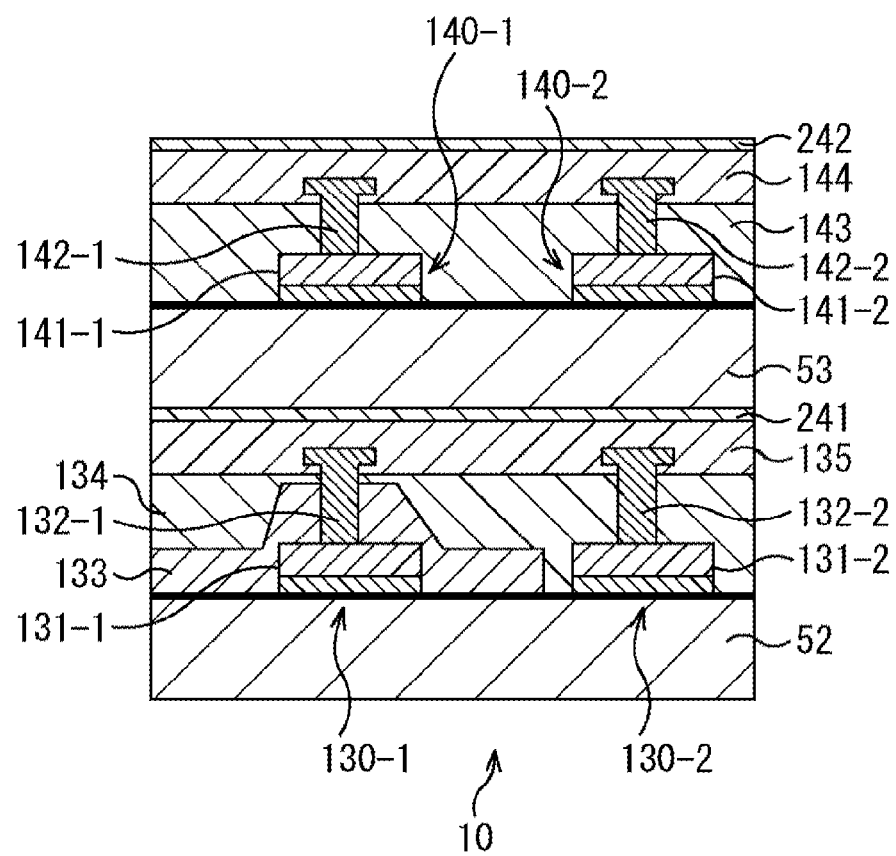
FIG. 12 is a cross-sectional diagram describing a sixth configuration example of the CMOS image sensor in a case in which the arrangement of the CMOS image sensor is the second arrangement shown in FIG. 2B.

FIG. 12 is a cross-sectional diagram describing a sixth configuration example around the active elements of the CMOS image sensor 10 in a case in which the arrangement of the CMOS image sensor 10 is the second arrangement shown in FIG. 2B.

In FIG. 12, the same configurations as those shown in FIG. 7 are denoted by the same symbols. In addition, duplicated descriptions will be omitted as occasion demands.

The configurations around the active elements of the CMOS image sensor 10 shown in FIG. 12 are different from those shown in FIG. 7 in that hydrogen supply films 241 and 242 are provided instead of the hydrogen supply film 136. In FIG. 12, the semiconductor substrates 52 and 53 are laminated together so as to make the direction of the wiring-line layer 135 toward the semiconductor substrate 52 coincident with the direction of the wiring-line layer 144 toward the semiconductor substrate 53.

Specifically, the hydrogen supply film 241 for the semiconductor substrate 52 is arranged on the wiring-line layer 135 as an upper layer. In addition, the hydrogen supply film 242 for the semiconductor substrate 53 is arranged on the wiring-line layer 144 as an upper layer. The semiconductor substrate 53 is laminated over the semiconductor substrate 52 so as to contact the hydrogen supply film 241 and is electrically connected to the semiconductor substrate 52.

Although not shown, the same processing steps as those shown in FIGS. 4A to 4F or FIGS. 5A to 5F are first performed on the semiconductor substrates 52 and 53 to manufacture the surrounding parts of the transistors 130-1, 130-2, 140-1, and 140-2 of the CMOS image sensor 10 shown in FIG. 12. Next and finally, the semiconductor substrates 52 and 53 are joined together so as to make the semiconductor substrate 53 contact the hydrogen supply film 241. Thus, the processing steps are ended.

Note that the hydrogen supply film 241 may be arranged beneath the wiring-line layer 135 as a lower layer. In addition, the hydrogen supply film 242 may be arranged beneath the wiring-line layer 144 as a lower layer.

Moreover, although not shown, the semiconductor substrates 52 and 53 may be laminated together in the same direction as that shown in FIG. 12 even in a case in which the configurations of the surrounding parts of the transistors 130-1, 130-2, 140-1, and 140-2 are those shown in FIG. 8.

Further, although not shown, the configurations of the surrounding parts of the active elements of the CMOS image sensor 10 in a case in which the arrangement of the CMOS image sensor 10 is the third arrangement shown in FIG. 2C are the same as those described referring to FIGS. 7 to 12.

As described above, the CMOS image sensor 10 has the hydrogen supply film 76 (121, 136, 161, 171, 221, 223, 241, 242) at the entire surface over the semiconductor substrate 51 (52, 53) and has the hydrogen diffusion prevention film 73 (133) at a part on the semiconductor substrate 51 (52, 53). Thus, hydrogen concentration at the front surface of the semiconductor substrate 51 (52, 53) may be controlled for each region. Accordingly, a region in which a dangling bond is terminated by concentrated hydrogen to secure the characteristics of noise such as 1/f noise and a region in which the supply of hydrogen is reduced to secure the service life of a transistor due to NBTI or the like may be provided on the same semiconductor substrate 51 (52, 53). That is, an interface level for each region may be made different on the same semiconductor substrate 51 (52, 53).

In addition, since a different hydrogen supply film is not desired for each region, an increase in the size of the CMOS image sensor 10 may be reduced. Moreover, since the supply of hydrogen to a region covered with the hydrogen diffusion prevention film 73 (133) is reduced, hydrogen concentration at a region not covered with the hydrogen diffusion prevention film 73 (133) may be increased.

Note that although the number of the layers of the semiconductor substrates of the CMOS image sensor 10 is one or two in the above descriptions, it may be two or more. In a case in which the number of the layers of the semiconductor substrates is three, the arrangement of the CMOS image sensor 10 is, for example, one shown in FIG. 13.

Figure 13:
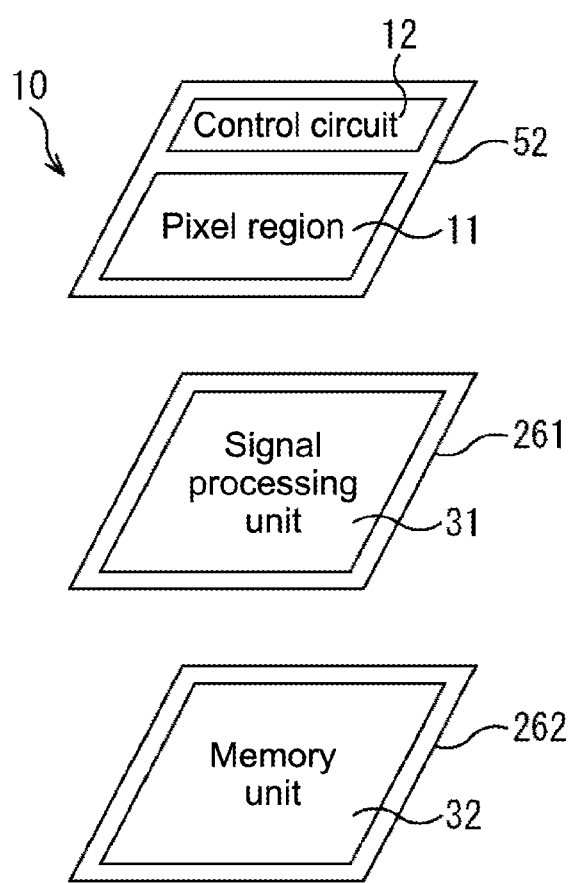
FIG. 13 is a diagram showing an arrangement example of the CMOS image sensor in a case in which the number of the layers of semiconductor substrates is three.

That is, as shown in FIG. 13, a semiconductor substrate 261 on which the signal processing unit 31 is arranged and a semiconductor substrate 262 on which the memory unit 32 is arranged are provided instead of the semiconductor substrate 53 on which the logic circuit 13 is arranged. The semiconductor substrate 261 is the same as the semiconductor substrate 53 except that it does not have the memory unit 32. On the semiconductor substrate 262, a hydrogen diffusion prevention film is formed with respect to prescribed active elements like the semiconductor substrates 52 and 53. In addition, a hydrogen supply film is formed on the hydrogen diffusion prevention film as an upper layer over the entire surface of the semiconductor substrate 262. The semiconductor substrates 261 and 262 are laminated together via the hydrogen supply film.

Further, the hydrogen supply film is formed at the front surface of the semiconductor substrate to supply hydrogen in the first embodiment. However, hydrogen may be directly supplied to the front surface of the semiconductor substrate without the hydrogen supply film.

2. Second Embodiment

Configuration Example of Second Embodiment of CMOS Image Sensor

Figure 14:
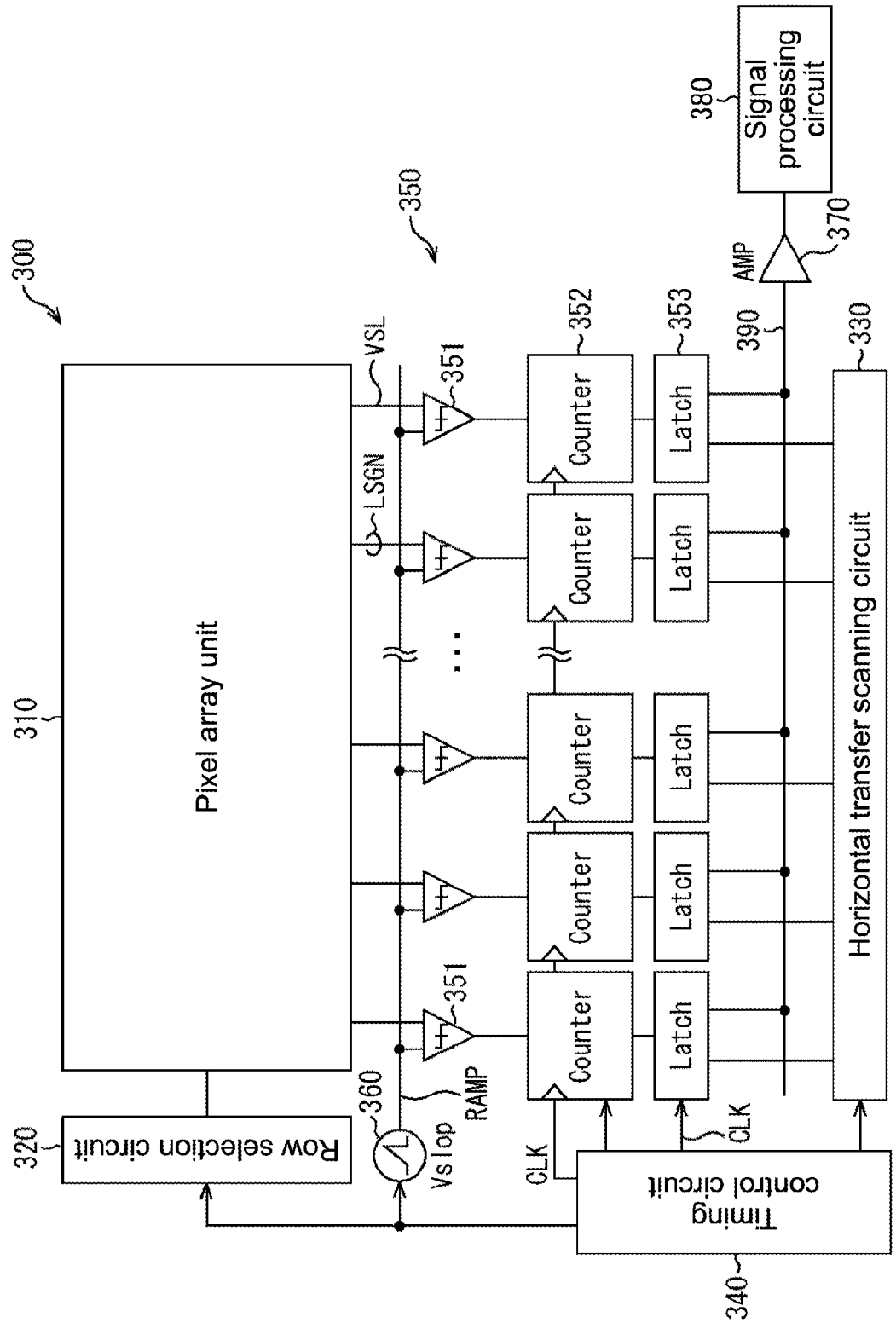
FIG. 14 is a diagram showing a configuration example of a second embodiment of a CMOS image sensor serving as a semiconductor device to which the present disclosure is applied.

FIG. 14 is a diagram showing a configuration example of a second embodiment of a CMOS image sensor serving as a semiconductor device to which the present disclosure is applied.

A CMOS image sensor 300 shown in FIG. 14 has a pixel array unit 310, a row selection circuit 320, a horizontal transfer scanning circuit 330, and a timing control circuit 340. In addition, the CMOS image sensor 300 has an ADC (Analog Digital Converter) group 350, a DAC (Digital Analog Converter) 360, an amplification circuit (S/A) 370, a signal processing circuit 380, and a horizontal transfer line 390.

The above circuits are formed on the semiconductor substrate (not shown) of the CMOS image sensor 300, and hydrogen is supplied to the front surface of the semiconductor substrate. Thus, a reduction in the noise of active elements constituting the CMOS image sensor 300 is achieved.

In the pixel array unit 310 of the CMOS image sensor 300, pixels each having a photoelectric conversion element (photodiode) and an in-pixel amplifier are arranged in a matrix pattern of M rows and N columns. Moreover, the following circuits are arranged as control circuits that sequentially read the signals of the pixel array unit 310 in the CMOS image sensor 300.

That is, the row selection circuit 320 that controls row addresses and row scanning, the horizontal transfer scanning circuit 330 that controls column addresses and column scanning, and the timing control circuit 340 that generates internal clocks as a control circuit are arranged in the CMOS image sensor 300.

In the ADC group 350, single-slope-type ADCs each having a comparator 351, a counter 352, and a latch 353 are arrayed in a plurality of columns. The ADC group 350 has the function of converting an n-bit digital signal, is arranged for each vertical signal line (column line), and constitutes a column parallel ADC block.

Specifically, the comparator 351 compares a reference voltage Vslop, i.e., a ramp waveform (RAMP) obtained by changing a reference voltage generated by the DAC 360 in phases with an analog signal obtained from a pixel for each row via a vertical signal line LSGN. The counter 352 counts up the comparison time of the comparator 351. Each latch 353 is connected to the 2n amplification circuits 370 via the horizontal transfer line 390 having, for example, a 2n-bit width.

In the ADC group 350, the analog signal (potential VSL) read by the vertical signal line LSGN is compared with the reference voltage Vslop (slope waveform with a certain inclination that linearly changes) by the comparator 351 arranged for each column. At this time, the counter 352 arranged for each column like the comparator 351 operates. When the certain potential Vslop of the ramp waveform RAMP changes with one-to-one correspondence with a counter value, the potential (analog signal) VSL of the vertical signal line is converted into a digital signal. The reference voltage Vslop is changed in such a way that a change in voltage is converted into a change in time and the time is counted up with a certain (cycle) clock to be converted into a digital value. Then, when the analog electric signal VSL intersects the reference voltage Vslop, the output of the comparator 351 is inverted to stop the input clock of the counter 352. Thus, the AD conversion is completed.

After the completion of the above AD conversion, the horizontal transfer scanning circuit 330 inputs data retained by the latch 353 to the signal processing circuit 380 via the horizontal transfer line 390 and the amplification circuit 370 to generate a two-dimensional image.

Configuration Example of Pixel

Figure 15:
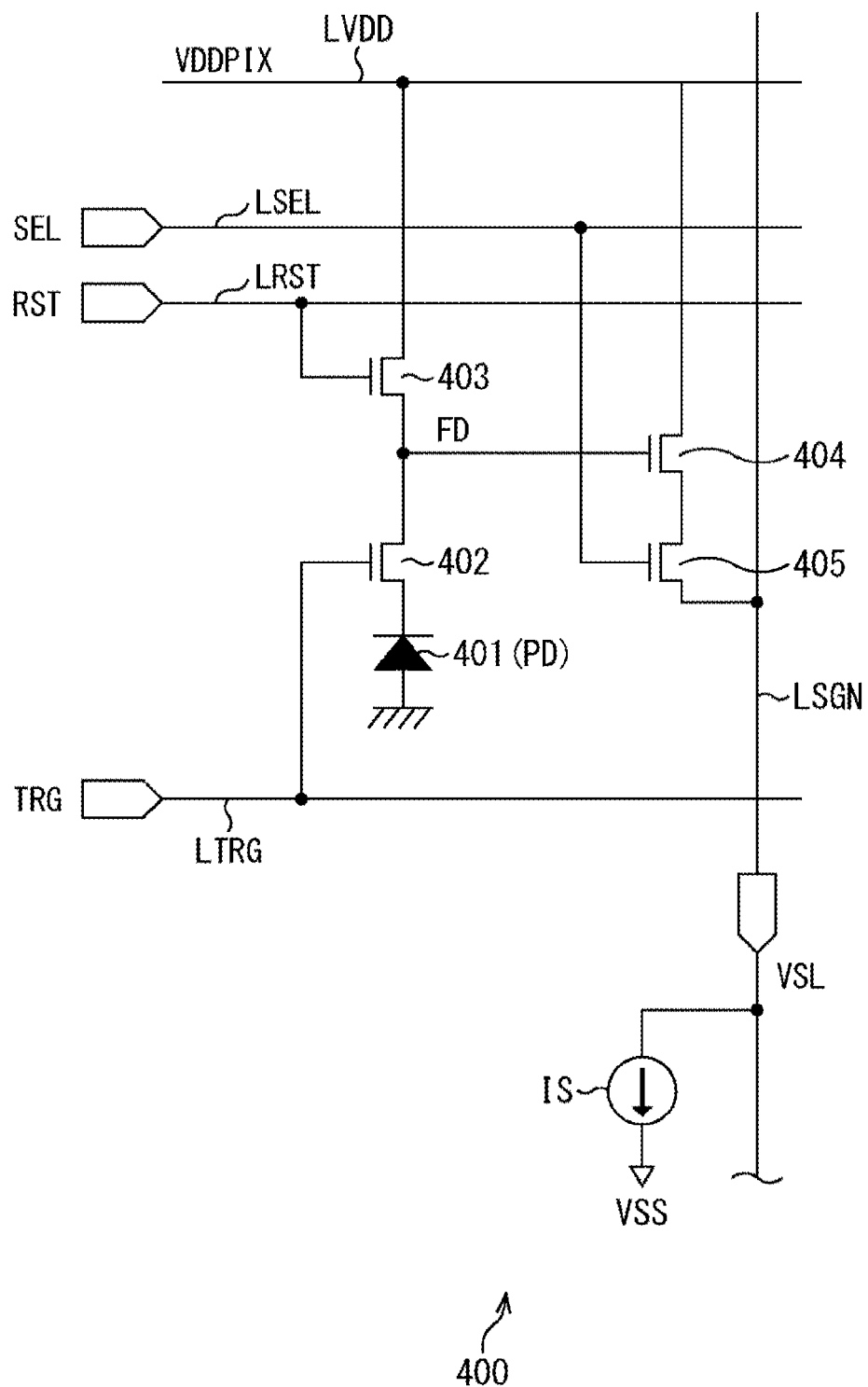
FIG. 15 is a diagram showing a configuration example of a pixel constituting a pixel array unit shown in FIG. 14.

FIG. 15 is a diagram showing a configuration example of a pixel constituting the pixel array unit 310 shown in FIG. 14.

A pixel 400 shown in FIG. 15 has a photodiode 401, a transfer transistor 402 made of a MOSFET (Metal-Oxide-Semiconductor Field-Effect Transistor), a reset transistor 403, an amplification transistor 404, and a selection transistor 405.

The photodiode 401 photoelectrically-converts incident light into a charge (here, electron) in an amount corresponding to the light amount. The transfer transistor 402 serving as a transfer element is connected between the photodiode 401 and a floating diffusion FD serving as an input node, and a transfer signal TRG serving as a control signal is supplied to the gate (transfer gate) of the transfer transistor 402 via a transfer control line LTRG. Thus, the transfer transistor 402 transfers an electron photoelectrically-converted by the photodiode 401 to the floating diffusion FD.

The reset transistor 403 is connected between a power supply line LVDD to which a power supply voltage VDD is supplied and the floating diffusion FD, and a reset signal RST serving as a control signal is supplied to the gate of the reset transistor 403 via a reset control line LRST. Thus, the reset transistor 403 serving as a reset element resets the potential of the floating diffusion FD to the potential of the power supply line LVDD.

The gate of the amplification transistor 404 serving as an amplification element is connected to the floating diffusion FD. That is, the floating diffusion FD functions as the input node of the amplification transistor 404 serving as an amplification element. The amplification transistor 404 and the selection transistor 405 are connected in series between the power supply line LVDD to which the power supply voltage VDD is supplied and a signal line LSGN. As described above, the amplification transistor 404 is connected to the signal line LSGN via the selection transistor 405 and constitutes a source follower with a constant current source IS outside the pixel 400. When a selection signal SEL serving as a control signal corresponding to an address signal via a selection control line LSEL is supplied to the gate of the selection transistor 405, the selection transistor 405 is turned ON.

When the selection transistor 405 is turned ON, the amplification transistor 404 amplifies the potential of the floating diffusion FD and outputs a voltage corresponding to the potential to the signal line LSGN. The voltage output from each pixel via the signal line LSGN is output to the comparator 351.

Here, the reset control line LRST, the transfer control line LTRG, and the selection control line LSEL wired in the pixel 400 are wired as a set on a row-by-row basis in a pixel arrangement. That is, the respective control lines LRST, LTRG, and LSEL are provided M. The reset control lines LRST, the transfer control lines LTRG, and the selection control lines LSEL are driven by the row selection circuit 320 on a row-by-row basis. Accordingly, the output operation of the voltage from the pixel 400 is simultaneously performed for each pixel of one row.

A MOSFET such as the transfer transistor 402 of the pixel 400 configured as described above and other MOSFETs used in the analog circuits of the CMOS image sensor 300 are high-voltage-driven IO system transistors each having a thick gate insulation film. On the other hand, MOSFETs used in high-speed and low-consumption power circuits such as the row selection circuit 320, the horizontal transfer scanning circuit 330, and the signal processing circuit 380 are low-voltage-driven core transistors each having a thin gate insulation film.

Generally, the MOSFETs are lower in HCT (Hot Carrier Injection) and NBTI resistance and have a shorter service life if their gate insulation films are thinner. Accordingly, in a case in which the service lives of the MOSFETs used in high-speed and low-consumption power circuits such as the row selection circuit 320, the horizontal transfer scanning circuit 330, and the signal processing circuit 380 are not allowable by the supply of hydrogen, it is desirable to reduce the supply of the hydrogen to the MOSFETs and secure element reliability with priority.

Examples of Region in which Hydrogen is Supplied to Active Elements and Region in which Supply of Hydrogen to Active Elements is Reduced FIGS. 16 to 19 are diagrams showing examples of a region (hereinafter referred to as a hydrogen supply region) in which hydrogen is supplied to the active elements and a region (hereinafter referred to as a hydrogen reduction region) in which the supply of hydrogen to the active elements is reduced in the CMOS image sensor 300 shown in FIG. 14.

The hydrogen reduction region has circuits that desirably secure element reliability with priority from an operational viewpoint, and the hydrogen supply region is a region other than the hydrogen reduction region.

Figure 16:
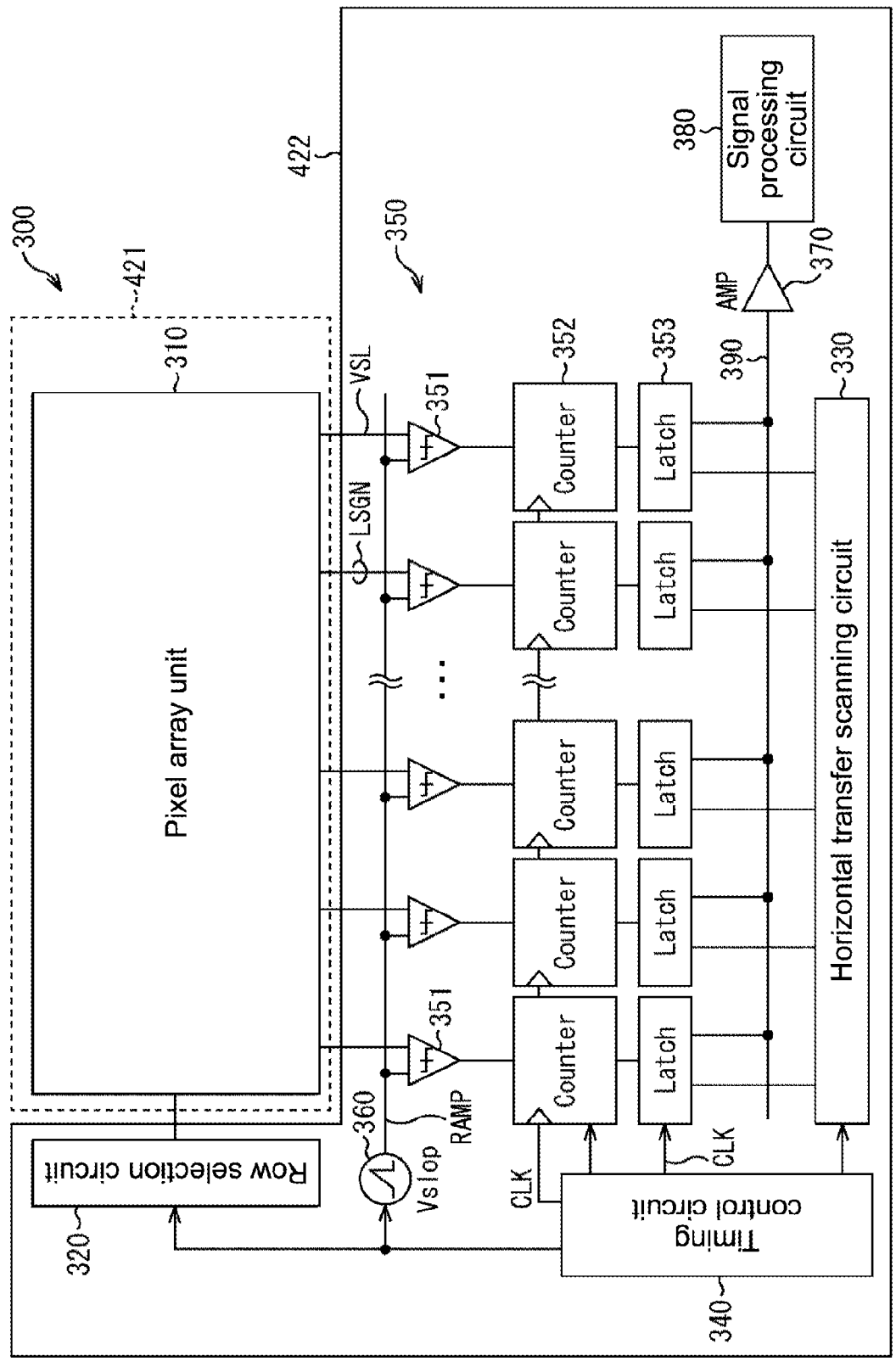
FIG. 16 is a diagram showing an example of the hydrogen supply region and the hydrogen reduction region of the CMOS image sensor shown in FIG. 14.

In the example shown in FIG. 16, a hydrogen supply region 421 has the pixel array unit 310, and the hydrogen reduction region 422 has peripheral circuits, i.e., circuits other than the pixel array unit 310. That is, since the service lives of the MOSFETs used in high-speed and low-consumption power circuits such as the row selection circuit 320, the horizontal transfer scanning circuit 330, and the signal processing circuit 380 are not allowable by the supply of hydrogen, the peripheral circuits including these circuits are included in the hydrogen reduction region 422 in the example shown in FIG. 16.

Figure 17:
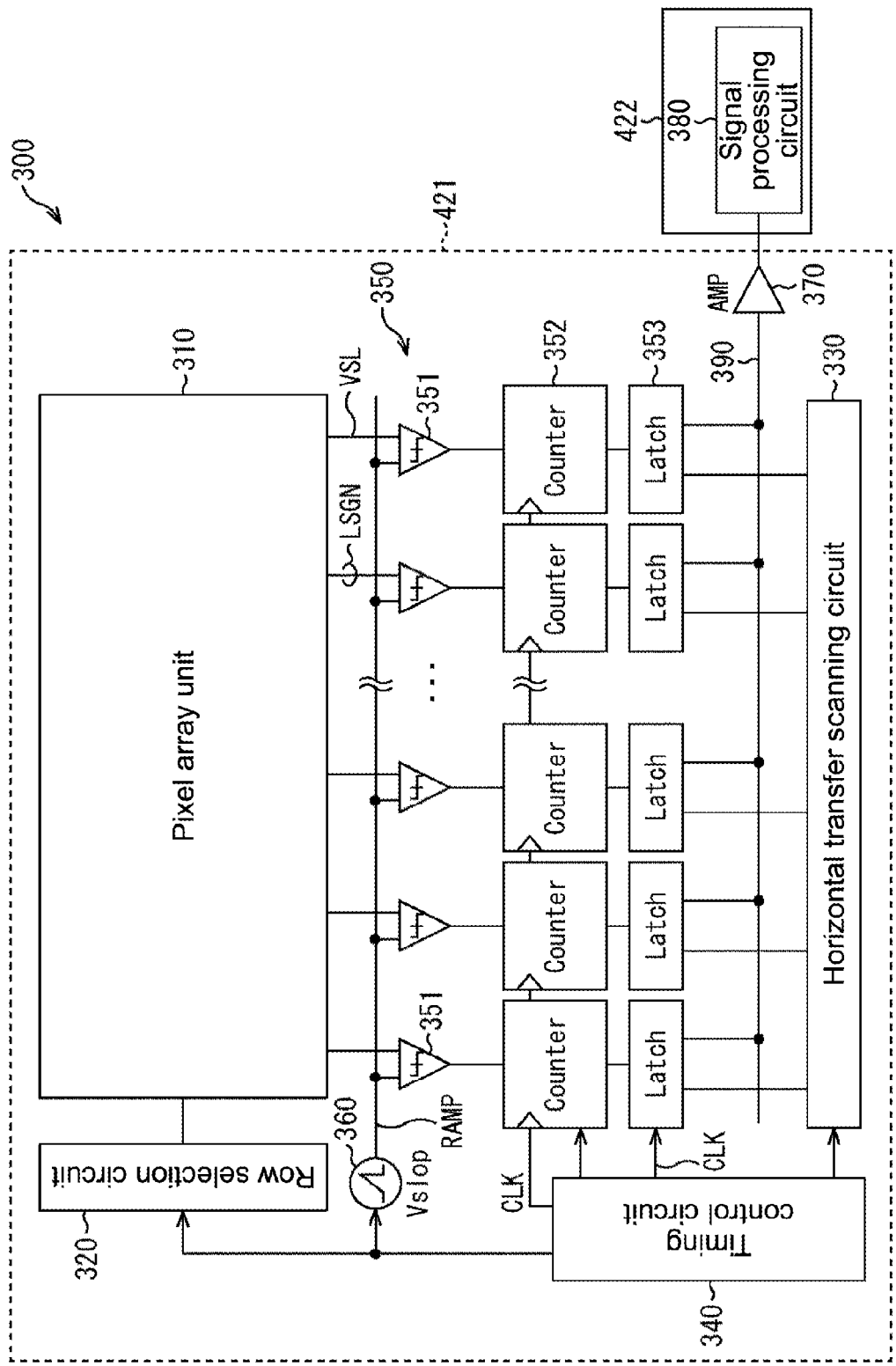
FIG. 17 is a diagram showing an example of the hydrogen supply region and the hydrogen reduction region of the CMOS image sensor shown in FIG. 14.

In the example shown in FIG. 17, the hydrogen supply region 421 has the pixel array unit 310 and parts other than the signal processing circuit 380 serving as a peripheral circuit, and the hydrogen reduction region 422 has the signal processing circuit 380. That is, since only the service life of the MOSFET used in the signal processing circuit 380 is not allowable by the supply of hydrogen in the example shown in FIG. 17, the signal processing circuit 380 is included in the hydrogen reduction region 422.

Figure 18:
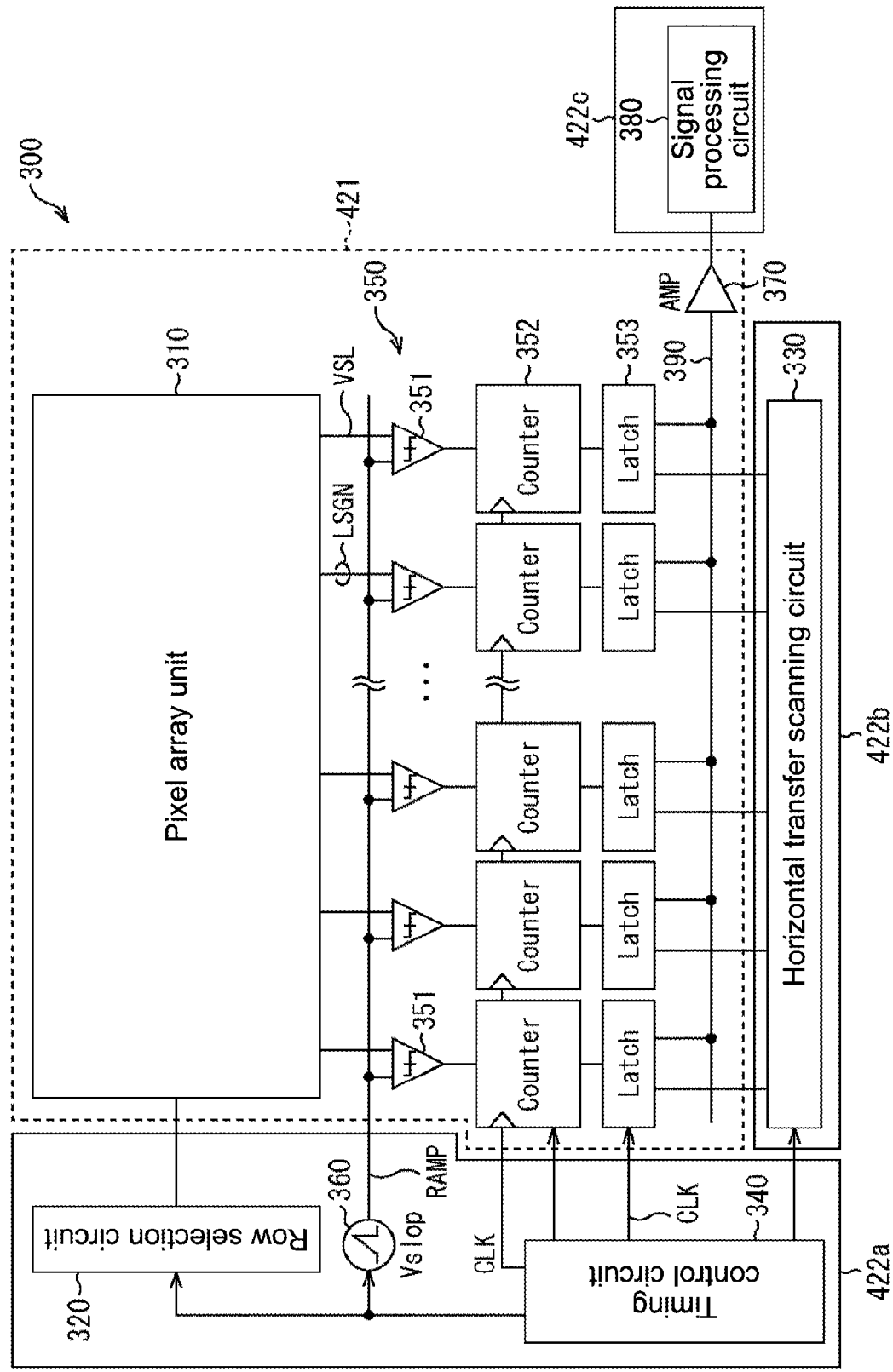
FIG. 18 is a diagram showing an example of the hydrogen supply region and the hydrogen reduction region of the CMOS image sensor shown in FIG. 14.

In the example shown in FIG. 18, the hydrogen supply region 421 has the pixel array unit 310, the ADC group 350, the amplification circuit 370, and the horizontal transfer line 390. Of the hydrogen reduction region 422, a hydrogen reduction region 422a has the row selection circuit 320, the timing control circuit 340, and the DAC 360, a hydrogen reduction region 422b has the horizontal transfer scanning circuit 330, and a hydrogen reduction region 422c has a signal processing circuit 380.

That is, since the service lives of the MOSFETs used in high-speed and low-consumption power circuits such as the row selection circuit 320, the horizontal transfer scanning circuit 330, and the signal processing circuit 380 are not allowable by the supply of hydrogen in the example shown in FIG. 18, these circuits are included in the hydrogen reduction region 422.

Figure 19:
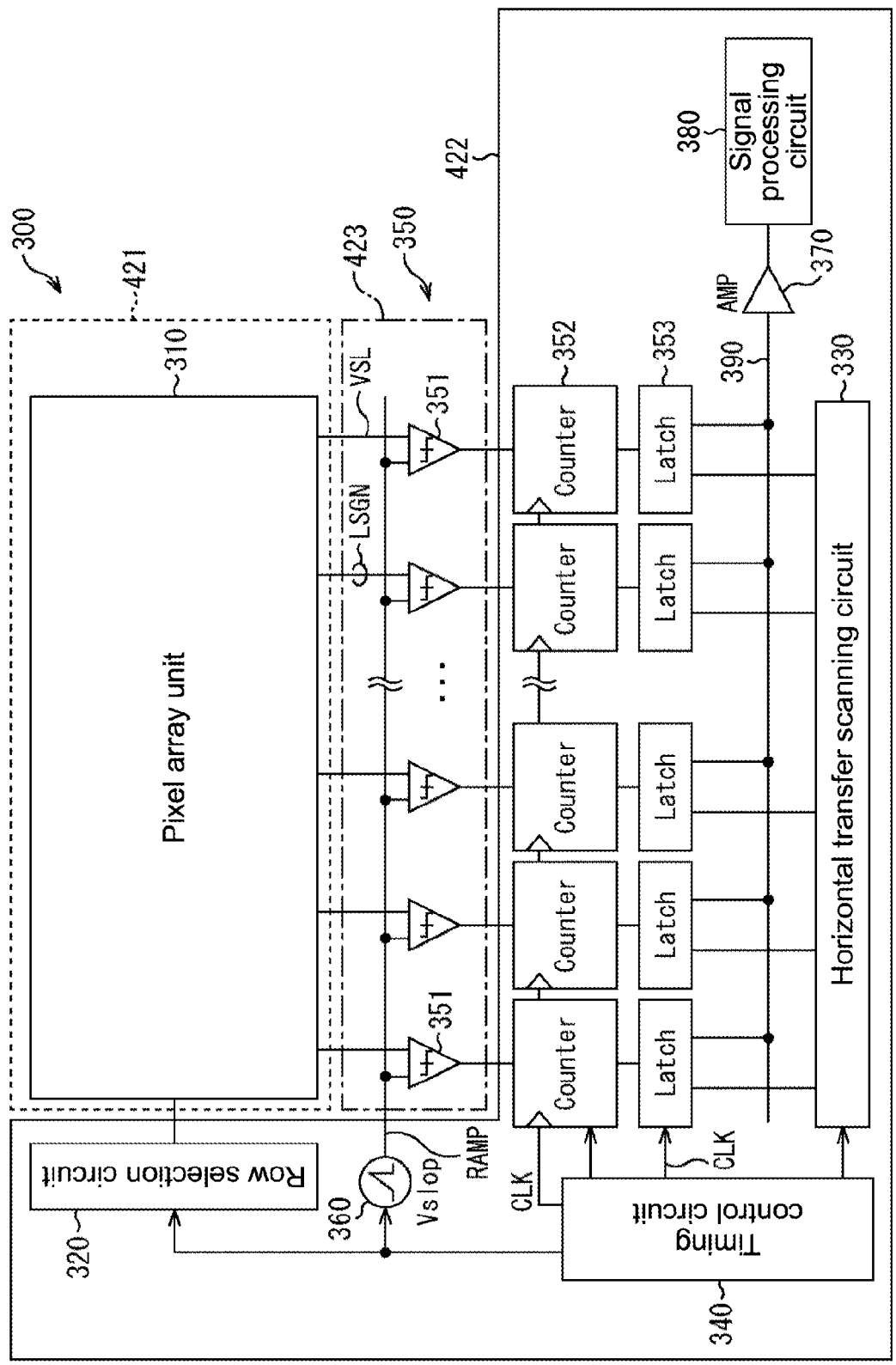
FIG. 19 is a diagram showing an example of the hydrogen supply region and the hydrogen reduction region of the CMOS image sensor shown in FIG. 14.

In the example shown in FIG. 19, the hydrogen supply region 421 has the pixel array unit 310 and some of the comparators 351, and the hydrogen reduction region 422 has the other comparators 351 and circuits other than the comparators 351 serving as peripheral circuits. That is, the comparators 351 exist in a mixed region 423 in which the hydrogen supply region 421 and the hydrogen reduction region 422 are mixed together.

Figure 20:
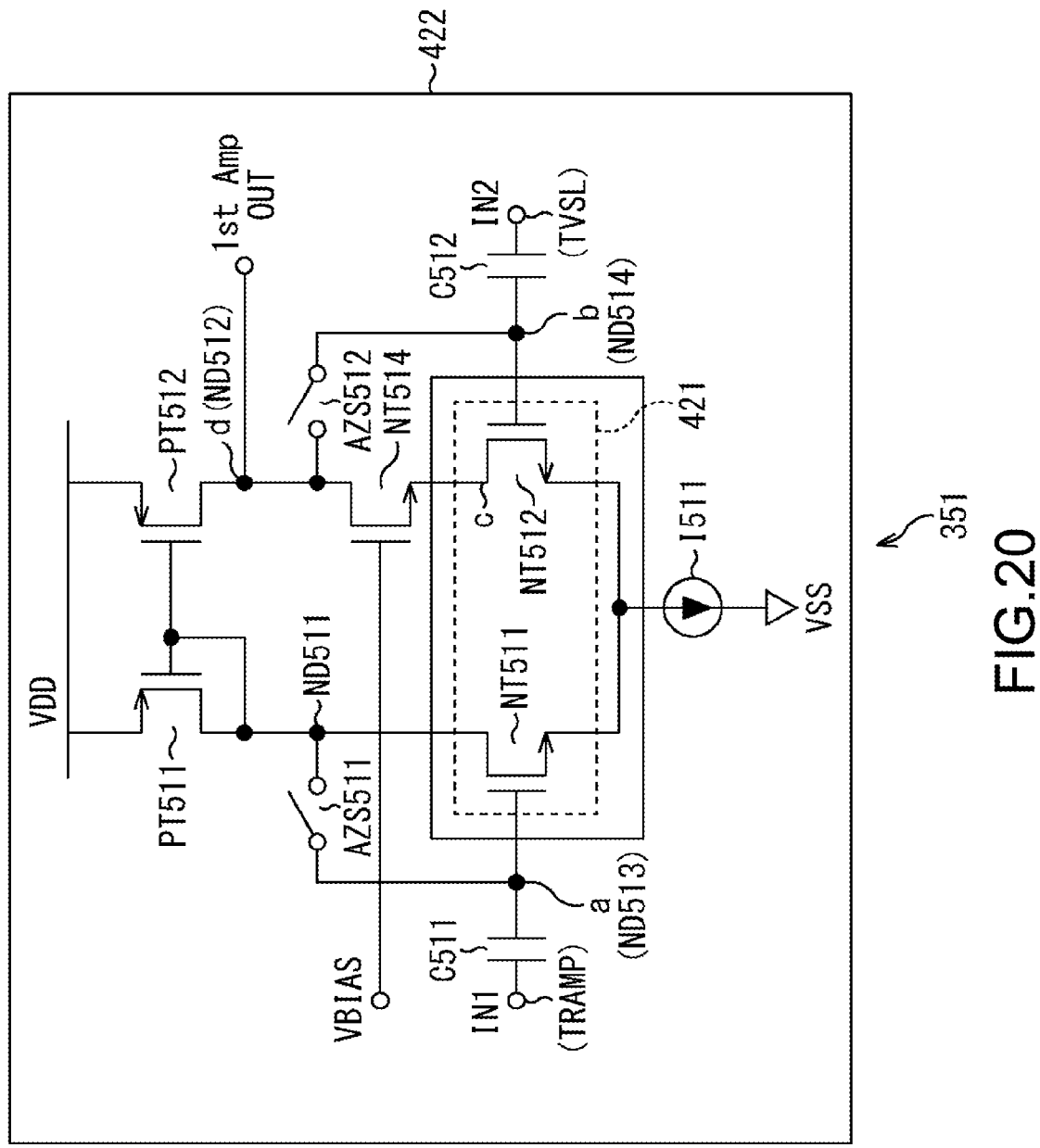
FIG. 20 is a diagram showing a configuration example of a comparator.

Here, each of the comparators 351 is configured as shown in FIG. 20. That is, the comparator 351 shown in FIG. 20 has p-channel MOS (PMOS) transistors PT511 and PT512 and n-channel MOS (NMOS) transistors NT511 and NT512 as MOSFETs, and an NMOS transistor NT514 that functions as an isolator. In addition, the comparator 351 has first and second capacitors C511 and C512, auto-zero switches (initialization switches) AZS511 and AZS512, and a current source I511.

The sources of PMOS transistors PT511 and PT512 are connected to a power supply potential source VDD. The drain of the PMOS transistor PT511 is connected to the drain of the NMOS transistor NT511, and the connection point between the drain of the PMOS transistor PT511 and the drain of the NMOS transistor NT511 forms a node ND511. In addition, the drain and the gate of the PMOS transistor PT511 are connected to each other, and the connection point between the drain and the gate of the PMOS transistor PT511 is connected to the gate of the PMOS transistor PT512.

The drain of the PMOS transistor PT512 is connected to the drain of the NMOS transistor NT512, and the connection point between the drain of the PMOS transistor PT512 and the drain of the NMOS transistor NT512 forms an output node ND512. The sources of the NMOS transistors NT511 and NT512 are connected to each other, and the connection point between the sources of the NMOS transistors NT511 and NT512 is connected to the current source I511.

The gate of the NMOS transistor NT511 is connected to a first electrode of the capacitor C511, and the connection point between the gate of the NMOS transistor NT511 and the first electrode of the capacitor C511 forms a node ND513. In addition, a second electrode of the capacitor C511 is connected to an input terminal TRAMP for a ramp signal RAMP. The gate of the NMOS transistor NT512 is connected to a first electrode of the capacitor C512, and the connection point between the gate of the NMOS transistor NT512 and the first electrode of the capacitor C512 forms a node ND514. In addition, a second electrode of the capacitor C512 is connected to an input terminal TVSL for an analog signal VSL.

The source of the auto-zero switch AZS511 is connected to the node ND511, and the drain thereof is connected to the node ND513. The source of the auto-zero switch AZS512 is connected to the node ND512, and the drain thereof is connected to the ND514.

The drain of the NMOS transistor NT514 is connected to an output node ND512(d) of the comparator 351 and a drain (node c) of the NMOS transistor NT512. In addition, the gate of the NMOS transistor NT514 is connected to a supply line for a bias voltage VBIAS. Thus, a constant current may be supplied via the NMOS transistor NT514. As a result, even if parasitic capacitance exists between the gate (input node b)

and the drain (output node c) of the NMOS transistor NT512, voltage fluctuations are reduced and low-frequency noise are reduced.

In the comparator 351 configured as described above, the PMOS transistors PT511 and PT512 constitute a current mirror circuit. In addition, the NMOS transistors NT511 and NT512 constitute a differential comparison unit (transconductor amplifier (Gm amplifier)). Moreover, the capacitors C511 and C512 function as AZ-level sampling capacitance (input capacitance). Further, an output signal 1st amp of the comparator 351 is output to the counter 352 from the output node ND512.

In the comparator 351 configured as described above with reference to the example shown in FIG. 19, the NMOS transistors NT511 and NT512 are included in the hydrogen supply region 421 as shown in FIG. 20. In addition, circuits other than the NMOS transistors NT511 and NT512 are included in the hydrogen reduction region 422.

Figure 21:
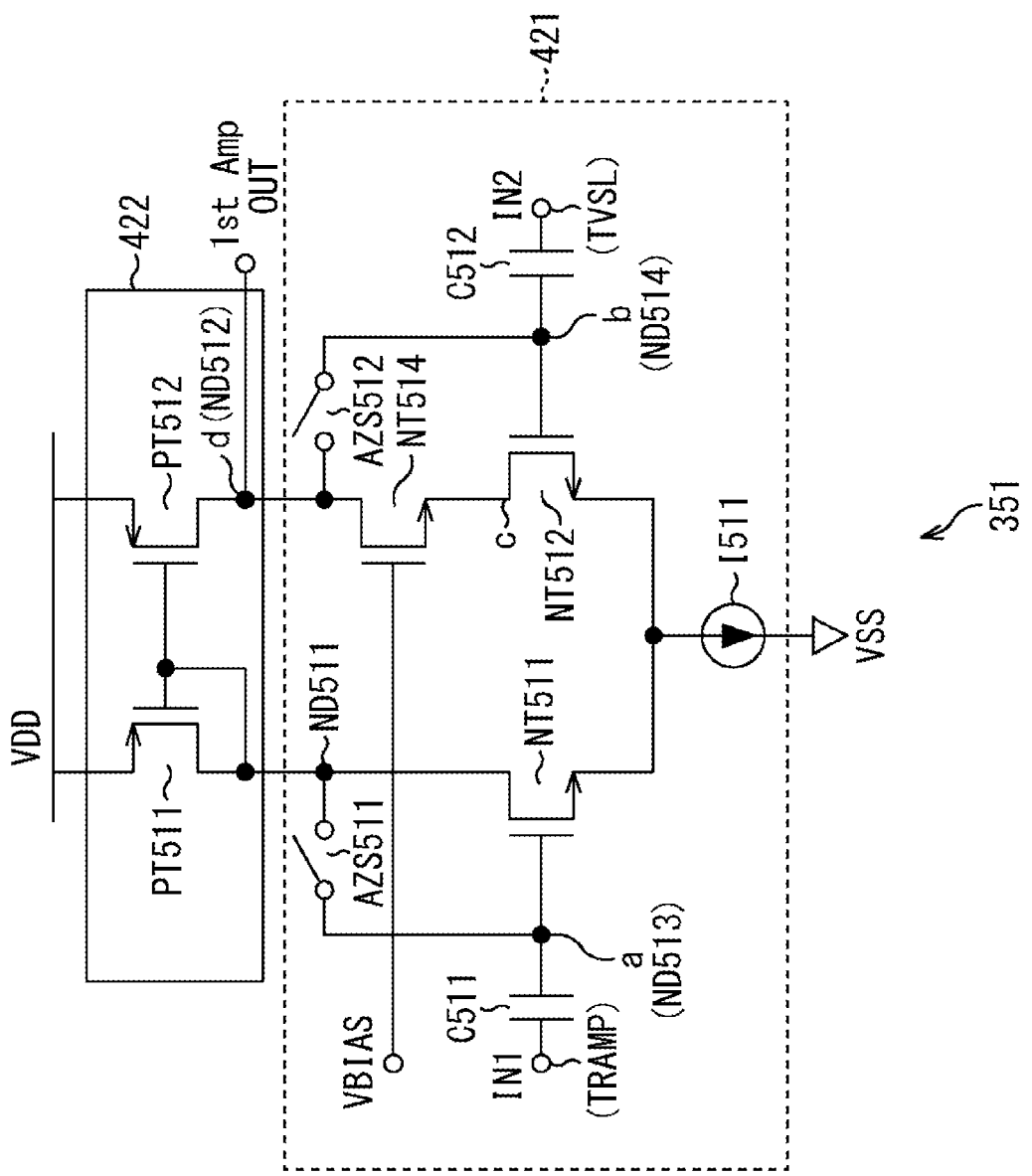
FIG. 21 is a diagram showing an example of the hydrogen supply region and the hydrogen reduction region of the CMOS image sensor shown in FIG. 14.

Note that as shown in FIG. 21, circuits other than the PMOS transistors PT511 and PT512 may be included in the hydrogen supply region 421 and the PMOS transistors PT511 and PT512 may be included in the hydrogen reduction region 422. In addition, a method of setting the hydrogen supply region and the hydrogen reduction region is not limited to the examples shown in FIGS. 16 to 21.

Structure Example of Hydrogen Supply Region and Hydrogen Reduction Region

Figure 22:
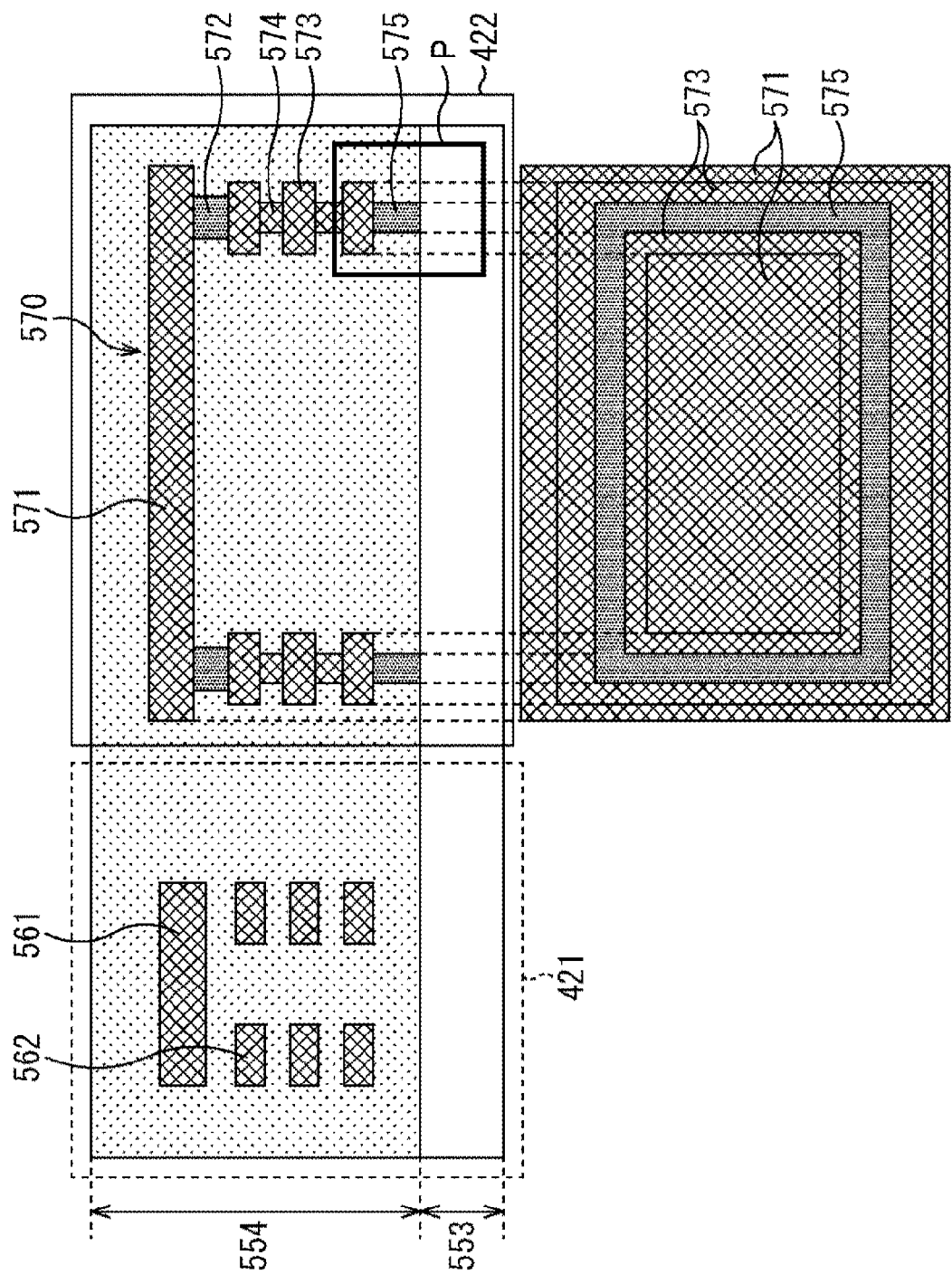
FIG. 22 shows a cross-sectional diagram and a lower-surface diagram of a structure example of the hydrogen supply region and the hydrogen reduction region.
Figure 23:
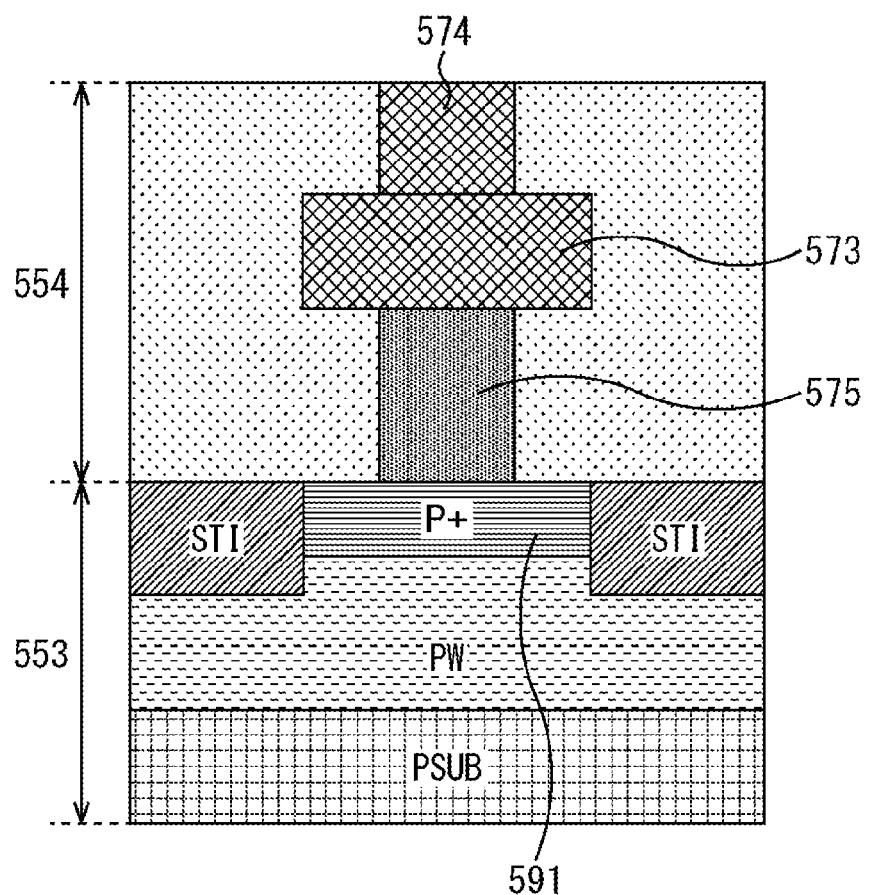
FIG. 23 is a partially-enlarged diagram of the cross-sectional diagram shown in FIG. 22.
Figure 24:
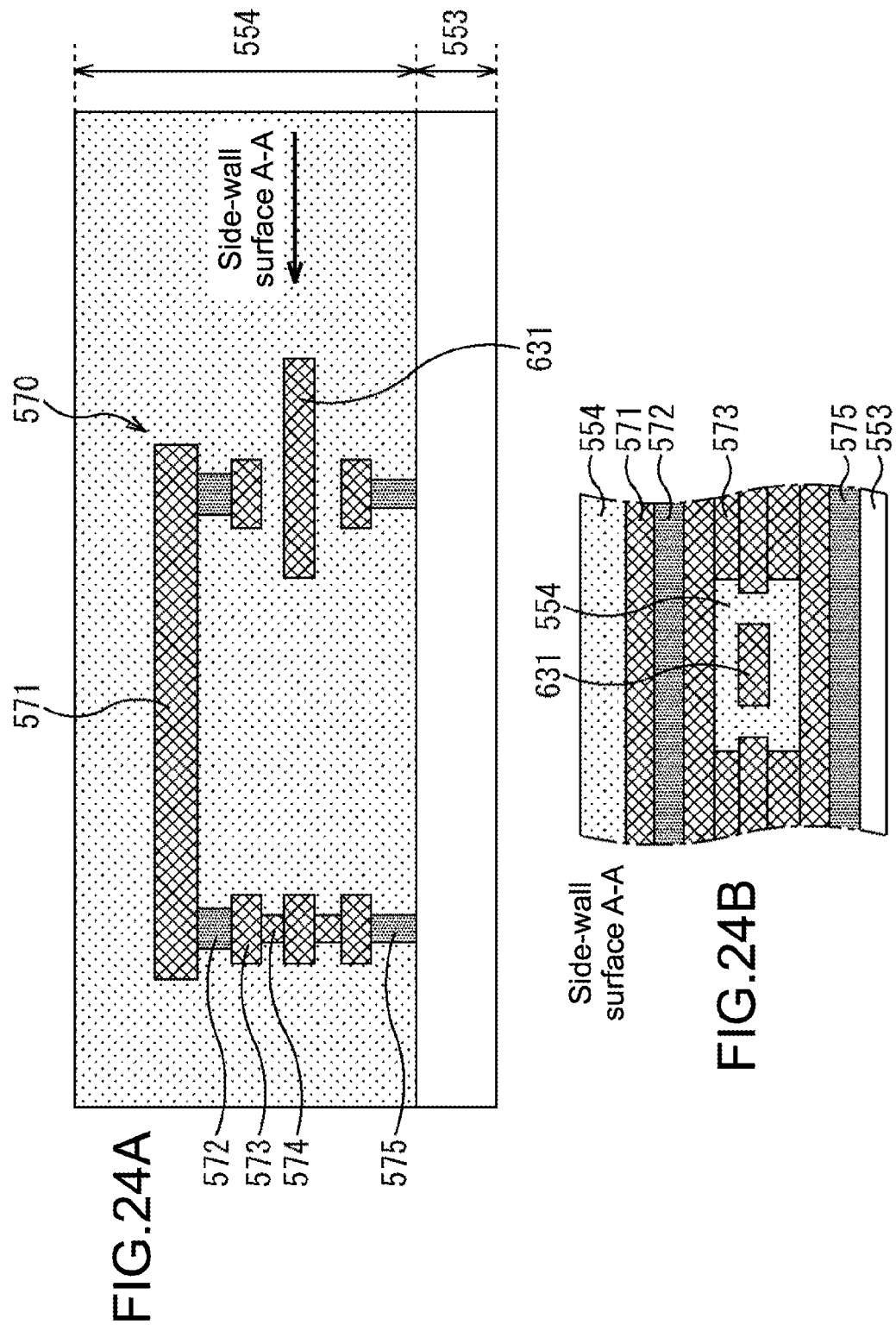
FIGS. 24A and 24B are another cross-sectional diagram and a side-wall-surface diagram of the hydrogen reduction region, respectively.

FIG. 22 shows a cross-sectional diagram and a lower-surface diagram of a structure example of the hydrogen supply region 421 and the hydrogen reduction region 422, respectively, and FIG. 23 is a partially-enlarged diagram of the cross-sectional diagram shown in FIG. 22. In addition, FIGS. 24A and 24B are a cross-sectional diagram different from the cross-sectional diagram shown in FIG. 22 and a side-wall-surface diagram, respectively.

Note that for the same semiconductor devices as those of general CMOS image sensors such as element separation layers like STI (Shallow Trench Isolation), n-channel regions, p-channel regions, MOSFETs, bipolar transistors, and resistive elements in the hydrogen supply region 421 and the hydrogen reduction region 422, their diagrammatic representations and descriptions will be omitted.

The upper part of FIG. 22 is the cross-sectional diagram showing the structure example of the hydrogen supply region 421 and the hydrogen reduction region 422, and the lower part thereof is the lower-surface diagram when seen upward from the front surface of a semiconductor substrate 553 in the hydrogen reduction region 422.

As shown in FIG. 22, single-layer top metal 561 and three-layer wiring lines 562 are arranged in this order from above over the semiconductor substrate 553 in the hydrogen supply region 421. The peripheries of the top metal 561 and the wiring lines 562 are covered with an interlayer insulation film 554.

While, on the semiconductor substrate 553 in the hydrogen reduction region 422, a hydrogen adsorption layer 570 is provided so as to cover the semiconductor substrate 553. The hydrogen adsorption layer 570 has top metal 571, a top via 572, wiring lines 573, vias 574, and a contact 575.

Specifically, the single-layer top metal 571 is arranged at the uppermost part of the hydrogen adsorption layer 570, and the three-layer wiring lines 573 are arranged under the top metal 571. The wiring lines 573 have a lattice-shaped closed shell structure and are connected to each other by the vias 574. However, some of the wiring lines 573 are not connected to the other wiring lines 573 by the vias 574 as shown in FIGS. 24A and 24B but are connected to a driving power supply, circuits, or the like outside the hydrogen reduction region 422. Note that FIG. 24B is a diagram of the side-wall surface when seen from the right side of FIG. 24A.

The top metal 571 is connected to the wiring lines 573 so as to cover the ceilings of the wiring lines 573. The wiring lines 573 at the lowermost part are connected to the semiconductor substrate 553 via the stretch-shaped contact 575 surrounding the periphery of the hydrogen reduction region 422. Specifically, FIG. 23 represents a rectangle P shown in FIG. 22, and the contact 575 is connected to a p-channel region 591 of the semiconductor substrate 553.

That is, if the hydrogen adsorption layer 570 is in a state of floating, active elements formed inside the hydrogen adsorption layer 570 are likely to malfunction due to the floating capacitance of the hydrogen adsorption layer 570. Accordingly, in the CMOS image sensor 300, the wiring lines 573 at the lowermost part are connected to the semiconductor substrate 553 to fix the potential of the hydrogen adsorption layer 570 to the potential of the semiconductor substrate 553. FIG. 23 shows an example of a case in which the potential of the hydrogen adsorption layer 570 is fixed to the potential of the PSUB of the semiconductor substrate 553. However, the potential of the hydrogen adsorption layer 570 may be fixed to the potential of the NWL of the semiconductor substrate 553 in such a way that the NWL having fixed potential is provided instead of the PW and that an n+ diffusion layer is provided instead of the p-channel region 591.

The metal film of the hydrogen adsorption layer 570 contains a hydrogen storage alloy that stores hydrogen. The hydrogen storage alloys of the top metal 571 and the contact 575 have, for example, a TiN/W laminated metal structure, the hydrogen storage alloy of the top via 572 has a TiN/AL laminated metal structure, and the hydrogen storage alloys of the wiring lines 573 and the vias 574 have a TiN/Cu laminated metal structure.

As hydrogen storage alloys, alloys containing nickel, manganese, vanadium, magnesium, palladium, calcium, and rare-earth compounds besides titanium-based alloys may be used. TiN is a semiconductor material generally used as barrier metal for plugs, vias, metal wiring lines. Therefore, in a case in which TiN is employed as a hydrogen storage alloy, a reduction in the manufacturing cost of the CMOS image sensor 300 may be achieved.

As described above, the metal film of the hydrogen adsorption layer 570 contains a hydrogen storage alloy. Therefore, the hydrogen adsorption layer 570 (hydrogen diffusion prevention unit) is allowed to prevent hydrogen from being diffused to the front surface of the semiconductor substrate 553 in the hydrogen reduction region 422 at the manufacturing of the CMOS image sensor 300.

Note here that although the entire metal film of the hydrogen adsorption layer 570 contains a hydrogen storage alloy, some of the metal film of the top metal 571 or the like may contain the hydrogen storage alloy.

Next, a description will be given of the supply of hydrogen in manufacturing steps for the CMOS image sensor 300. For example, hydrogen is supplied after a semiconductor device is formed on the semiconductor substrate 553 and then the top metal 561, the wiring lines 573, the hydrogen adsorption layer 570, and the interlayer insulation film 554 are formed. As a hydrogen supply method, sinter-annealing is performed at 350 to 400° C. for about 30 minutes to two hours in an airflow containing hydrogen and nitrogen. According to this method, hydrogen satisfying annealing conditions is supplied.

Thus, hydrogen is supplied to the front surface of the semiconductor substrate 553 in the hydrogen supply region 421. As a result, the noise of active elements such as MOSFETs is reduced by hydrogen.

That is, the occurrence mechanism of flicker noise or random telegraph noise in the MOSFETs is attributable to a phenomenon in which carriers passing through a channel front surface right beneath a gate insulation film are repeatedly taken and released to cause fluctuations in the threshold voltages of the MOSFETs with time at a trap level (dangling bond) existing in the vicinity of the front surface of a semiconductor substrate inside a gate oxide film constituting the MOSFETs when the MOSFEETs are in operation.

On the other hand, when hydrogen is supplied to the MOSFETs, it is terminated and inactivated at the trap level, which results in a reduction in the density of the trap level inside the gate oxide film serving as a source for taking carriers. Accordingly, when hydrogen is supplied to the front surface of the semiconductor substrate 553 in the hydrogen supply region 421, the flicker noise or the random telegraph noise of the MOSFETs reduces.

On the contrary, as a method of reducing the flicker noise or the random telegraph noise of the MOSFETs, the gate areas of the MOSFETs are increased in consideration of the fact that the fluctuation size of a threshold voltage when carriers are taken by a trap inside a gate oxide film is inversely proportional to the gate areas of the MOSFETs. However, in a case in which a CMOS image sensor has several mega pixels or the like, the size of a chip area goes beyond an allowable level due to an increase in the gate areas of the MOSFETs.

On the other hand, since the front surface of the semiconductor substrate 553 is covered with the hydrogen adsorption layer 570 in the hydrogen reduction region 422, the supply of hydrogen to the front surface of the semiconductor substrate 553 is reduced. Accordingly, in the hydrogen reduction region 422, it is possible to prevent degradation in the HCT and the NBTI resistance of active elements such as the MOSFETs due to excessive hydrogen and increase the operational service life of the CMOS image sensor 300.

Examples of Other Shapes of Contacts

Figure 25:
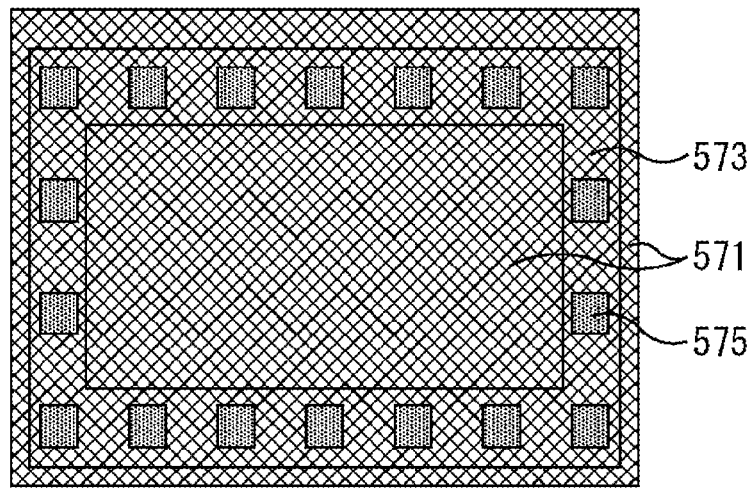
FIG. 25 is a diagram showing an example of another shape of contacts.
Figure 26:
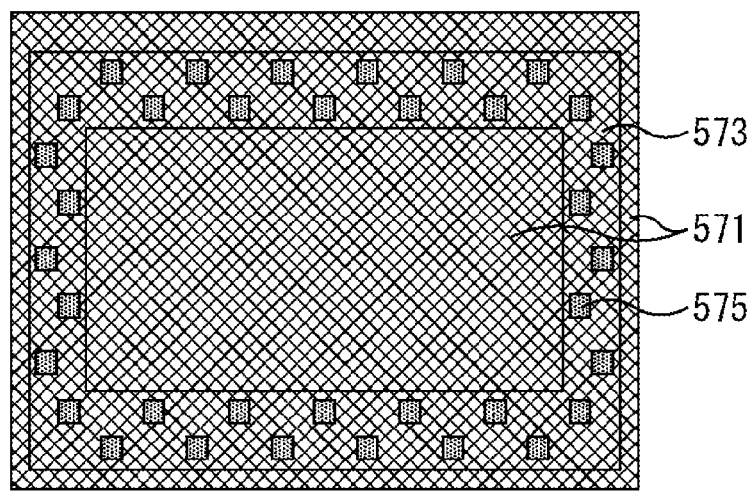
FIG. 26 is a diagram showing an example of another shape of the contacts.

FIGS. 25 and 26 are diagrams showing examples of other shapes of the contacts 575.

Note that FIGS. 25 and 26 are lower-surface diagrams of the interlayer insulation film 554 when seen from the front surface of the semiconductor substrate 553 in the hydrogen reduction region 422.

The contacts 575 shown in FIGS. 25 and 26 have a contact shape. In this case, the contacts 575 may be arranged in a line along each side of the rectangle top metal 571 as shown in FIG. 25 or may be arranged in two lines as shown in FIG. 26. In a case in which the contacts 575 have a contact shape, the contacts 575 are desirably arranged in two or more lines rather than being arranged in a line since a hydrogen adsorption ability is increased.

Note that the top via 572 and the vias 574 may have the same shape as those of the contacts 575.

Figure 27:
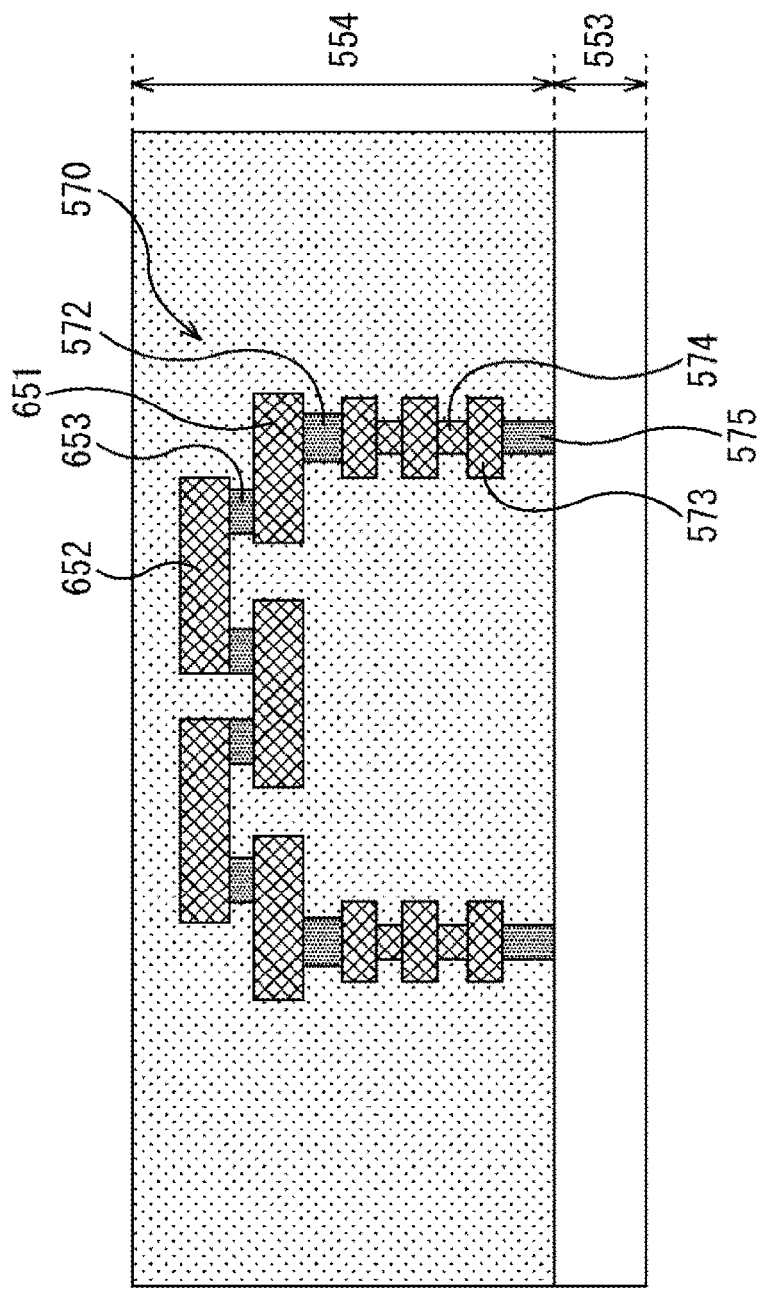
FIG. 27 is a cross-sectional diagram showing another structure example of the hydrogen reduction region.

In the above description, the top metal 571 is single. However, in a case in which the area of the hydrogen reduction region 422 is large and the width of the hydrogen reduction region 422 is larger than the allowable width of the top metal 571, the top metal 571 may be divided into a plurality of layers (two layers in the example shown in FIG. 27) of top metal 651 and 652 as shown in FIG. 27. The top metal 651 and the top metal 652 are connected to each other by a top via 653.

In addition, in the above description, the hydrogen adsorption layer 570 includes the top metal 571. However, for example, in a case in which the number of the layers of the wiring lines 573 is four or more, the hydrogen adsorption layer 570 may not include the top metal 571. In this case, the wiring lines 573 are used instead of the top metal 651 and 652 shown in FIG. 27.

Figure 28:
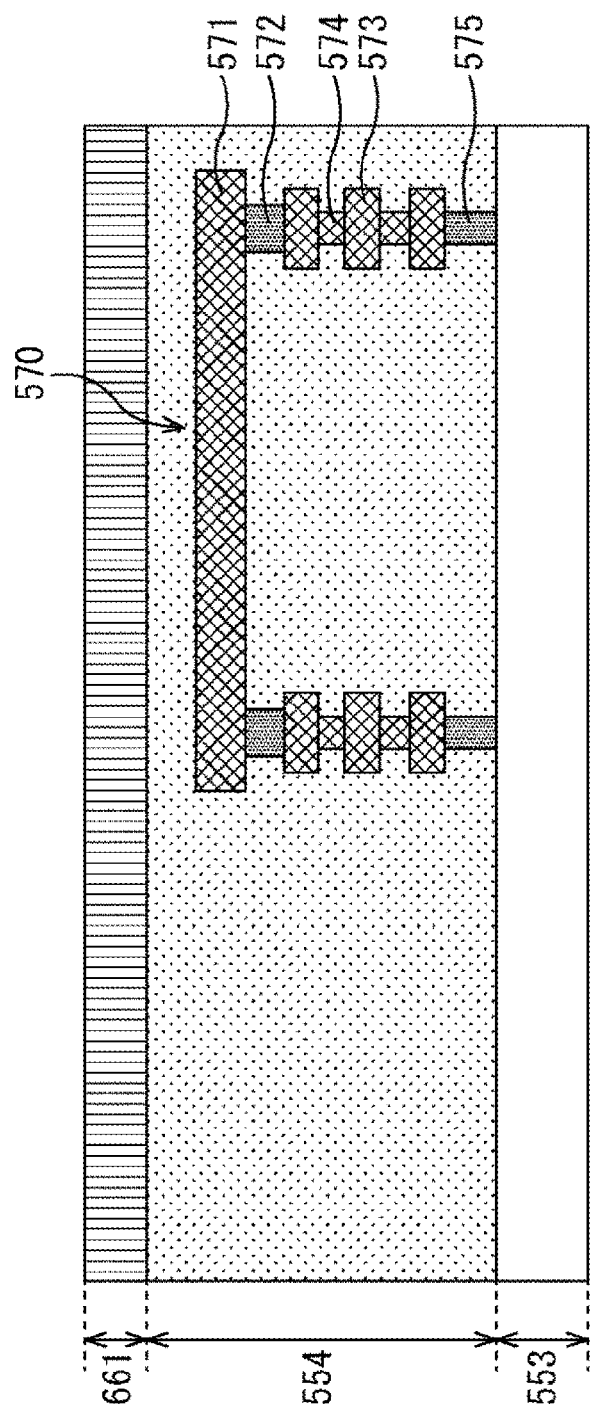
FIG. 28 is a cross-sectional diagram showing another structure example of the hydrogen reduction region.

Moreover, in the above description, hydrogen is supplied to the front surface of the semiconductor substrate 553. However, as shown in FIG. 28, a hydrogen supply film 661 having a high hydrogen content may be formed on the interlayer insulation film 554.

In this case, for example, the hydrogen supply film 661 is formed after a semiconductor device is formed on the semiconductor substrate 553 and then the top metal 561, the wiring lines 562, the hydrogen adsorption layer 570, and the interlayer insulation film 554 are formed. As a method of forming the hydrogen supply film 661, a plasma nitride film having a prescribed thickness is formed as the hydrogen supply film 661 according to a plasma CVD method using $SiH_4$ or $NH_3$, $N_2$, and $H_2$ as gas. Since the hydrogen supply film 661 contains hydrogen in large amounts, it has an ability to supply hydrogen to the front surface of the semiconductor substrate 553 according to film forming conditions just like when sinter-annealing is performed in an airflow containing the hydrogen.

Accordingly, in this case as well, hydrogen is supplied to the front surface of the semiconductor substrate 553 in the hydrogen supply region 421. However, since the front surface of the semiconductor substrate 553 in the hydrogen reduction region 422 is covered with the hydrogen adsorption layer 570, the supply of hydrogen to the front surface of the semiconductor substrate 553 in the hydrogen reduction region 422 is reduced.

3. Third Embodiment

Structure Example of Hydrogen Reduction Region of Third Embodiment of CMOS Image Sensor The configuration of a third embodiment of the CMOS image sensor 300 serving as a semiconductor device to which the present disclosure is applied is the same as that shown in FIG. 14, but the structure of the hydrogen reduction region 422 is different from that of the second embodiment. Accordingly, only the structure of the hydrogen reduction region 422 of the CMOS image sensor 300 will be described below.

Figure 29:
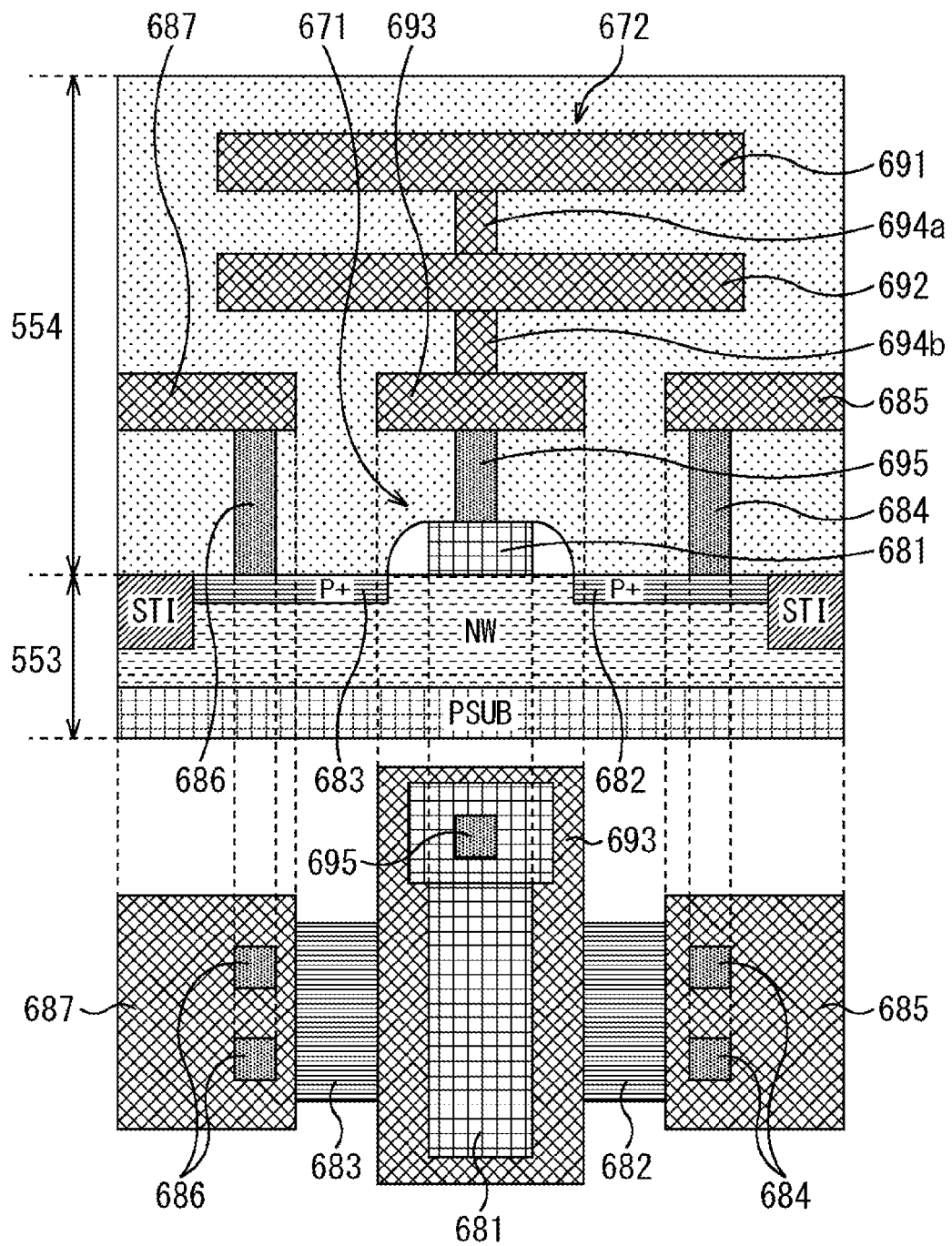
FIG. 29 is a diagram showing a structure example of the hydrogen reduction region of a third embodiment of the CMOS image sensor serving as a semiconductor device to which the present disclosure is applied.

FIG. 29 is a diagram showing a structure example of the hydrogen reduction region of the third embodiment of the CMOS image sensor 300 serving as a semiconductor device to which the present disclosure is applied.

FIG. 29 shows the peripheral structure of a PMOSFET serving as an active element in the hydrogen reduction region 422 of the CMOS image sensor 300. Examples of the PMOSFET include the p-channel MOS (PMOS) transistors PT511 and PT512 of the comparator 351. Note that the upper part of FIG. 29 is a peripheral cross-sectional diagram of the PMOSFET and the lower part thereof is an upper-surface diagram when seen from the wiring lines of a lowermost layer. In the upper part of FIG. 29, prescribed units are shown in a transparent state for the purpose of illustration. The same applies to FIGS. 30 and 32 that will be described later.

In the third embodiment of the CMOS image sensor 300, a hydrogen adsorption layer is not provided for each hydrogen reduction region 422 but is provided for each active element.

Specifically, as shown in FIG. 29, a PMOSFET 671 in the hydrogen reduction region 422 has a gate electrode 681, p-channel regions 682 and 683, contacts 684, a drain electrode 685, contacts 686, and a source electrode 687. The drain electrode 685 is connected to the p-channel region 682 via the contacts 684, and the source electrode 687 is connected to the p-channel region 683 via the contacts 686.

A hydrogen adsorption layer 672 for the PMOSFET 671 is connected to the gate electrode 681. The hydrogen adsorption layer 672 has three-layer wiring lines 691 to 693, a via 694a, a via 694b, and a contact 695.

Specifically, the wiring line 691, the wiring line 692, and the wiring line 693 are arranged in this order from above the hydrogen adsorption layer 672 so as to cover the gate electrode 681. The via 694a connects the wiring lines 691 and 692 to each other, and the via 694b connects the wiring lines 692 and 692 to each other. The contact 695 connects the wiring line 693 and the gate electrode 681 to each other. Thus, the potential of the hydrogen adsorption layer 672 is fixed to the potential of the gate electrode 681.

The hydrogen adsorption layer 672 configured as described above contains a hydrogen storage alloy as a metal film like the hydrogen adsorption layer 570. Accordingly, the hydrogen adsorption layer 672 is allowed to prevent hydrogen from being diffused to the front surface of the PMOSFET 671 at the manufacturing of the CMOS image sensor 300.

Note here that although the entire metal film of the hydrogen adsorption layer 672 contains a hydrogen storage alloy, only some of the metal film may contain the hydrogen storage alloy.

Next, a description will be given of the supply of hydrogen in manufacturing steps for the PMOSFET 671. For example, hydrogen is supplied after the PMOSFET 671 is formed on the semiconductor substrate 553 and then the hydrogen adsorption layer 672 and the interlayer insulation film 554 are formed. A hydrogen supply method is the same as that of the second embodiment.

Even when hydrogen is supplied, the PMOSFET 671 in the hydrogen reduction region 422 is covered with the hydrogen adsorption layer 672. Therefore, the supply of hydrogen to the front surface of the PMOSFET 671 is reduced. Accordingly, degradation in the HCT and the NBTI resistance of the PMOSFET 671 due to excessive hydrogen is prevented, and the operational service life is increased.

The structure of the PMOSFET 671 is described above referring to FIG. 29. However, the structure of an NMOSFET is the same as that of the PMOSFET 671 except that a p-channel is replaced with an n-channel.

Figure 30:
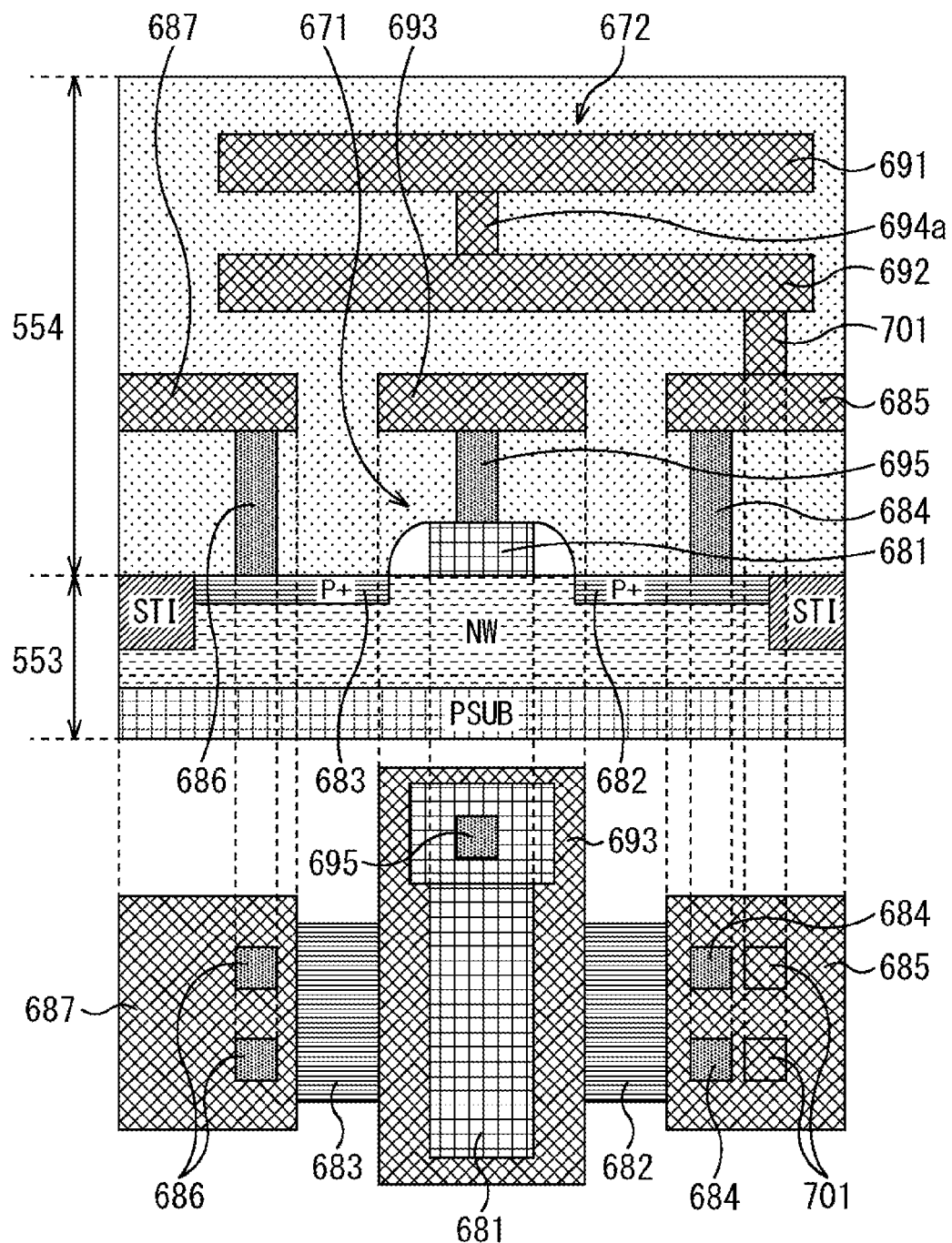
FIG. 30 is a diagram showing another structure example of the hydrogen reduction region shown in FIG. 29.

Note that although the wiring lines 691 and 692 are connected to the gate electrode 681 in the example shown in FIG. 29, they may be connected to the drain electrode 685 as shown in FIG. 30. In this case, vias 701 that connect the wiring line 692 and the drain electrode 685 to each other are provided instead of the via 694b that connects the wiring lines 692 and 693 to each other. Note that the upper part of FIG. 30 is a peripheral cross-sectional diagram of the PMOSFET and the lower part thereof is an upper-surface diagram when seen from above the vias 701. The wiring lines 691 and 692 may be connected to the source electrode 687.

Figure 31:
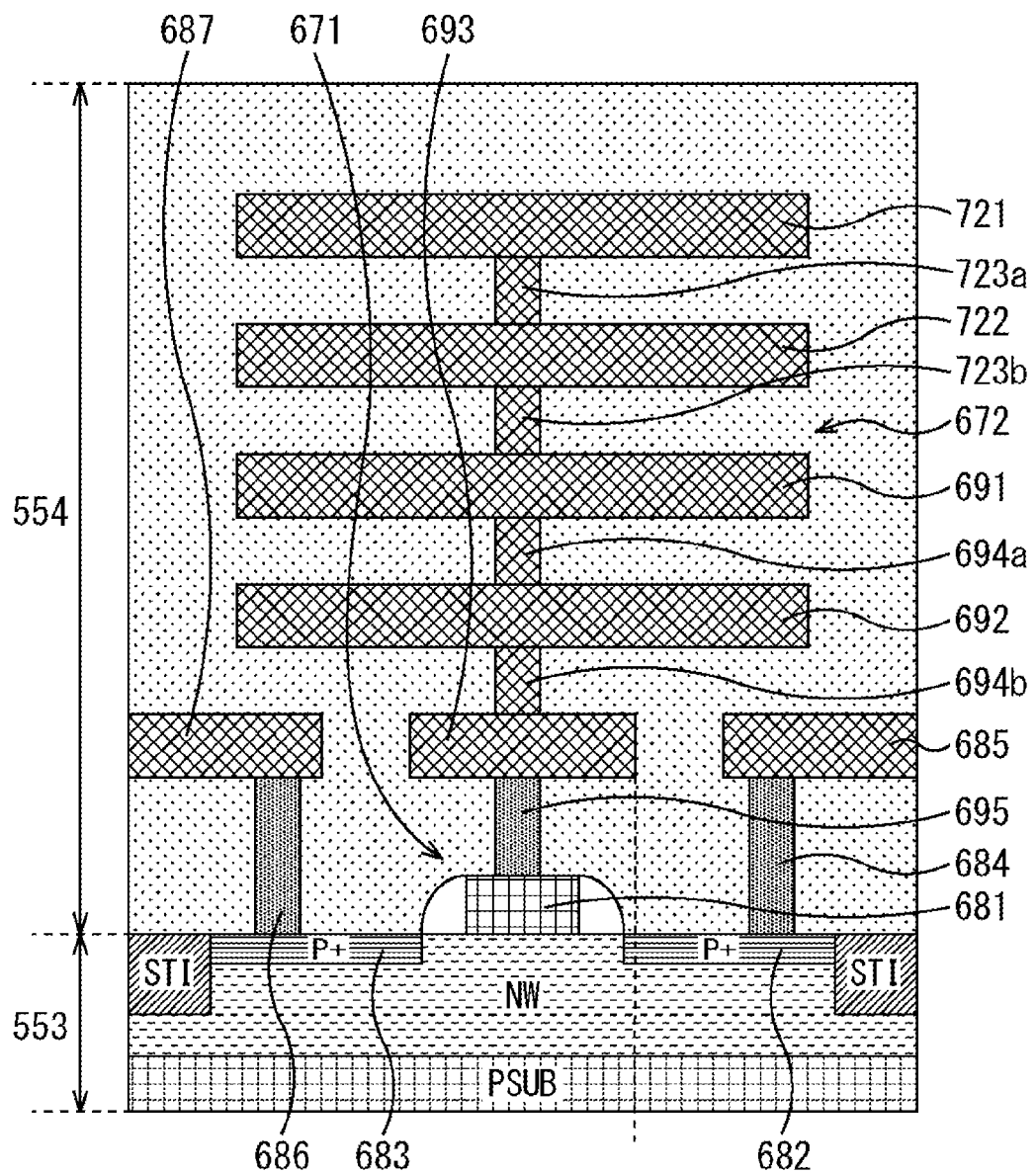
FIG. 31 is a diagram showing another structure example of the hydrogen reduction region shown in FIG. 29.

In addition, although the number of the layers of the wiring lines is three in the example shown in FIG. 29, it may be four or more. For example, as shown in FIG. 31, wiring lines 721 and 722 are provided over the wiring line 691 in this order from above. The wiring lines 721 and 722 are connected to each other by a via 723a, and the wiring lines 722 and 691 are connected to each other by a via 723b. Note that FIG. 31 is a peripheral cross-sectional diagram of the PMOSFET.

Moreover, the number of the layers of the wiring lines may be two or less. Further, top metal may be provided over the wiring line 691.

Figure 32:
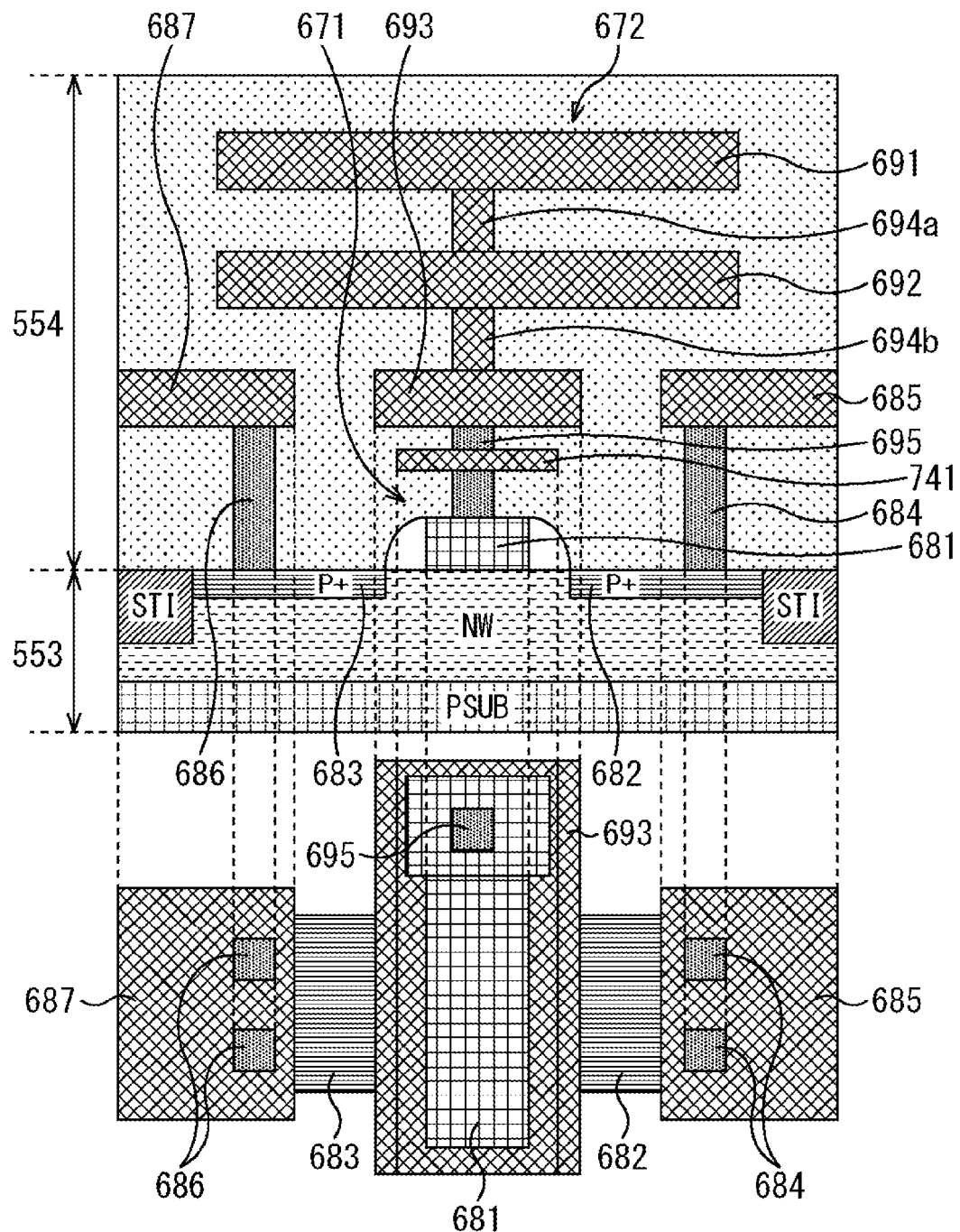
FIG. 32 is a diagram showing another structure example of the hydrogen reduction region shown in FIG. 29.

Furthermore, as shown in FIG. 32, a local interconnect wiring line 741 may be provided between the gate electrode 681 and the wiring line 693 so as to cover the gate electrode 681. Note that the upper part of FIG. 32 is a peripheral cross-sectional diagram of the PMOSFET and the lower part thereof is an upper-surface diagram when seen from the wiring line of the lowermost layer.

4. Fourth Embodiment

Configuration Example of Fourth Embodiment of CMOS Image Sensor

Figure 33:
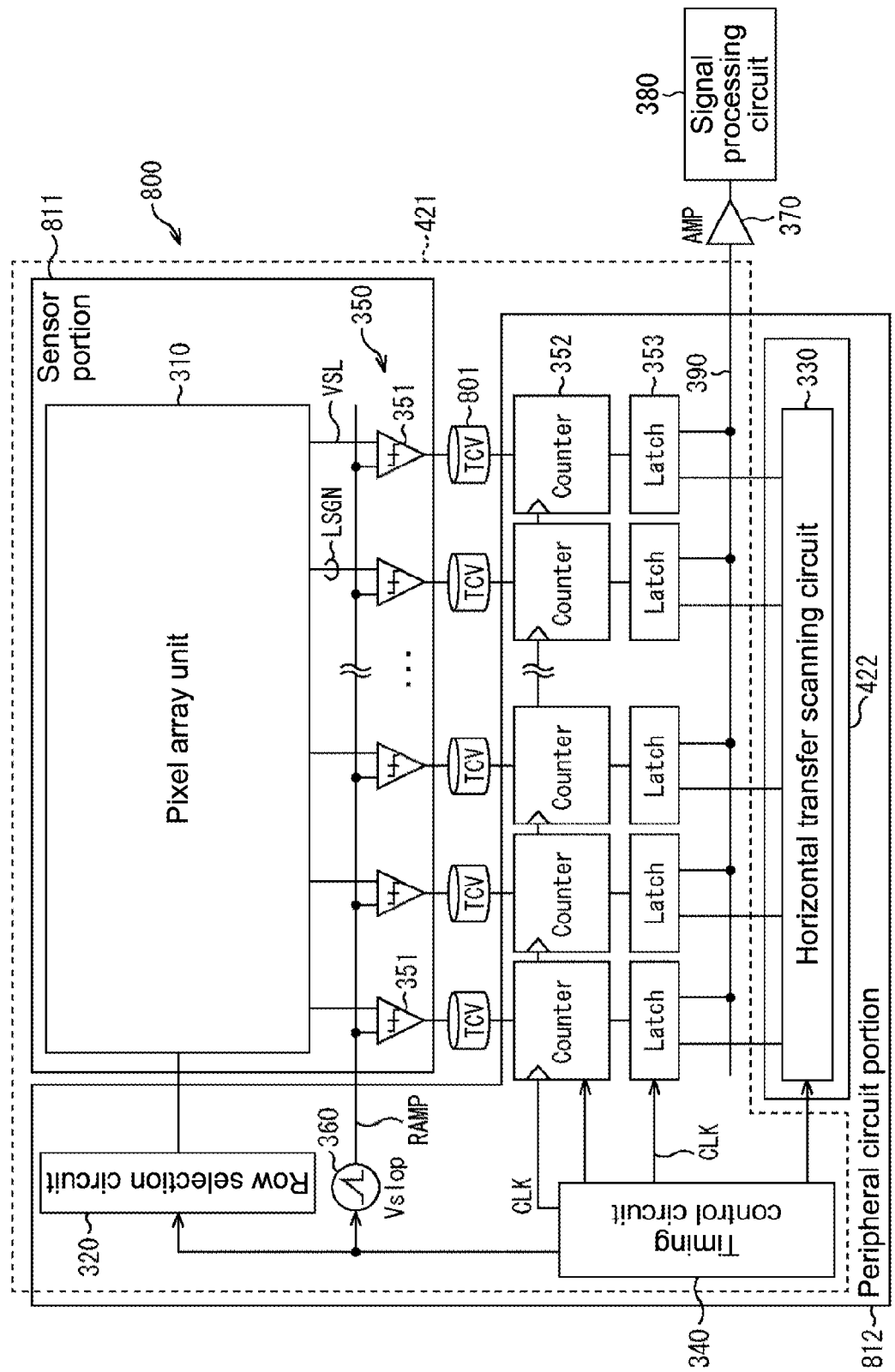
FIG. 33 is a diagram showing a configuration example of a fourth embodiment of a CMOS image sensor serving as a semiconductor device to which the present disclosure is applied.

FIG. 33 is a diagram showing a configuration example of a fourth embodiment of a CMOS image sensor serving as a semiconductor device to which the present disclosure is applied.

In FIG. 33, the same configurations as those shown in FIG. 14 are denoted by the same symbols. In addition, duplicated descriptions will be omitted as occasion demands.

The configurations of a CMOS image sensor 800 shown in FIG. 33 are different from those of the CMOS image sensor 300 shown in FIG. 14 in that the circuits of the CMOS image sensor 800 are formed on a laminated chip and that TCVs (Through Chip Vias) 801 are provided between layers.

Specifically, circuits other than an amplification circuit 370 and a signal processing circuit 380 of the CMOS image sensor 800 are divided into a sensor portion 811 and a peripheral circuit portion 812 and arranged in the different layers of the laminated chip.

The sensor portion 811 has a pixel array unit 310 and comparators 351. The peripheral circuit portion 812 has a row selection circuit 320, a horizontal transfer scanning circuit 330, a timing control circuit 340, counters 352, latches 353, a DAC 360, and a horizontal transfer line 390. The sensor portion 811 and the peripheral circuit portion 812 are electrically connected to each other by the TCVs 801.

In the CMOS image sensor 800, a hydrogen supply region 421 has the sensor portion 811 and circuits other than the horizontal transfer scanning circuit 330 of the peripheral circuit portion 812, and a hydrogen reduction region 422 has only the horizontal transfer scanning circuit 330. That is, since only the service life of a MOSFET used in the horizontal transfer scanning circuit 330 is not allowable by the supply of hydrogen in the CMOS image sensor 800, the horizontal transfer scanning circuit 330 is included in the hydrogen reduction region 422.

Note that the amplification circuit 370 and the signal processing circuit 380 may be arranged in the layer of the sensor portion 811 or the layer of the peripheral circuit portion 812 or may be arranged in a layer other than the layers of the sensor portion 811 and the peripheral circuit portion 812.

Structure Example of Sensor Portion and Peripheral Circuit Portion

Figure 34:
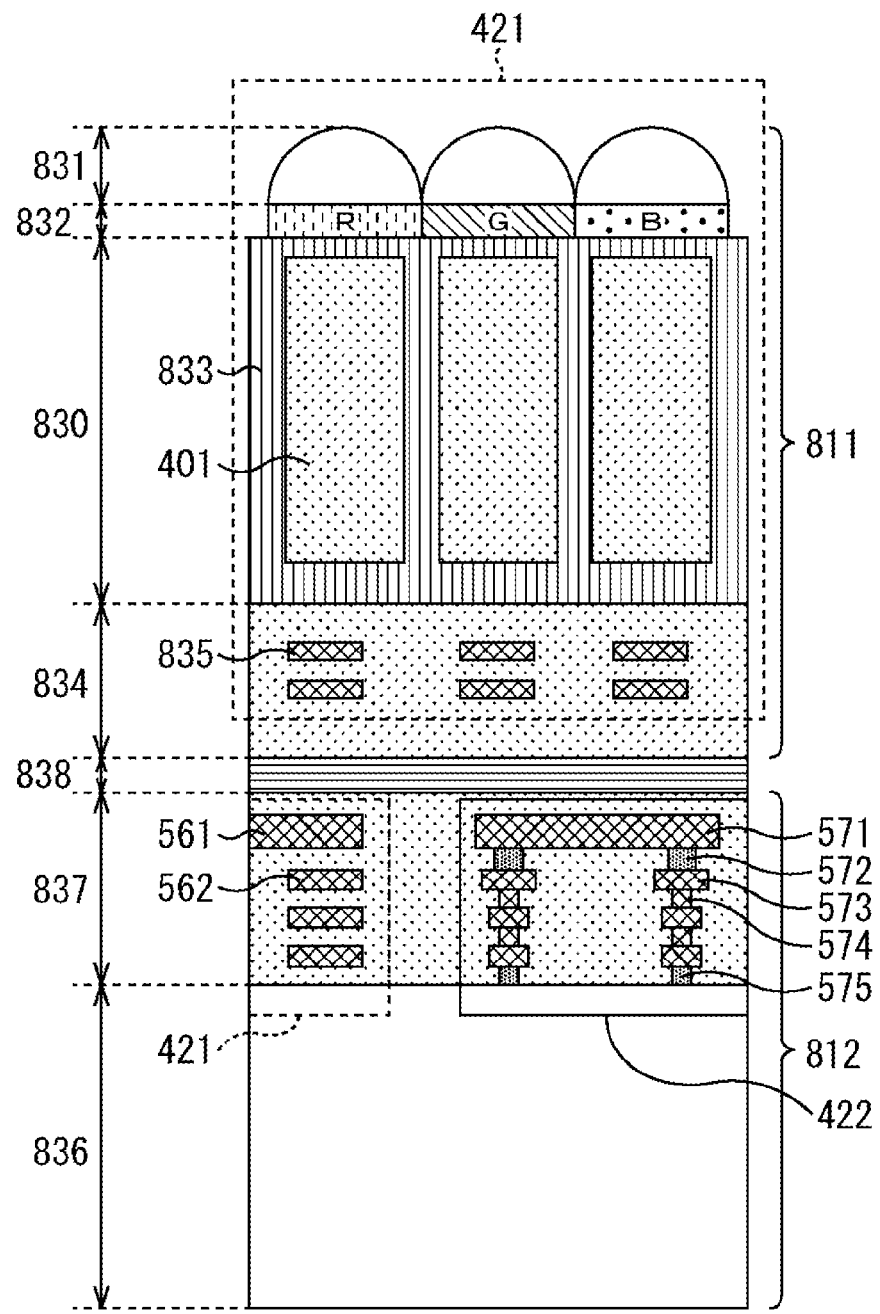
FIG. 34 is a diagram showing a structure example of a sensor portion and a peripheral circuit portion shown in FIG. 33.

FIG. 34 is a diagram showing a structure example of the sensor portion 811 and the peripheral circuit portion 812 shown in FIG. 33.

In FIG. 34, the same configurations as those shown in FIGS. 22A and 22B are denoted by the same symbols. In addition, duplicated descriptions will be omitted as occasion demands.

As shown in FIG. 34, in the sensor portion 811, an on-chip lens 831 and a color filter 832 are arranged in this order from above over each of photodiodes 401 provided in a semiconductor substrate 830. The respective photodiodes 401 are separated from each other by an element separation layer 833. Under the semiconductor substrate 830, wiring lines 835 covered with an interlayer insulation film 834 at the peripheries thereof are arranged. Since the sensor portion 811 serves as the hydrogen supply region 421, it does not have a hydrogen adsorption layer.

The peripheral circuit portion 812 has the same configuration as that shown in FIG. 22. That is, in the peripheral circuit portion 812, single-layer top metal 561 and three-layer wiring lines 562 are arranged in this order from above over a semiconductor substrate 836 in the hydrogen supply region 421. The top metal 561 and the wiring lines 562 are covered with the interlayer insulation film 837 at the peripheries thereof. In addition, a hydrogen adsorption layer 570 is provided on the semiconductor substrate 836 in the hydrogen reduction region 422 so as to cover the semiconductor substrate 836.

The semiconductor substrate 830 of the sensor portion 811 and an interlayer insulation film 837 of the peripheral circuit portion 812 are joined together via an insulation film 838.

Next, a description will be given of the supply of hydrogen to the peripheral circuit portion 812 in manufacturing steps for the CMOS image sensor 800. For example, hydrogen is supplied to the peripheral circuit portion 812 after a semiconductor device is formed on the semiconductor substrate 836 and then the top metal 561, the wiring lines 562, the hydrogen adsorption layer 570, and the interlayer insulation film 837 are formed. A hydrogen supply method is the same as that of the second embodiment.

When hydrogen is supplied to the peripheral circuit portion 812, it is supplied to the front surface of the semiconductor substrate 836 in the hydrogen supply region 421. However, since the front surface of the semiconductor substrate 836 is covered with the hydrogen adsorption layer 570 in the hydrogen reduction region 422, the supply of hydrogen to the front surface of the semiconductor substrate 836 is reduced. As a result, the noise of active elements such as MOSFETs is reduced by hydrogen in the hydrogen supply region 421. In addition, in the hydrogen reduction region 422, it is possible to prevent degradation in the HCT and the NBTI resistance of active elements such as the MOSFETs due to excessive hydrogen and increase the operational service life of the CMOS image sensor 800.

The insulation film 838 is formed on the interlayer insulation film 837 of the peripheral circuit portion 812 to which hydrogen is supplied, and the sensor portion 811 to which hydrogen is supplied is joined to the peripheral circuit portion 812.

Figure 35:
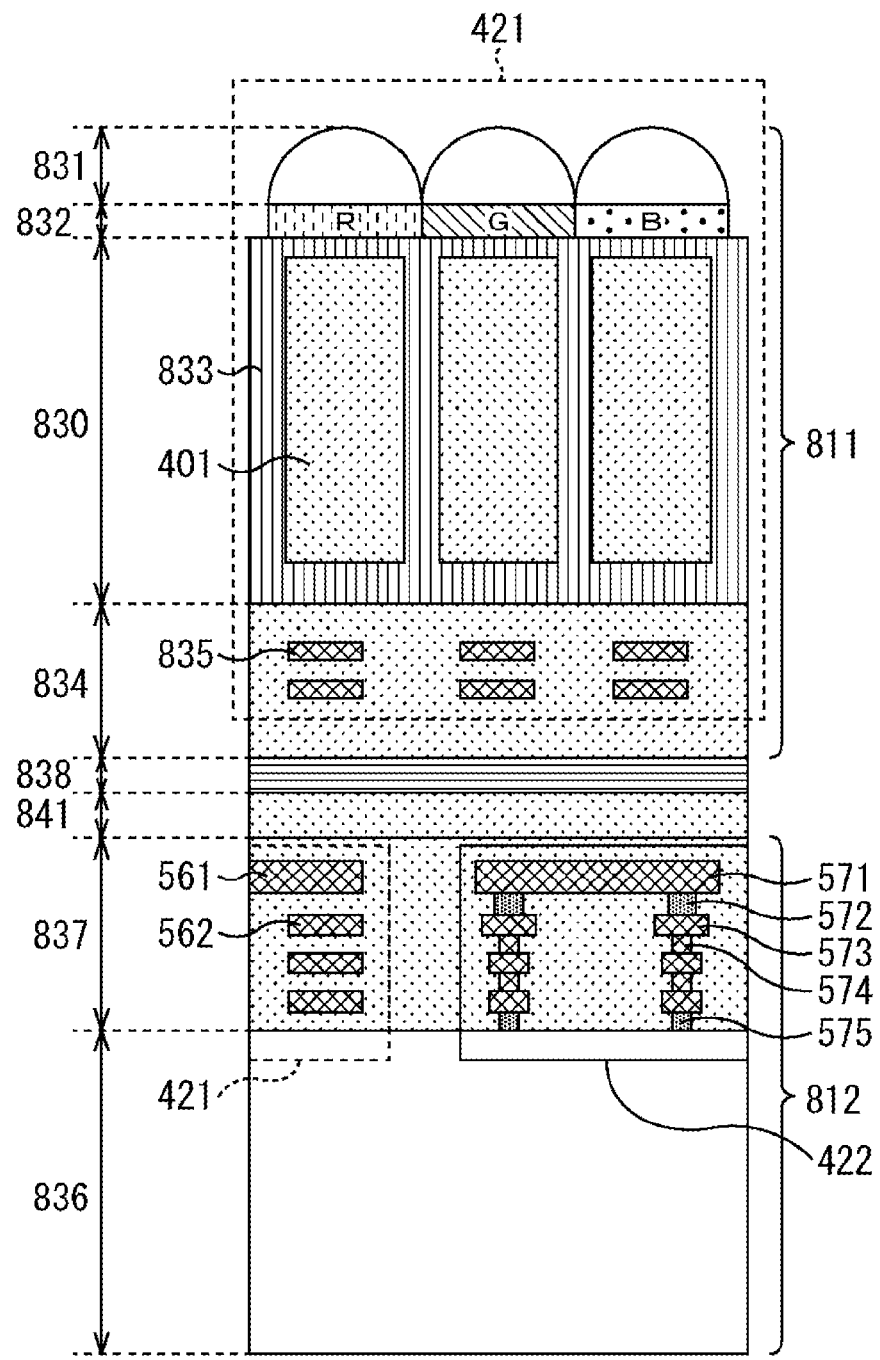
FIG. 35 is a diagram showing another structure example of the sensor portion and the peripheral circuit portion shown in FIG. 33.

Note that instead of the supply of hydrogen to the front surface of the semiconductor substrate 836, a hydrogen supply film 841 having a high hydrogen content may be formed between the interlayer insulation film 837 and the insulation film 838 as shown in FIG. 35.

In this case, for example, the hydrogen supply film 841 is formed after a semiconductor device is formed on the semiconductor substrate 836 and then the top metal 561, the wiring lines 562, the hydrogen adsorption layer 570, and the interlayer insulation film 837 are formed. A method of forming the hydrogen supply film 841 is the same as the method of forming the hydrogen supply film 661 shown in FIG. 28. After the formation of the hydrogen supply film 841, the insulation film 838 is formed on the hydrogen supply film 841. Via the insulation film 838, the sensor portion 811 to which hydrogen is supplied is joined to the peripheral circuit portion 812

Since the hydrogen supply film 841 contains hydrogen in large amounts, it has an ability to supply hydrogen to the front surface of the semiconductor substrate 836 according to film forming conditions just like when sinter-annealing is performed. Accordingly, in a heat treatment process after the sensor portion 811 and the peripheral circuit portion 812 are joined together, hydrogen is diffused from the hydrogen supply region 421 to the sensor portion 811 and the peripheral circuit portion 812. Thus, hydrogen is supplied to the semiconductor substrate 830 and the front surface of the semiconductor substrate 836 in the hydrogen supply region 421. However, since the front surface of the semiconductor substrate 836 in the hydrogen reduction region 422 is covered with the hydrogen adsorption layer 570, the supply of hydrogen to the front surface of the semiconductor region 836 in the hydrogen reduction region 422 is reduced.

5. Fifth Embodiment

Configuration Example of Embodiment of Wireless Device

Figure 36:
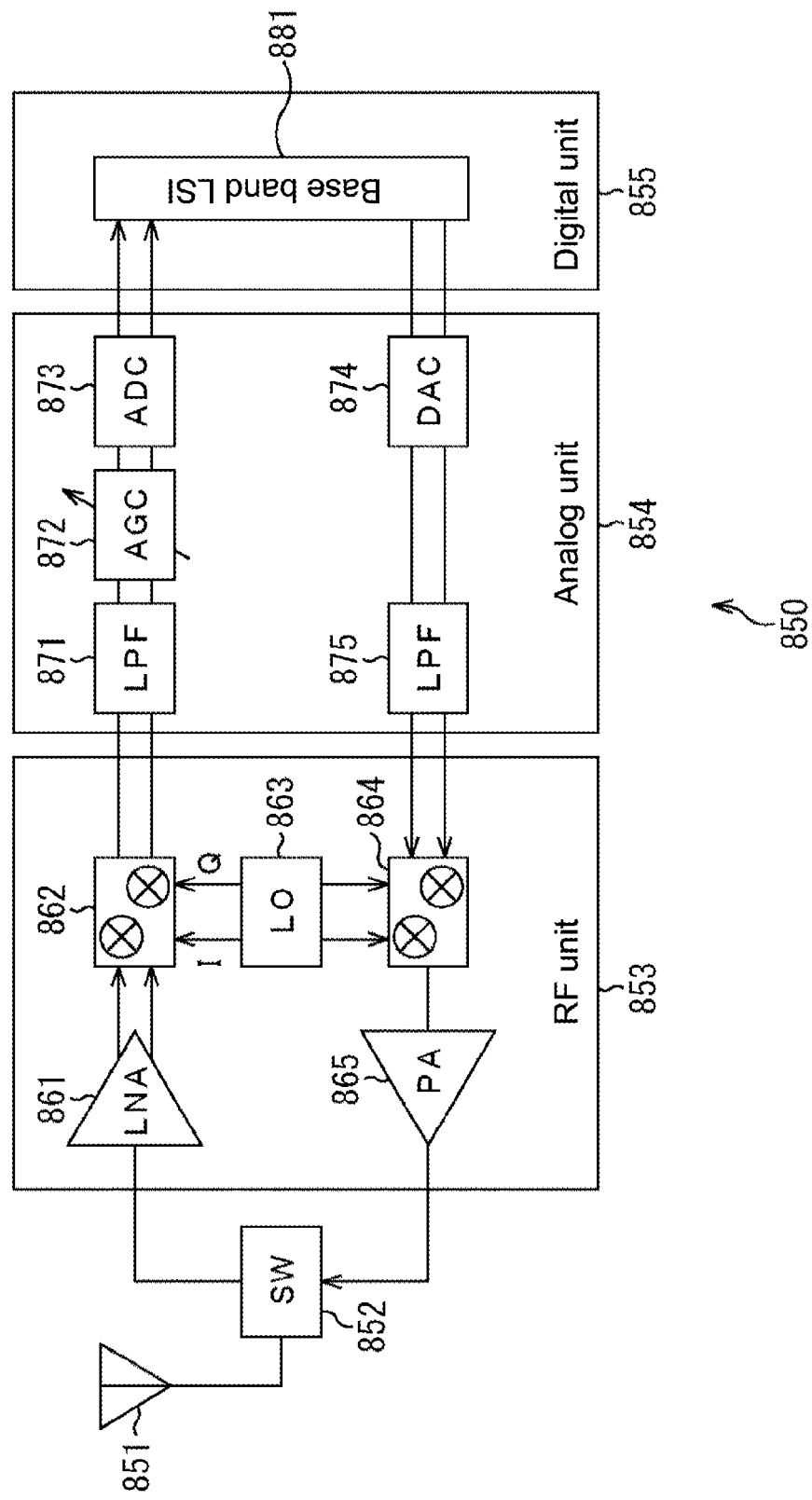
FIG. 36 is a diagram showing a configuration example of a wireless device as a semiconductor device to which the present disclosure is applied.

FIG. 36 is a diagram showing a configuration example of a wireless device as a semiconductor device to which the present disclosure is applied.

A wireless device 850 shown in FIG. 36 has an antenna 851, a switch 852, a RF (Radio Frequency) unit 853, an analog unit 854, and a digital unit 855. The wireless device 850 is an ASIC (Application Specific Integrated Circuit) having both digital circuits and analog circuits and included in a GPS (Global Positioning System), a mobile phone, or the like.

The RF unit 853 has a LNA (Low Noise Amplifier) 861, an orthogonal demodulator 862, a LO (Local Oscillator) 863, an orthogonal modulator 864, and a PA (Power Amplifier) 865.

A RF signal, i.e., an analog signal received as wireless electric waves via the antenna 851 is supplied to the LNA 861 of the RF unit 853. The LNA 861 amplifies the RF signal and supplies the amplified RF signal to the orthogonal demodulator 862.

The orthogonal demodulator 862 demodulates the RF signal supplied from the LNA 861 into an IF (Intermediate Frequency) signal based on a signal having a prescribed frequency supplied from the local oscillator 863 and supplies the IF signal to the analog unit 854.

The local oscillator 863 generates a signal having a prescribed frequency and supplies the generated signal to the orthogonal demodulator 862 and the orthogonal modulator 864. The orthogonal modulator 864 modulates the IF signal supplied from the analog unit 854 into an RF signal based on the signal having the prescribed frequency supplied from the local oscillator 863 and supplies the RF signal to the power amplifier 865.

The power amplifier 865 amplifies the RF signal supplied from the orthogonal modulator 864 and supplies the amplified RF signal to the antenna 851 via the switch 852. The RF signal supplied to the antenna 851 is transmitted as wireless electric waves.

The analog unit 855 has a LPF (Low Pass Filter) 871, an AGC (Automatic Gain Control) 872, an ADC 873, a DAC 874, and a LPF 875.

The LPF 871 of the analog unit 854 applies low-pass filter processing to the IF signal supplied from the orthogonal demodulator 862 and supplies the processed IF signal to the AGC 872. The AGC 872 controls the level of the IF signal supplied from the LPF 871 and supplies the controlled IF signal to the ADC 873. The ADC 873 converts the IF signal supplied from the AGC 872 into digital data and supplies the digital data to the digital unit 855.

The DAC 874 converts the digital data as a transmission target supplied from the digital unit 855 into an IF signal as an analog signal and supplies the IF signal to the LPF 875. The LPF 875 applies low-pass filter processing to the IF signal and supplies the processed IF signal to the orthogonal modulator 864.

The digital unit 855 has a base band LSI (Large Scale Integration) 881. The base band LSI 881 treats the digital data supplied from the ADC 873 as reception data and applies various digital processing to the same. The digital unit 855 applies the various digital processing to digital data as a transmission target and supplies the processed digital data to the analog unit 854.

For example, in order to secure higher performance in the wireless device 850 configured as described above, it is desirable that the RF unit 853 and the analog unit 854 have a MOSFET having a thick insulation film and that the digital unit 855 have a MOSFET having a thin insulation film.

Accordingly, the wireless device 850 is manufactured in such a way that a CMOS process is performed with the RF unit 853 and the analog unit 854 as a hydrogen supply region and the digital unit 855 as a hydrogen reduction region. Thus, a reduction in the noise of the RF unit 853 and the analog unit 854 may be achieved without degradation in the operational service life of the digital unit 855.

6. Sixth Embodiment

First Structure Example of Fifth Embodiment of CMOS Image Sensor

Since the configuration of a fifth embodiment of the CMOS image sensor as a semiconductor device to which the present disclosure is applied is the same as the configuration shown in FIG. 14, its description will be omitted.

Figure 37:
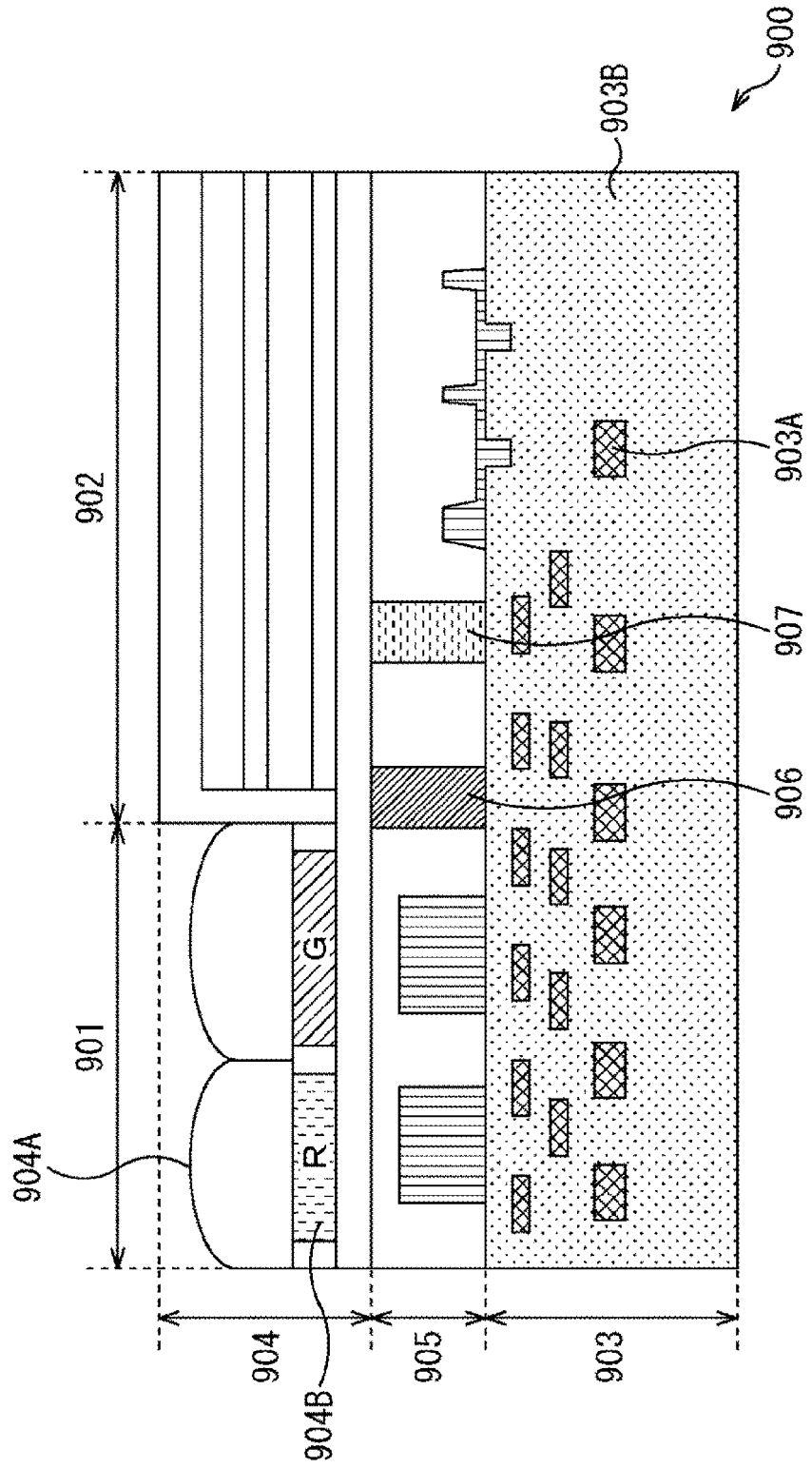
FIG. 37 is a diagram showing a first structure example of the pixel array unit and the signal processing circuit of a fifth embodiment of a CMOS image sensor as a semiconductor device to which the present disclosure is applied.

FIG. 37 is a diagram showing a structure example of the pixel array unit and the signal processing circuit of the fifth embodiment of the CMOS image sensor as a semiconductor device to which the present disclosure is applied.

A pixel array unit 901 and a signal processing circuit 902 of a CMOS image sensor 900 shown in FIG. 37 are configured in the same way as the pixel array unit 310 and the signal processing circuit 380 shown in FIG. 14, respectively. Here, as shown in FIG. 17, a hydrogen supply region has the pixel array unit 901 and a control circuit including units other than the signal processing circuit 902 serving as a peripheral circuit, and a hydrogen reduction region has the signal processing circuit 902.

The CMOS image sensor 900 is a back side illumination CMOS image sensor. Accordingly, as shown in FIG. 37, the pixel array unit 901 and the signal processing circuit 902 have a semiconductor substrate 905 having a wiring line portion 903 at the front surface thereof and a condensing portion 904 at the back surface thereof. Various wiring lines 903A are provided in the wiring line portion 903 and covered with an interlayer insulation film 903B.

The condensing portion 904 is a portion that condenses the prescribed colors of light at pixels in the pixel array unit 901. Specifically, the condensing portion 904 has on-chip lenses 904A for the respective pixels and color filters 904B. The semiconductor substrate 905 is made of, for example, a silicon substrate, and various elements are formed on the semiconductor substrate 905.

In addition, in the vicinity of the pixel array unit 901 constituting the hydrogen supply region inside the semiconductor substrate 901, SiN(PE-SiN) or the like is formed as a hydrogen supply material 906 so as to penetrate the semiconductor substrate 905. Accordingly, the substantial supply of hydrogen is allowed. As a result, a reduction in the noise of active elements inside the hydrogen supply region is substantially allowed.

On the contrary, the wiring lines 903A are made of metal such as Ti and Ta having the property of storing hydrogen, and hydrogen is hardly diffused inside the interlayer insulation film 903 made of $SiO_2$ or the like rather than being diffused inside Si. Accordingly, in a case in which a hydrogen supply film is formed on the wiring line portion 903 and hydrogen is supplied to the semiconductor substrate 905 via the wiring line portion 903, it is difficult to substantially supply hydrogen to the semiconductor substrate 905.

A metal material 907 (hydrogen diffusion prevention portion) that prevents the diffusion of hydrogen is provided on the side of the hydrogen reduction region, i.e., on the side of the signal processing circuit 902 of the hydrogen supply material 906 inside the semiconductor substrate 905. Thus, in the hydrogen reduction region, it is possible to prevent degradation in the HCT and the NBTI resistance of active elements due to excessive hydrogen and increase the operational service life of the CMOS image sensor 900. As the metal material 907, Cu, W, AL, Ti, Ta, or the like may be, for example, employed.

Figure 38:
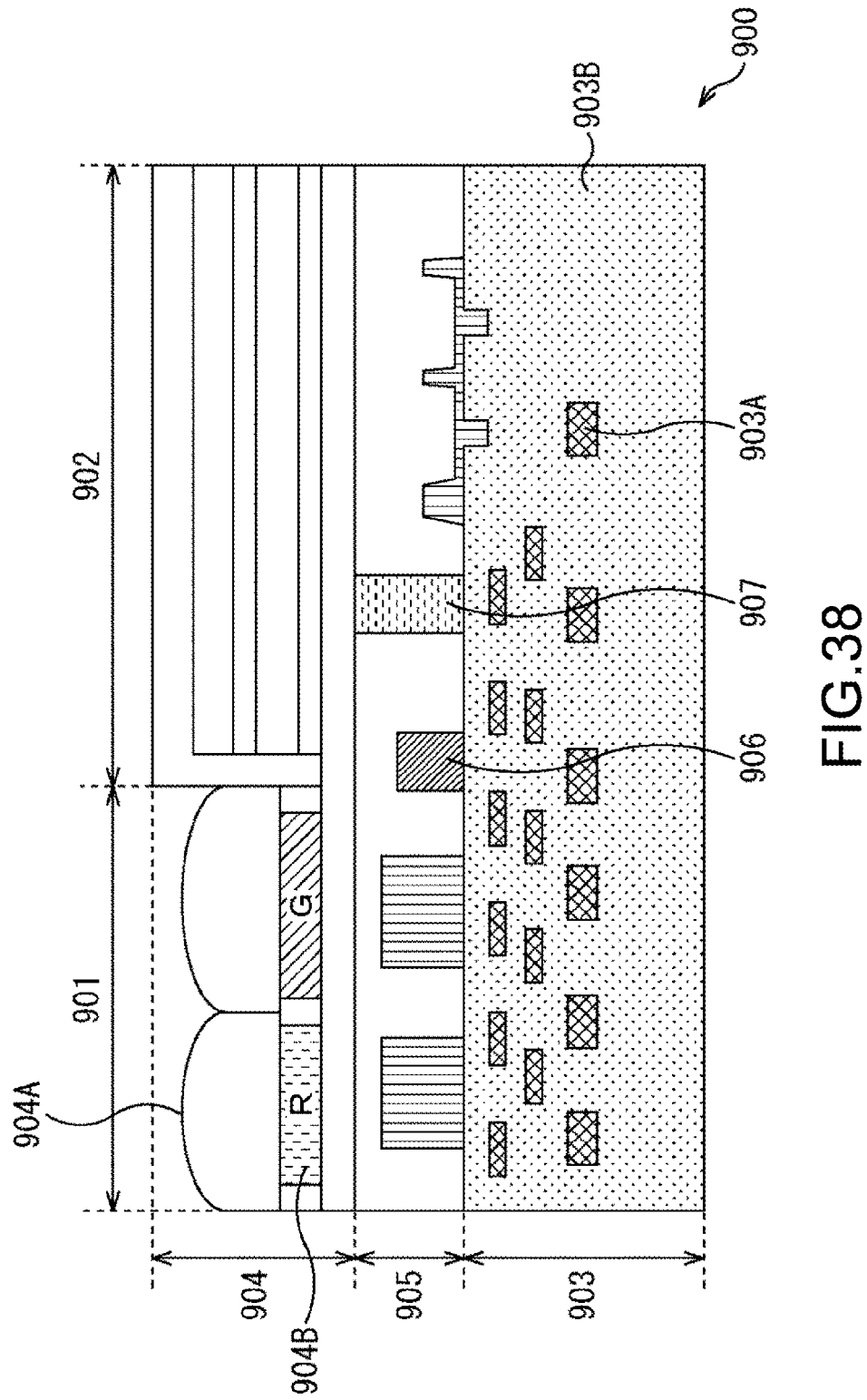
FIG. 38 is a diagram showing another structure example of a hydrogen supply material.
Figure 39:
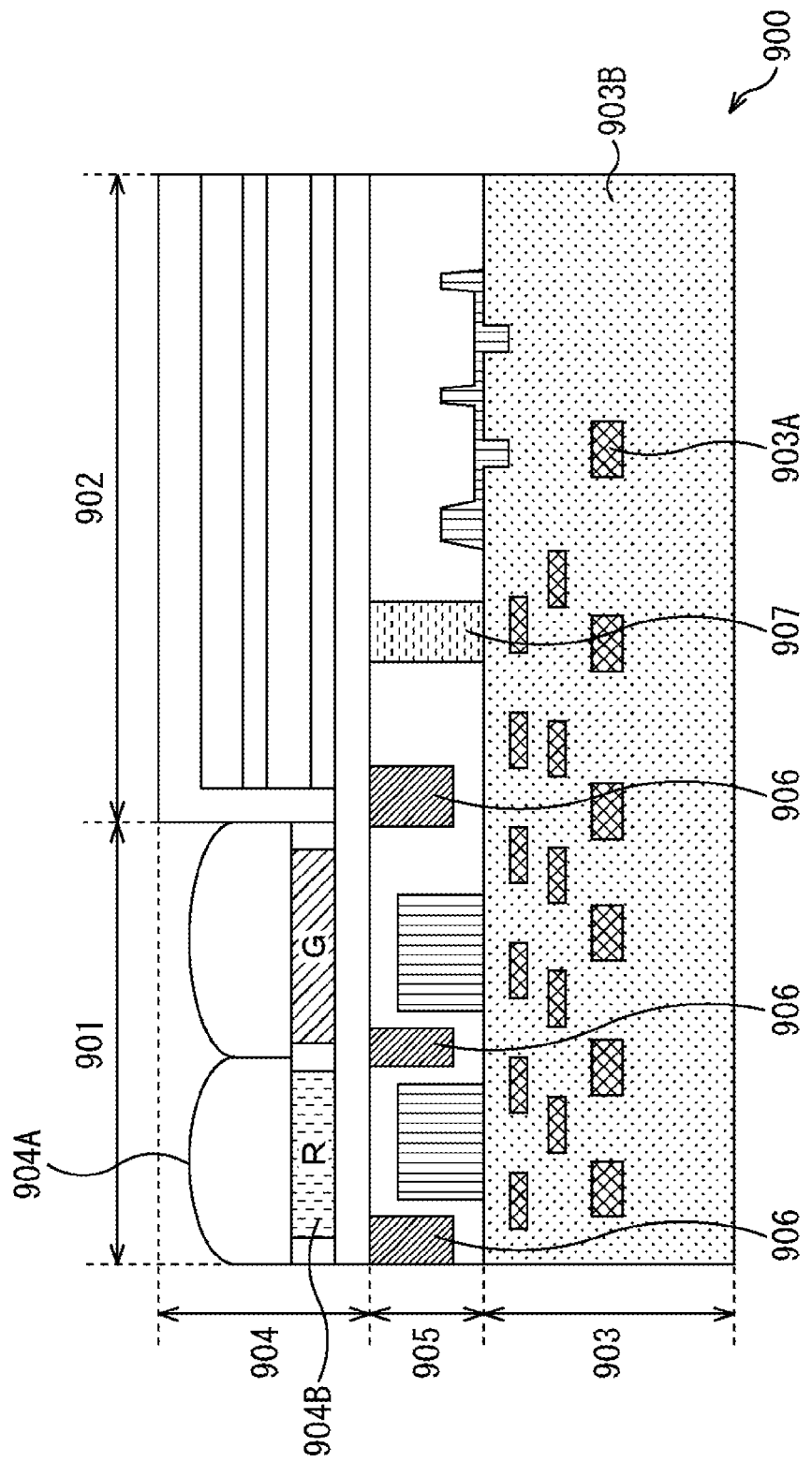
FIG. 39 is a diagram showing still another structure example of the hydrogen supply material.

Note that although the hydrogen supply material 906 is formed so as to penetrate the semiconductor substrate 905 in the example shown in FIG. 37, it may be formed so as not to penetrate the same as shown in FIG. 38. In addition, as shown in FIG. 39, the hydrogen supply materials 906 may be formed not only in the vicinity of the pixel array unit 901 but in the places between pixels. As shown in FIG. 39, the hydrogen supply materials 906 formed in the vicinity of the pixel array unit 901 and the places between the pixels are, for example, formed so as not to penetrate the semiconductor substrate 905 and formed so as to make the semiconductor layer remain on the side of the wiring line portion 903. Note that although not shown, the hydrogen supply materials 906 formed in the vicinity of the pixel array unit 901 and the places between the pixels may be formed so as to penetrate the semiconductor substrate 905 or may be formed so as to make the semiconductor layer remain on the side of the condensing portion 904.

Arrangement Examples of Hydrogen Supply Material and Metal Material

Figure 40:
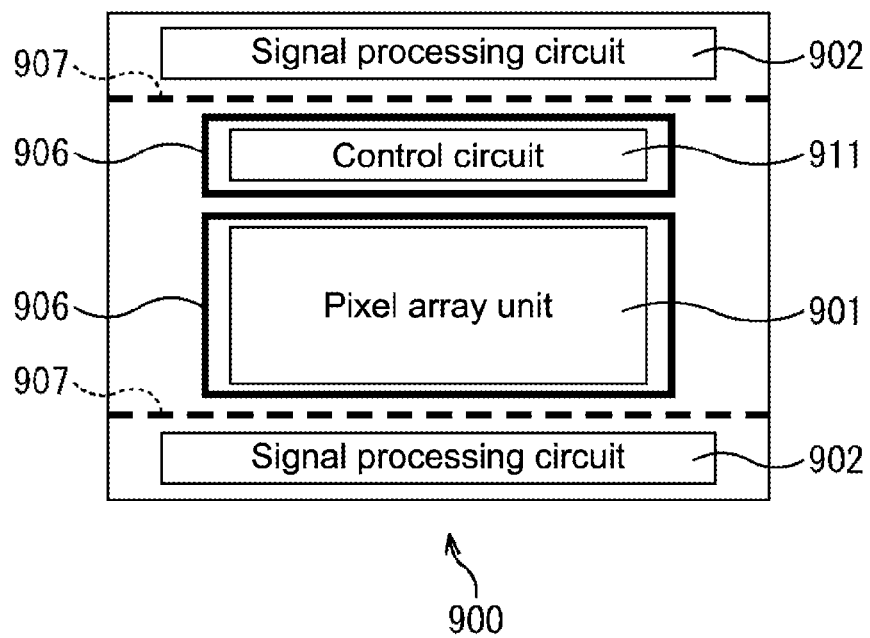
FIG. 40 is a schematic upper-surface diagram showing an arrangement example of the hydrogen supply material and a metal material shown in FIG. 37.
Figure 41:
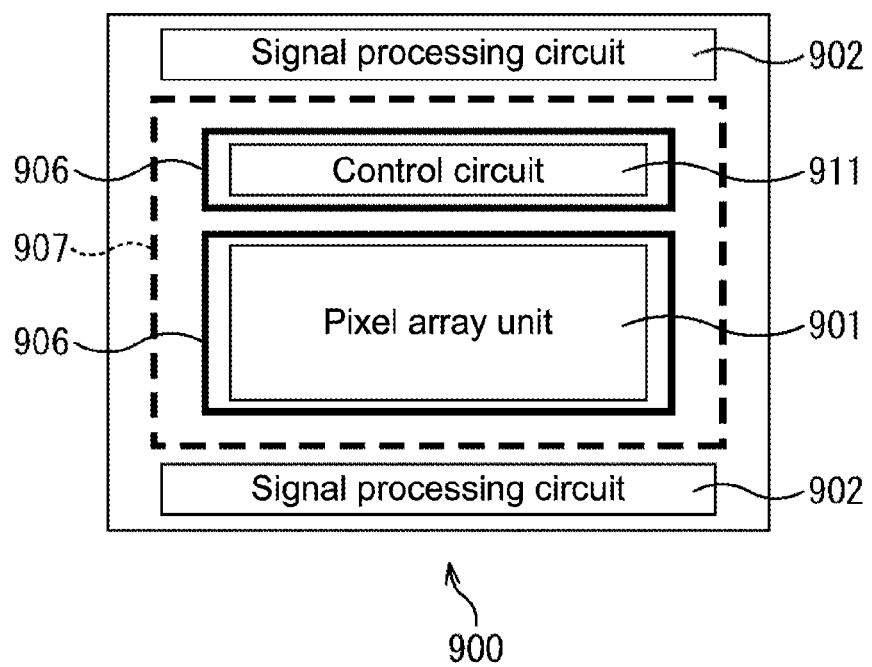
FIG. 41 is a schematic upper-surface diagram showing an arrangement example of the hydrogen supply material and the metal material shown in FIG. 37

FIGS. 40 and 41 are schematic upper-surface diagrams showing arrangement examples of the hydrogen supply material 906 and the metal material 907.

For example, as shown in FIG. 40, the hydrogen supply material 906 is arranged so as to surround each of the pixel array unit 901 and the control circuit 911 constituting the horizontal supply region. In this case, the metal material 907 may be linearly arranged on the side of the signal processing circuit 902 of the hydrogen supply material 906 as shown in FIG. 40 or may be arranged so as to surround the outside of the hydrogen supply material 906 (the side of the signal processing circuit 902) as shown in FIG. 41.

Note that the control circuit 911 may be arranged on the same substrate as that of the pixel array unit 901 and the signal processing circuit 902 or may be arranged on a substrate different from that of the pixel array unit 901 and the signal processing circuit 902. In a case in which the control circuit 911 is arranged on a substrate different from that of the pixel array unit 901 and the signal processing circuit 902, the CMOS image sensor 900 is a laminated CMOS image sensor.

Second Structure Example of Fifth Embodiment of CMOS Image Sensor

Figure 42:
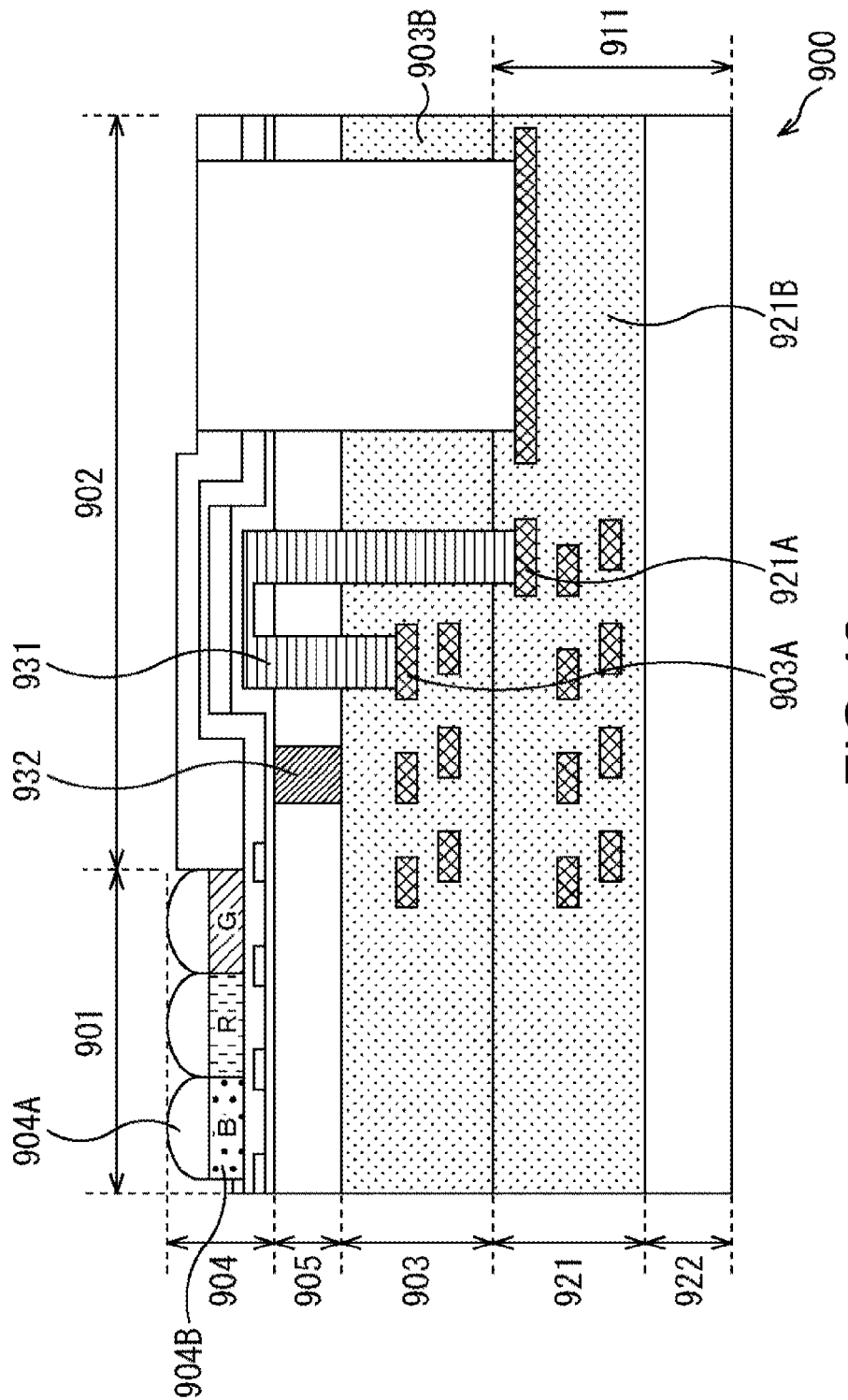
FIG. 42 is a diagram showing a second structure example of the pixel array unit and the signal processing circuit of the fifth embodiment of the CMOS image sensor as a semiconductor device to which the present disclosure is applied.

FIG. 42 is a diagram showing a structure example of the CMOS image sensor 900 in a case in which the control circuit 911 is arranged on a substrate different from that of the pixel array unit 901 and the signal processing circuit 902.

The control circuit 911 shown in FIG. 42 has a semiconductor substrate 922 provided with a wiring line portion 921, and the semiconductor substrates 922 and 905 are connected to each other so as to make the wiring line portions 903 and 921 face each other. Various wiring lines 921A are provided in the wiring line portion 921 and covered with an interlayer insulation film 921B. The semiconductor substrate 922 is made of a silicon substrate, and various elements are formed on the semiconductor substrate 922.

The wiring line 903A of the wiring line portion 903 and the wiring line 921A of the wiring line portion 921 are electrically connected to each other by a TCV (Through Chip Via) 931 made of metal such as Ti and Ta having the property of storing hydrogen. On the side of the pixel array unit 901 of the TCV 931, a hydrogen supply material 932 is formed so as to penetrate the semiconductor substrate 905.

Thus, it becomes possible to prevent hydrogen supplied from the hydrogen supply material 932 to the pixel array unit 901 in the hydrogen supply region from being stored by the TCV 931. In addition, it becomes possible to reduce the supply of hydrogen from the hydrogen supply material 932 to the signal processing circuit 902 in the hydrogen reduction region.

Arrangement Example of Hydrogen Supply Material and TCV

Figure 43:
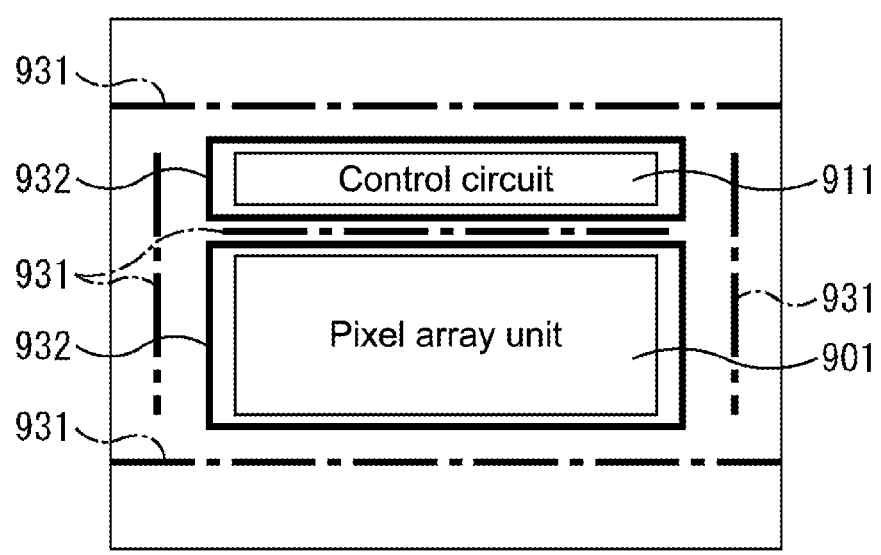
FIG. 43 is a schematic upper-surface diagram showing an arrangement example of a TCV and a hydrogen supply material shown in FIG. 42.
Figure 44:
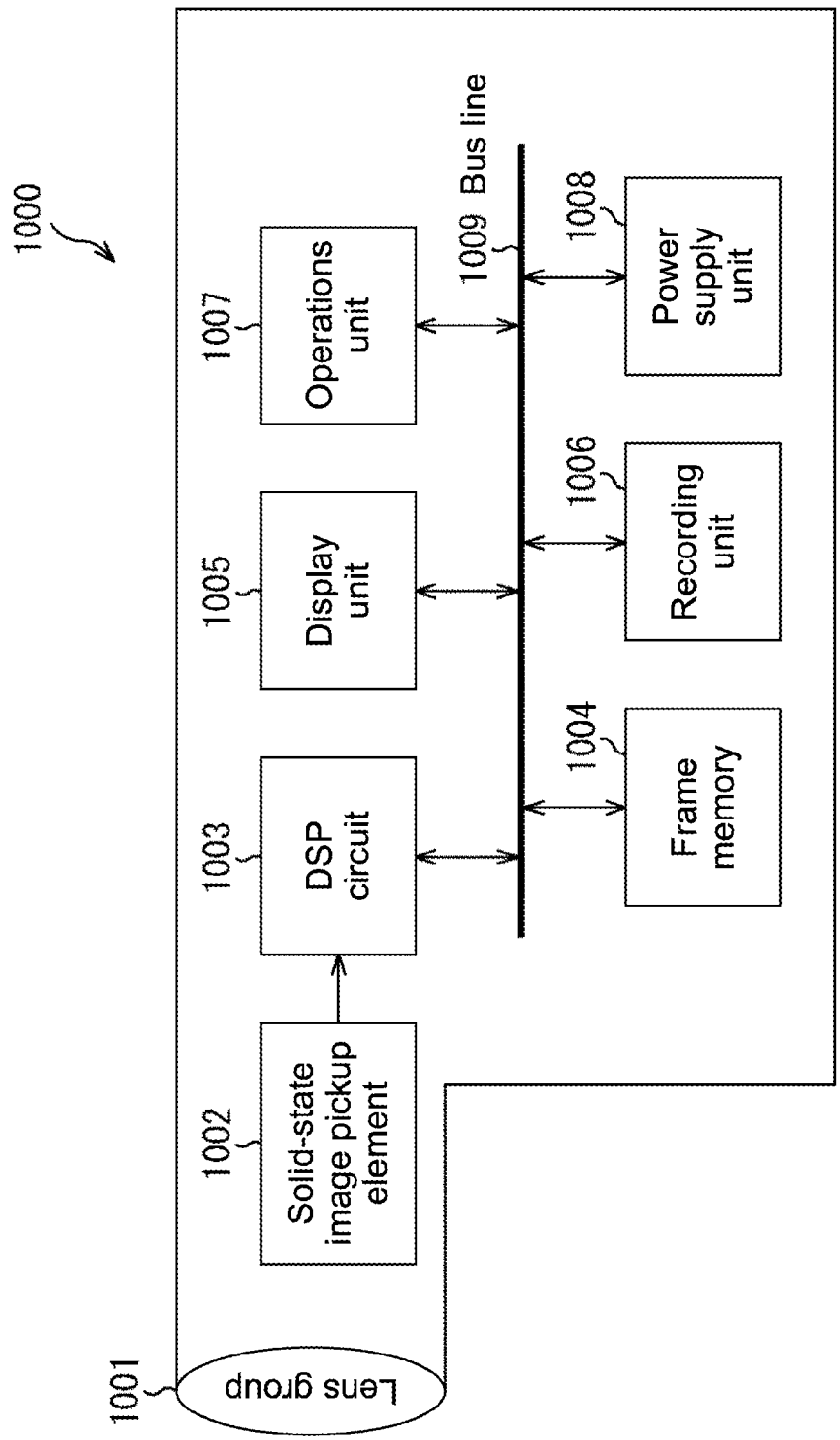
FIG. 44 is a block diagram showing a configuration example of an image pickup apparatus serving as an electronic apparatus to which the present disclosure is applied.

FIG. 43 is a schematic upper-surface diagram showing an arrangement example of the TCV 931 and the hydrogen supply material 932 shown in FIG. 42.

For example, as shown in FIG. 43, the hydrogen supply material 932 is formed so as to surround each of the pixel array unit 901 and the control circuit 911 constituting the hydrogen supply region, and the TCV 931 is formed so as to surround the outside of the hydrogen supply material 932.

Note that although the hydrogen supply region and the hydrogen reduction region of the CMOS image sensor 900 are configured as shown in FIG. 17, the configurations of the hydrogen supply region and the hydrogen reduction region are not limited to them. That is, the hydrogen supply region and the hydrogen reduction region may be configured as shown in FIG. 16, 18, or 19.

7. Seventh Embodiment

Configuration Example of Embodiment of Electronic Apparatus

FIG. 44 is a block diagram showing a configuration example of an image pickup apparatus serving as an electronic apparatus to which the present disclosure is applied.

An image pickup apparatus 1000 shown in FIG. 44 is a video camera, a digital still camera, or the like. The image pickup apparatus 1000 has a lens group 1001, a solid-state image pickup element 1002, a DSP circuit 1003, a frame memory 1004, a display unit 1005, a recording unit 1006, an operations unit 1007, and a power supply unit 1008. The DSP circuit 1003, the frame memory 1004, the display unit 1005, the recording unit 1006, the operations unit 1007, and the power supply unit 1008 are connected to each other via a bus line 1009.

The lens group 1001 captures incident light (image light) from a subject and forms an image on the image pickup surface of the solid-state image pickup element 1002. The solid-state image pickup element 1002 is made of the above CMOS image sensor 10, 300, 800, or 900. The solid-state image pickup element 1002 converts the light amount of the incident light formed as the image on the image pickup surface by the lens group 1001 into an electric signal for each pixel and supplies the electric signal to the DSP circuit 1003 as a pixel signal.

The DSP circuit 1003 applies prescribed image processing to the pixel signal supplied from the solid-state image pickup element 1002 and supplies the processed image signal to the frame memory 1004 for each frame to be temporarily stored there.

The display unit 1005 is made of a panel display device such as a liquid crystal panel and an organic EL (Electro Luminescence) panel and displays an image based on the pixel signal for each frame temporarily stored in the frame memory 1004.

The recording unit 1006 is made of a DVD (Digital Versatile Disk), a flash memory, or the like and reads and records the pixel signal for each frame temporarily stored in the frame memory 1004.

The operations unit 1007 issues operational commands on the various functions of the image pickup apparatus 1000 under user's operations. The power supply unit 1008 supplies a power supply to the DSP circuit 1003, the frame memory 1004, the display unit 1005, the recording unit 1006, and the operations unit 1007 as occasion demands.

The electronic apparatus to which the present technology is applied may only be an electronic apparatus that uses a solid-state image pickup device as an image capturing unit (photoelectric conversion unit). Besides the image pickup apparatus 1000, a mobile terminal apparatus having an image pickup function and a copier that uses a solid-stage image pickup device as an image capturing unit, or the like is available as such.

Note that the CMOS image sensor 10 (300, 800, 900) may be formed as one chip or a module having an image capturing function and packaged with an optical unit or the like.

In addition, the effects described in the specification are only for illustration, and other effects may be produced.

Moreover, the embodiments of the present disclosure are not limited to the above embodiments but may be modified in various ways within the spirit of the present disclosure.

For example, in the fifth embodiment of the present disclosure, the hydrogen reduction region and the hydrogen supply region may be set for each active element.

Further, the preset disclosure is also applicable to semiconductor devices having a plurality of digital ASICs, analog ASICs, digital/analog ASICs, or the like, besides CCD (Charge Coupled Device) image sensors and wireless devices.

Furthermore, in the first to seventh embodiments of the present disclosure, hydrogen is employed as an atom having a dangling bond terminating effect (interface level terminating effect). However, fluorine or nitrogen may be employed instead of hydrogen. Furthermore, in the first to fifth embodiments of the present disclosure, the hydrogen supply material in the sixth embodiment of the present disclosure may be formed instead of the hydrogen supply film.

Furthermore, the present technology is applicable to both front-surface CMOS image sensors and back-surface CMOS image sensors.

Furthermore, the present technology may employ, for example, the following configurations.

(1) A semiconductor device, including:
a first semiconductor substrate; and
a first atom diffusion prevention portion arranged at a part on the first semiconductor substrate and configured to prevent diffusion of an atom having a dangling bond terminating effect.

(2) The semiconductor device according to (1), in which the first atom diffusion prevention portion is configured to cover an active element formed on the first semiconductor substrate.

(3) The semiconductor device according to (2), in which the first atom diffusion prevention portion is arranged on a gate electrode of the active element.

(4) The semiconductor device according to (1), in which the first atom diffusion prevention portion is configured to cover a circuit having an active element formed on the first semiconductor substrate.

(5) The semiconductor device according to any one of (1) to (4), in which
the first atom diffusion prevention portion has a via, a wiring line, and a contact, and
at least one of the via, the wiring line, and the contact has a metal film made of an atom storage alloy configured to store the atom.

(6) The semiconductor device according to (5), in which the first atom diffusion prevention portion is connected to the first semiconductor substrate.

(7) The semiconductor device according to (1), in which the first atom diffusion prevention portion is arranged inside the first semiconductor substrate.

(8) The semiconductor device according to (7), further including:
a first atom supply film arranged inside the first semiconductor substrate and configured to supply the atom.

(9) The semiconductor device according to (1) or (2), further including:
a first atom supply film arranged over an entire surface of the first semiconductor substrate and configured to supply the atom.

(10) The semiconductor device according to (9), further including:
a second semiconductor substrate configured to provide a function different from a function of the first semiconductor substrate, in which
the first and second semiconductor substrates are laminated together via the first atom supply film.

(11) The semiconductor device according to (10), further including:
a second atom supply film arranged over an entire surface of the second semiconductor substrate and configured to supply the atom, in which
the first and second semiconductor substrates are laminated together via the first and second atom supply films.

(12) The semiconductor device according to (10), further including:
a second atom diffusion prevention portion arranged over an entire surface of one of the first and second semiconductor substrates and configured to prevent the diffusion of the atom, in which
the first and second semiconductor substrates are laminated together via the first atom supply film and the second atom diffusion prevention portion.

(13) The semiconductor device according to (10), in which
the first semiconductor substrate has a pixel region configured to pick up an image, and
the second semiconductor substrate has a logic circuit configured to apply signal processing to a signal generated by the image pickup.

(14) The semiconductor device according to (10), further including:
a third semiconductor substrate configured to provide a function different from functions of the first and second semiconductor substrates; and
a second atom supply film arranged over an entire surface of the third semiconductor substrate and configured to supply the atom, in which
the second and third semiconductor substrates are laminated together via the second atom supply film.

(15) The semiconductor device according to (14), in which
the first semiconductor substrate has a pixel region configured to pick up an image,
the second semiconductor substrate has a signal processing unit configured to apply signal processing to a signal generated by the image pickup, and
the third semiconductor substrate has a memory unit configured to store the signal.

(16) The semiconductor device according to (10), further including:
a first wiring-line layer formed over the first semiconductor substrate; and
a second wiring-line layer formed over the second semiconductor substrate, in which
the first and second semiconductor substrates are laminated together so as to make the first and second wiring-line layers face each other.

(17) The semiconductor device according to (10), further including:
a first wiring-line layer formed over the first semiconductor substrate; and
a second wiring-line layer formed over the second semiconductor substrate, in which
the first and second semiconductor substrates are laminated together so as to make a direction of the first wiring-line layer toward the first semiconductor substrate coincident with a direction of the second wiring-line layer toward the second semiconductor substrate.

(18) The semiconductor device according to any one of (1) to (17), in which
the atom includes hydrogen.

(19) A method of manufacturing a semiconductor device, the method including: forming
a semiconductor substrate, and
an atom diffusion prevention portion arranged at a part on the semiconductor substrate and configured to prevent diffusion of an atom having a dangling bond terminating effect.

(20) An electronic apparatus, including:
a semiconductor substrate; and
an atom diffusion prevention portion arranged at a part on the semiconductor substrate and configured to prevent diffusion of an atom having a dangling bond terminating effect.

What is claimed is:
1. A semiconductor device, comprising:
a first semiconductor substrate;
a first atom diffusion prevention portion arranged on at least a portion of the first semiconductor substrate and configured to prevent diffusion of an atom having a dangling bond terminating effect;

a first atom supply film arranged over an entire surface of the first semiconductor substrate and configured to supply the atom; and a second semiconductor substrate configured to provide a function different from a function of the first semiconductor substrate, wherein the first and second semiconductor substrates are laminated together via the first atom supply film.

2. The semiconductor device according to claim 1, wherein the first atom diffusion prevention portion is configured to cover an active element formed on the first semiconductor substrate.

3. The semiconductor device according to claim 2, wherein the first atom diffusion prevention portion is arranged on a gate electrode of the active element.

4. The semiconductor device according to claim 1, wherein the first atom diffusion prevention portion is configured to cover a circuit having an active element formed on the first semiconductor substrate.

5. The semiconductor device according to claim 1, wherein the first atom diffusion prevention portion has a via, a wiring line, and a contact, and at least one of the via, the wiring line, and the contact has a metal film made of an atom storage alloy configured to store the atom.

6. The semiconductor device according to claim 5, wherein the first atom diffusion prevention portion is connected to the first semiconductor substrate.

7. The semiconductor device according to claim 1, further comprising:
a second atom supply film arranged over an entire surface of the second semiconductor substrate and configured to supply the atom,
wherein the first and second semiconductor substrates are laminated together via the first and second atom supply films.

8. The semiconductor device according to claim 1, further comprising:
a second atom diffusion prevention portion arranged over an entire surface of one of the first and second semiconductor substrates and configured to prevent the diffusion of the atom,
wherein the first and second semiconductor substrates are laminated together via the first atom supply film and the second atom diffusion prevention portion.

9. The semiconductor device according to claim 1, wherein the first semiconductor substrate has a pixel region configured to pick up an image, and the second semiconductor substrate has a logic circuit configured to apply signal processing to a signal generated by the image pickup.

10. The semiconductor device according to claim 1, further comprising:
a third semiconductor substrate configured to provide a function different from functions of the first and second semiconductor substrates; and
a second atom supply film arranged over an entire surface of the third semiconductor substrate and configured to supply the atom,
wherein the second and third semiconductor substrates are laminated together via the second atom supply film.

11. The semiconductor device according to claim 10, wherein the first semiconductor substrate has a pixel region configured to pick up an image, the second semiconductor substrate has a signal processing unit configured to apply signal processing to a signal generated by the image pickup, and the third semiconductor substrate has a memory unit configured to store the signal.

12. The semiconductor device according to claim 1, further comprising:
a first wiring-line layer formed over the first semiconductor substrate; and
a second wiring-line layer formed over the second semiconductor substrate,
wherein the first and second semiconductor substrates are laminated together so as to make the first and second wiring-line layers face each other.

13. The semiconductor device according to claim 1, further comprising:
a first wiring-line layer formed over the first semiconductor substrate; and
a second wiring-line layer formed over the second semiconductor substrate,
wherein the first and second semiconductor substrates are laminated together so as to make a direction of the first wiring-line layer toward the first semiconductor substrate coincident with a direction of the second wiring-line layer toward the second semiconductor substrate.

14. The semiconductor device according to claim 1, wherein the atom includes hydrogen.

15. A semiconductor device, comprising:
a first semiconductor substrate;
a first atom diffusion prevention portion arranged on at least a portion of the first semiconductor substrate and configured to prevent diffusion of an atom having a dangling bond terminating effect, wherein the first atom diffusion prevention portion is arranged inside the first semiconductor substrate; and
a first atom supply film arranged inside the first semiconductor substrate and configured to supply the atom.

16. An electronic apparatus, comprising:
a first semiconductor substrate;
an atom diffusion prevention portion arranged on at least a portion of the first semiconductor substrate and configured to prevent diffusion of an atom having a dangling bond terminating effect,
a first atom supply film arranged over an entire surface of the first semiconductor substrate and configured to supply the atom; and
a second semiconductor substrate configured to provide a function different from a function of the first semiconductor substrate, wherein
the first and second semiconductor substrates are laminated together via the first atom supply film.

* * * * *